(12) United States Patent
Park et al.

(10) Patent No.: US 12,332,186 B2
(45) Date of Patent: Jun. 17, 2025

(54) METHOD AND SYSTEM FOR INSPECTING SEMICONDUCTOR WAFER AND METHOD OF FABRICATING SEMICONDUCTOR DEVICE USING THE SAME

(71) Applicant: SAMSUNG ELECTRONICS CO., LTD., Suwon-si (KR)

(72) Inventors: Q-Han Park, Seoul (KR); Sung Yoon Ryu, Seoul (KR); Seunghyeok Son, Suwon-si (KR); Sujin Lee, Gwangmyeong-si (KR); Chan Gi Jeon, Hwaseong-si (KR); Su-Hyun Gong, Seoul (KR); DongGun Lee, Seoul (KR); Younghoon Sohn, Seoul (KR)

(73) Assignees: SAMSUNG ELECTRONICS CO., LTD., Suwon-si (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 414 days.

(21) Appl. No.: 17/836,678

(22) Filed: Jun. 9, 2022

(65) Prior Publication Data

US 2023/0103349 A1 Apr. 6, 2023

(30) Foreign Application Priority Data

Oct. 1, 2021 (KR) .................. 10-2021-0130981

(51) Int. Cl.
*G01N 21/95* (2006.01)
*G06T 7/00* (2017.01)
*H01L 21/66* (2006.01)

(52) U.S. Cl.
CPC ......... *G01N 21/9501* (2013.01); *G06T 7/001* (2013.01); *H01L 22/12* (2013.01); *G06T 2207/30148* (2013.01)

(58) Field of Classification Search
CPC ......... G01N 21/9501; G01N 21/95607; G01N 21/8851; G01N 2021/8887; G06T 7/001;
(Continued)

(56) References Cited

U.S. PATENT DOCUMENTS

| 5,506,676 A | * | 4/1996 | Hendler | ............... G01R 31/308 |
| | | | | 250/559.46 |
| 6,804,381 B2 | | 10/2004 | Pang et al. | |

(Continued)

FOREIGN PATENT DOCUMENTS

| JP | 2003123073 A | * | 4/2003 | |
| JP | 2018179969 A | * | 11/2018 | ............... A61B 6/06 |

(Continued)

OTHER PUBLICATIONS

Tiwari et al., "Subpixel target detection and enhancement in hyperspectral images", Proc. SPIE 8048, Algorithms and Technologies for Multispectral, Hyperspectral, and Ultraspectral Imagery XVII, 80481T (May 20, 2011); https://doi.org/10.1117/12.887426 (Year: 2011).*

(Continued)

*Primary Examiner* — Emily C Terrell
*Assistant Examiner* — Julia Z. Yao
(74) *Attorney, Agent, or Firm* — Sughrue Mion, PLLC

(57) ABSTRACT

A semiconductor wafer inspection method is provided. The semiconductor wafer inspection method includes: providing a wafer with target and reference dies; obtaining a candidate image of a first region of the target die and a reference image of a second region of the reference die; performing an imaging process on the candidate image to obtain a high resolution candidate image including sub-pixels for each pixel of the candidate image; performing the imaging process on the reference image to obtain a high resolution reference image including sub-pixels for each pixel of the (Continued)

candidate image; shifting the high resolution reference image in units of the sub-pixels; obtaining a difference image based on a difference between the high resolution candidate image and the high resolution reference image; and detecting whether a defect signal generated based on the difference image exceeds a threshold value.

20 Claims, 63 Drawing Sheets

(58) Field of Classification Search
CPC ......... G06T 2207/30148; G06T 3/4053; G06T 3/4084; H01L 22/12; H01L 22/20
See application file for complete search history.

(56) References Cited

U.S. PATENT DOCUMENTS

| | | | |
|---|---|---|---|
| 6,865,288 B1* | 3/2005 | Shishido | G06T 7/001 |
| | | | 382/141 |
| 7,155,366 B2 | 12/2006 | Lee et al. | |
| 7,295,695 B1* | 11/2007 | Dayal | G01N 21/95607 |
| | | | 382/145 |
| 7,466,853 B2 | 12/2008 | Kim et al. | |
| 7,804,591 B2 | 9/2010 | Kim et al. | |
| 7,986,412 B2 | 7/2011 | Jeong | |
| 8,111,900 B2 | 2/2012 | Wu et al. | |
| 8,126,258 B2 | 2/2012 | Yang et al. | |
| 8,775,101 B2 | 7/2014 | Huang et al. | |
| 8,977,035 B2 | 3/2015 | Dalla-Torre et al. | |
| 9,170,211 B2 | 10/2015 | Kulkarni et al. | |
| 9,182,592 B2 | 11/2015 | Ueno et al. | |
| 10,599,951 B2 | 3/2020 | Bhaskar et al. | |
| 2004/0086167 A1 | 5/2004 | Jun et al. | |
| 2008/0093551 A1* | 4/2008 | Tsuneta | G06T 5/80 |
| | | | 382/255 |
| 2012/0155740 A1 | 6/2012 | Cho et al. | |
| 2013/0164922 A1* | 6/2013 | Cho | H01L 21/32137 |
| | | | 438/510 |
| 2017/0191945 A1* | 7/2017 | Zhang | G06T 7/001 |
| 2019/0130551 A1* | 5/2019 | Chen | G06T 7/001 |
| 2019/0385280 A1 | 12/2019 | Huang et al. | |
| 2021/0104034 A1 | 4/2021 | Wu et al. | |

FOREIGN PATENT DOCUMENTS

| | | |
|---|---|---|
| KR | 10-2004-0038999 A | 5/2004 |
| KR | 10-2004-0062299 A | 7/2004 |
| KR | 10-2005-0052805 A | 6/2005 |
| KR | 10-0755372 B1 | 9/2007 |
| KR | 10-2008-0042255 A | 5/2008 |
| KR | 10-2012-0068128 A | 6/2012 |
| KR | 10-2013-0139762 A | 12/2013 |
| WO | WO-2021074944 A1 * | 4/2021 |

OTHER PUBLICATIONS

Li et al., "Defect Detection Based on Fusion of Phase Congruency and Shear Wavelet," 2020 International Symposium on Autonomous Systems (ISAS), Guangzhou, China, 2020, pp. 258-262, doi: 10.1109/ISAS49493.2020.9378880. (Year: 2020).*

* cited by examiner

METHOD AND SYSTEM FOR INSPECTING SEMICONDUCTOR WAFER AND METHOD OF FABRICATING SEMICONDUCTOR DEVICE USING THE SAME

CROSS-REFERENCE TO RELATED APPLICATION

This application claims priority to Korean Patent Application No. 10-2021-0130981, filed on Oct. 1, 2021, in the Korean Intellectual Property Office, the disclosure of which is incorporated by reference herein in its entirety.

BACKGROUND

The present disclosure relates to a method of inspecting a semiconductor wafer, an inspection system therefor, and a method of fabricating a semiconductor device using the same.

Due to their small-sized, multifunctional, and/or low-cost characteristics, semiconductor devices are important elements in the electronic industry. The semiconductor devices may be fabricated by various processes such as photolithography, etching, deposition, ion implantation, and cleaning processes. An inspection process may be performed after the fabrication processes to examine whether there is any failure in patterns constituting a fabricated semiconductor device. Based on the inspection process, it is possible to optimize a process condition of the fabrication process and to know whether there is any failure in a semiconductor device in an early stage. As an integration density of the semiconductor device increases, there is an increasing demand for a method and a system capable of reliably detecting a defect in fine patterns in the semiconductor device.

SUMMARY

One or more embodiments provide a highly-reliable inspection method and a highly-reliable inspection system.

One or more embodiments provide a method of fabricating a semiconductor device using a highly-reliable inspection method.

According to an embodiment, a semiconductor wafer inspection method includes: providing a wafer including a target die and a reference die; obtaining a candidate image of a first region of the target die; obtaining a reference image of a second region of the reference die, the second region corresponding to the first region; performing an imaging process on the candidate image to obtain a high resolution candidate image including sub-pixels for each pixel of the candidate image; performing the imaging process on the reference image to obtain a high resolution reference image including sub-pixels for each pixel of the candidate image; shifting the high resolution reference image in units of the sub-pixels; obtaining a difference image based on a difference between the high resolution candidate image and the high resolution reference image; and detecting whether a defect signal generated based on the difference image exceeds a threshold value.

According to an embodiment, a semiconductor wafer inspection method includes: providing a wafer including a target die and a reference die; obtaining a candidate image of a first region of the target die; obtaining a reference image of a second region of the reference die, the second region corresponding to the first region; obtaining a difference image based on a difference between the candidate image and the reference image; transforming the difference image to a spatial frequency domain using a fast Fourier transform to produce a first spatial frequency component; transforming the reference image to the spatial frequency domain using the fast Fourier transform to produce a second spatial frequency component; obtaining a third spatial frequency component based on a difference between the first spatial frequency component and the second spatial frequency component; and identifying a defect type based on the third spatial frequency component.

According to an embodiment, a method of fabricating a semiconductor device includes: providing a wafer including a target die and a reference die; performing a semiconductor fabrication process on the target die and the reference die to form a first pattern on the target die and a second pattern on the reference die; obtaining a candidate image of the first pattern; obtaining a reference image of the second pattern; performing an imaging process on the candidate image to obtain a high resolution candidate image including sub-pixels for each pixel of the candidate image; performing the imaging process on the reference image to obtain a high resolution reference image including sub-pixels for each pixel of the candidate image; shifting the high resolution reference image in units of the sub-pixels; obtaining a difference image based on a difference between the high resolution candidate image and the high resolution reference image; and detecting whether a defect signal generated based on the difference image exceeds a threshold value.

According to an embodiment, a semiconductor wafer inspection apparatus includes: one or more memories storing instructions; and one or more processors configured to execute the instructions to: obtain a candidate image of a first region of a target die; obtain a reference image of a second region of a reference die, the second region corresponding to the first region; perform an imaging process on the candidate image to obtain a high resolution candidate image including sub-pixels for each pixel of the candidate image; perform the imaging process on the reference image to obtain a high resolution reference image including sub-pixels for each pixel of the candidate image; shift the high resolution reference image in units of the sub-pixels; obtain a difference image based on a difference between the high resolution candidate image and the high resolution reference image; and detect whether a defect signal generated based on the difference image exceeds a threshold value.

BRIEF DESCRIPTION OF THE DRAWINGS

The above and other aspects will be more apparent from the following description of example embodiments taken in conjunction with the accompanying drawings, in which.

DETAILED DESCRIPTION

Embodiments will now be described more fully with reference to the accompanying drawings. Embodiments described herein are all example embodiments, and thus, the inventive concept is not limited thereto, and may be realized in various other forms. Each embodiment provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof.

Figure 1:
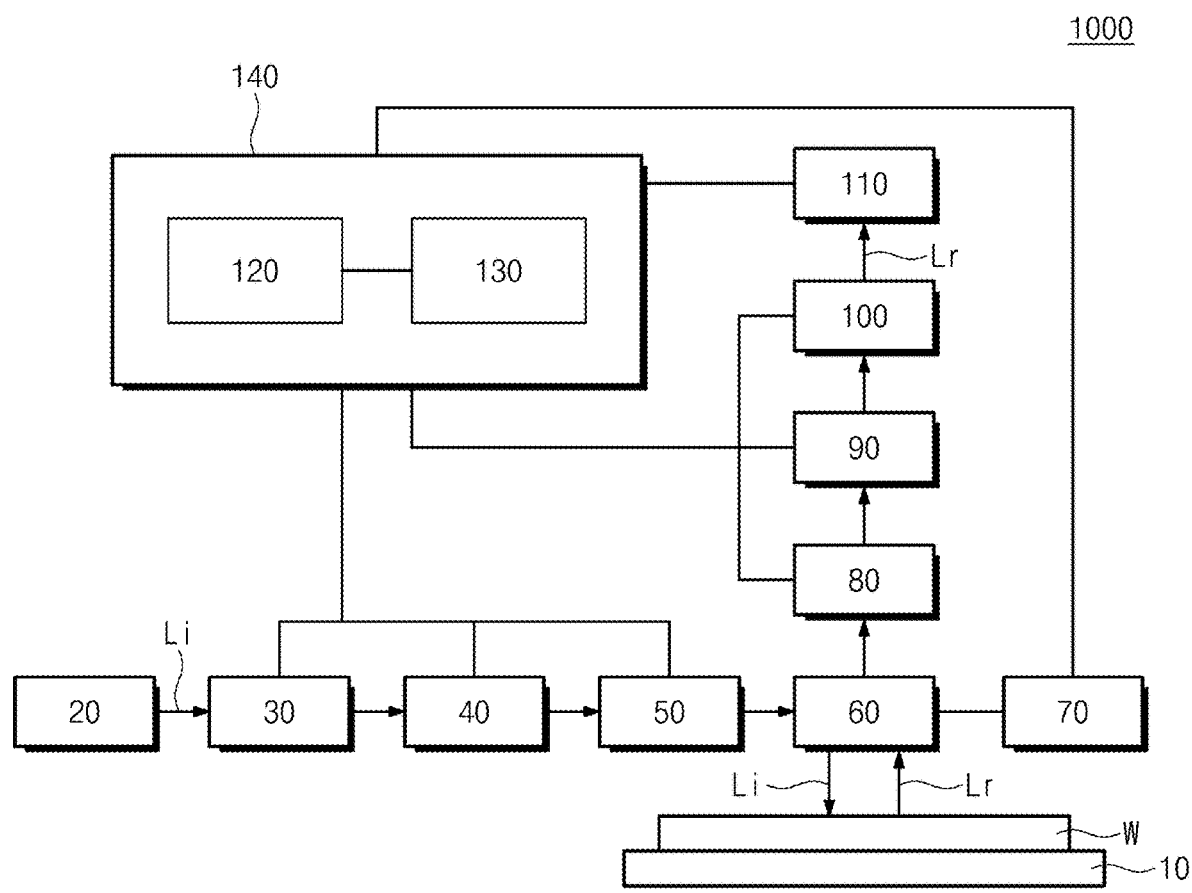
FIG. 1 is a schematic diagram illustrating an inspection system according to an embodiment.

FIG. 1 is a schematic diagram illustrating an inspection system according to an embodiment.

An inspection system 1000 may include a stage 10, which is configured to load a wafer W, a light source 20, which is configured to emit an incident light Li onto the wafer W, and a detector 110, which is configured to detect a reflection light Lr reflected from the wafer W. The inspection system 1000 may include a first spatial filter 30 for spatial filtering of the incident light Li, a spectrum filter 40 for wavelength modulation of the incident light Li, a first polarization filter 50 for adjusting polarization of the incident light Li, a second polarization filter 80 for adjusting polarization of the reflection light Lr, a second spatial filter 90 for spatial filtering of the reflection light Lr, and a tube lens 100 and an objective lens 60 for changing an optical magnification of the inspection system 1000. The inspection system 1000 may include an auto-focus 70, which is configured to adjust a focal plane of the incident light Li.

The inspection system 1000 may further include a computer system 140 with a processor 120 and a controller 130. The computer system 140 may further include one or more memories and one or more nonvolatile storage devices. The processor 120 may be configured to store and process various data. As an example, the processor 120 may store and process an optical signal of the reflection light Lr, which is detected by the detector 110. The controller 130 may be configured to control operations of the first and second spatial filters 30 and 90, the spectrum filter 40, the first and second polarization filters 50 and 80, the tube lens 100, and the auto-focus 70. The controller 130 may be configured to change an operation of at least one of the first and second spatial filters 30 and 90, the spectrum filter 40, the first and second polarization filters 50 and 80, the tube lens 100, and the auto-focus 70, and this may make it possible to change optical conditions for the incident light Li and the reflection light Lr. The processor 120 and the controller 130 may be coupled to each other through a data bus. The inspection system 1000 may be used for a non-destructive test.

Hereinafter, a semiconductor wafer inspection method, which is performed using the inspection system 1000, will be described in more detail.

Figure 2:
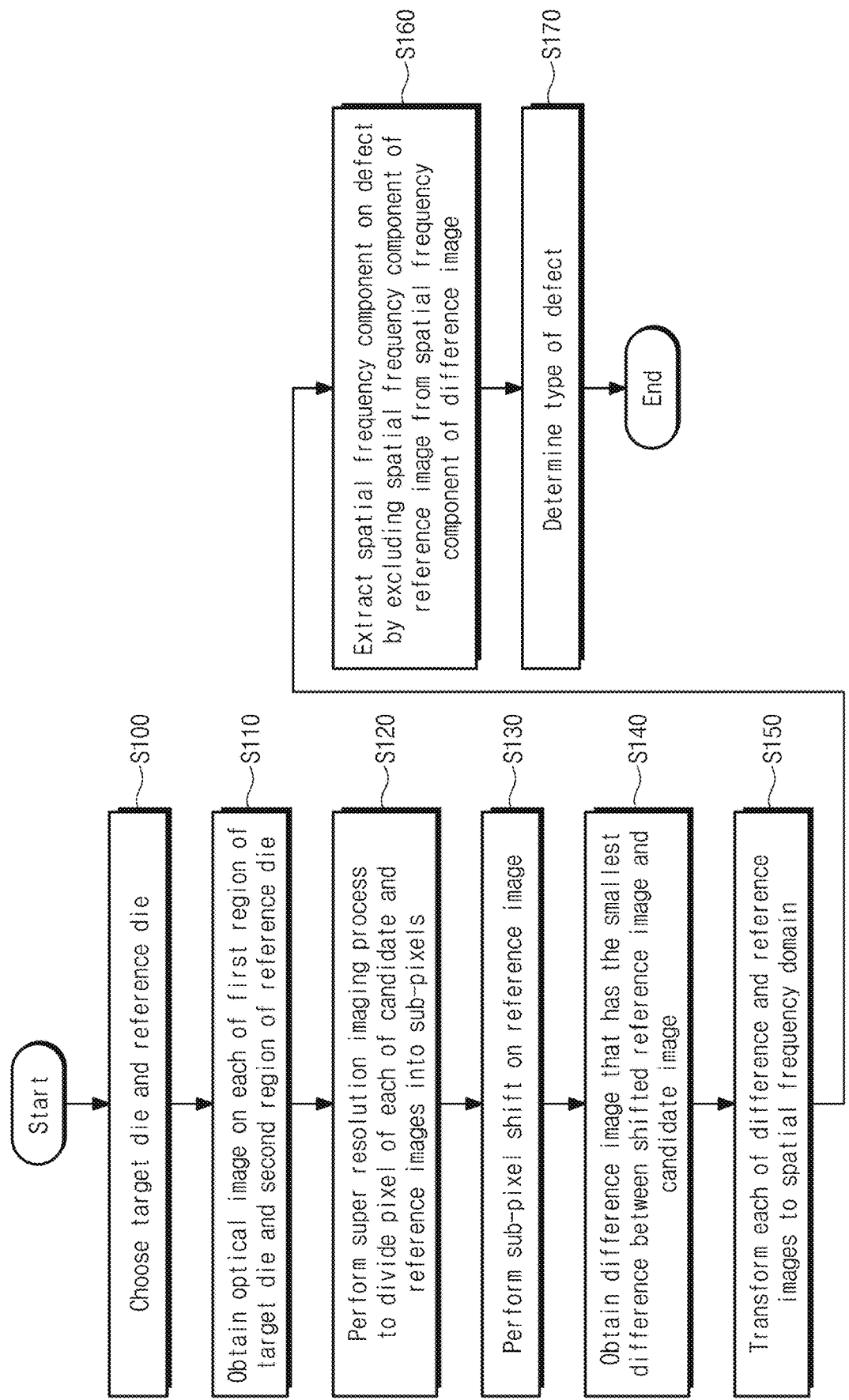
FIG. 2 is a flowchart illustrating a method of inspecting a semiconductor wafer according to an embodiment.
Figure 3:
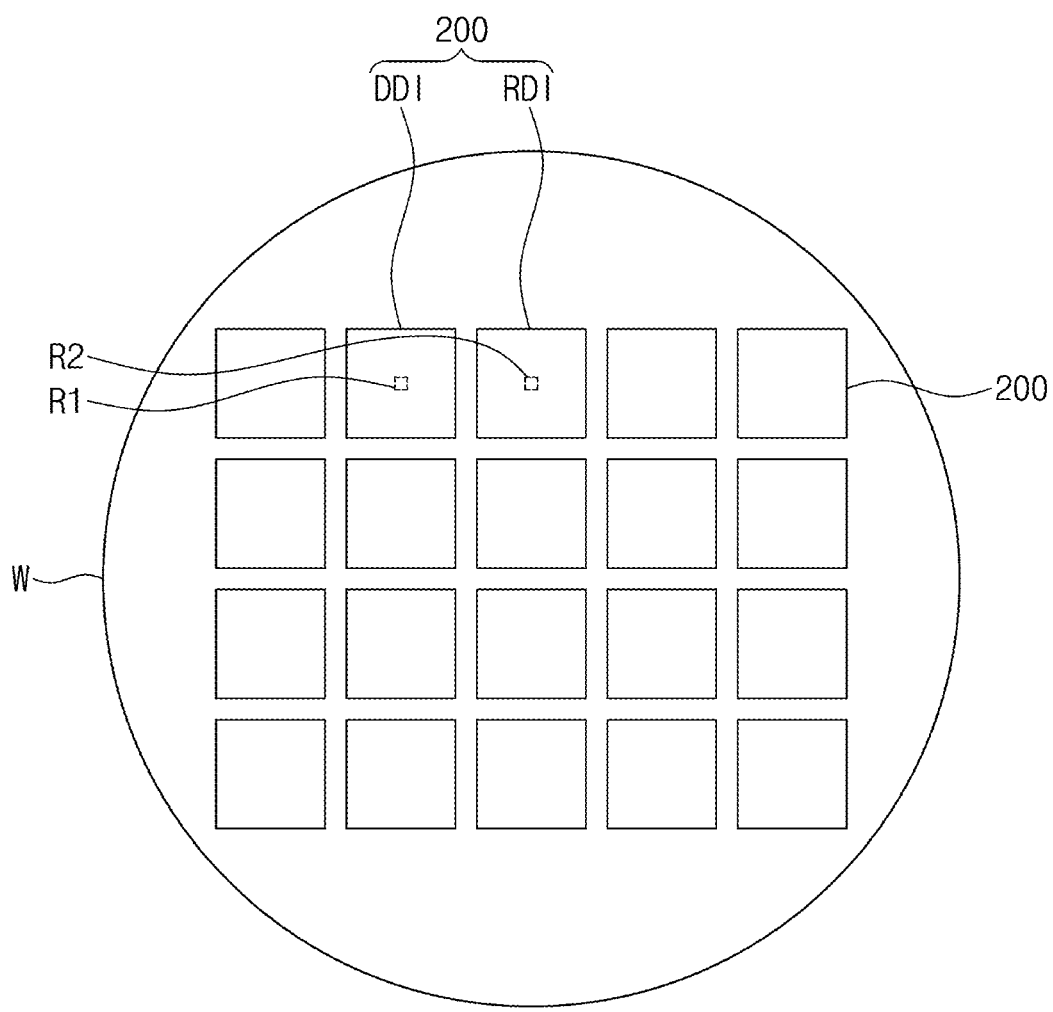
FIG. 3 is a plan view illustrating a semiconductor wafer according to an embodiment.

FIG. 2 is a flowchart illustrating a method of inspecting a semiconductor wafer according to an embodiment. FIG. 3 is a plan view illustrating a semiconductor wafer according to an embodiment. FIGS. 4 to 15 are diagrams illustrating the method of inspecting a semiconductor wafer, described with reference to FIG. 2.

Referring to FIGS. 2 and 3, the wafer W may include a plurality of dies 200. A target die DDI and a reference die RDI may be chosen from the dies 200 of the wafer W. The target die DDI may be a target for a defect inspection process, and the reference die RDI may be a contrastive die, which is used to determine whether or not the target die DDI has a defect. The target and reference dies DDI and RDI may be fabricated through the same semiconductor fabrication process, and thus, they may include the same pattern.

The target die DDI may include a first region R1, and the reference die RDI may include a second region R2 corresponding to the first region R1. The first region R1 may be an inspection region and may include an inspection pattern. The second region R2 may be a region, which is chosen for comparison with the first region R1, and may include a reference pattern corresponding to the inspection pattern.

Figure 4:
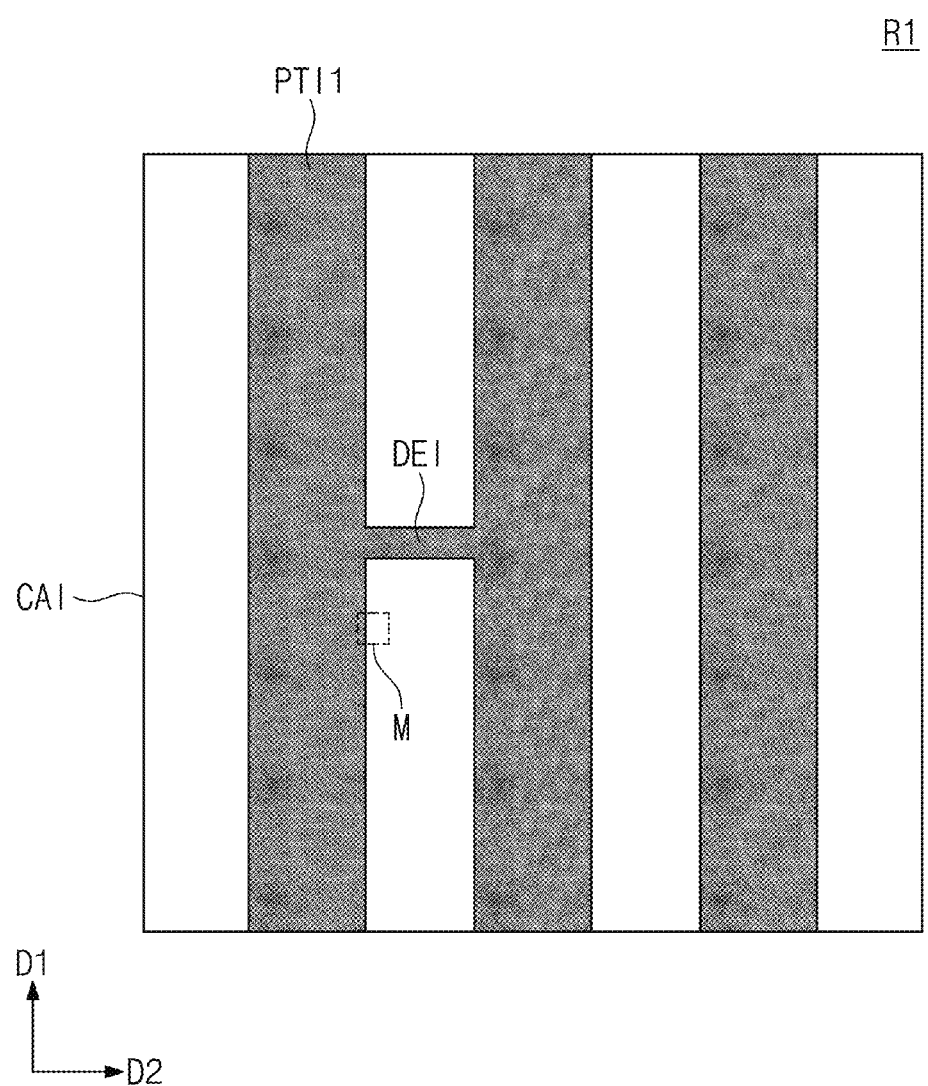
FIG. 4 is an optical image showing an enlarged shape of a first region of FIG. 3.
Figure 5:
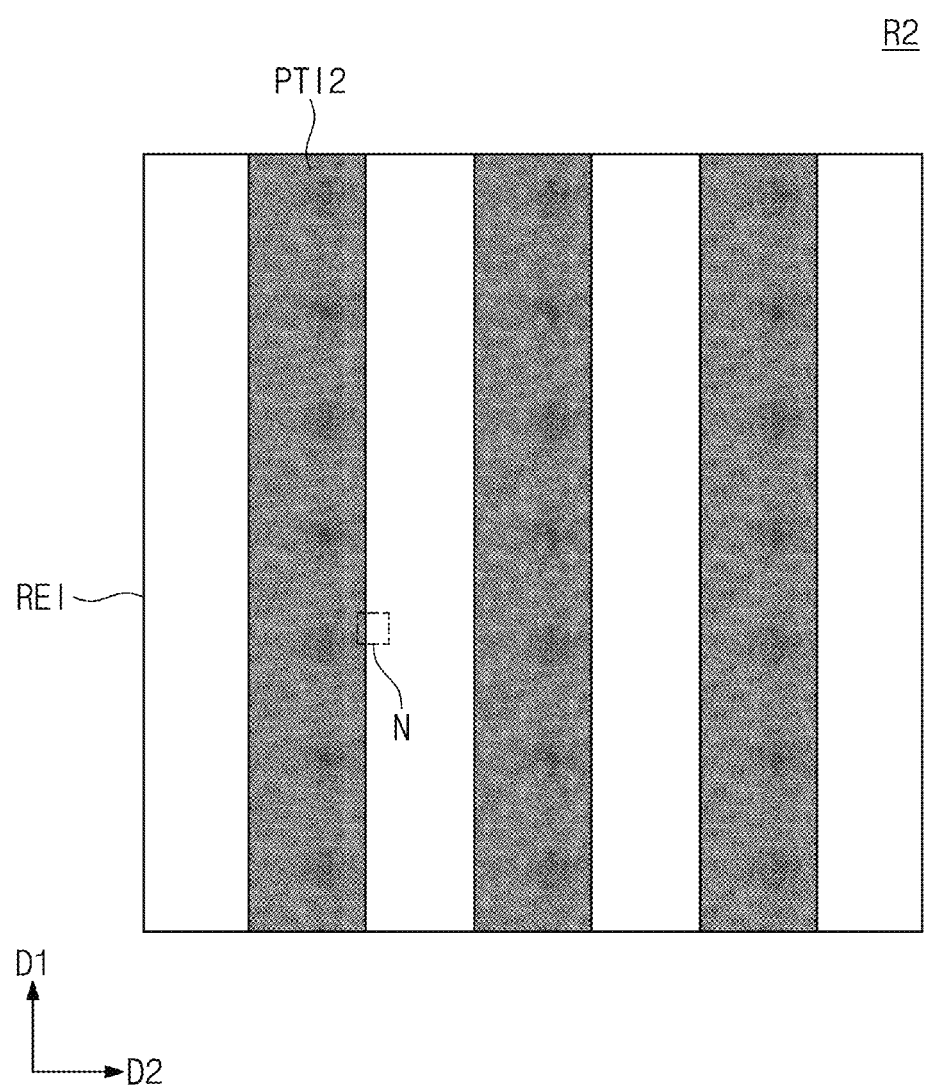
FIG. 5 is an optical image showing an enlarged shape of a second region of FIG. 3.

FIG. 4 is an optical image showing an enlarged shape of the first region R1 of FIG. 3, and FIG. 5 is an optical image showing an enlarged shape of the second region R2 of FIG. 3. Referring to FIGS. 2, 4, and 5, an optical image may be obtained on each of the first and second regions R1 and R2, which are respectively included in the target and reference dies DDI and RDI of FIG. 3 (in S110). In detail, the inspection system 1000 of FIG. 1 may scan a plurality of the dies 200. The controller 130 of the inspection system 1000 may control an operation of at least one of the first and second spatial filters 30 and 90, the spectrum filter 40, the first and second polarization filters 50 and 80, the tube lens 100, and the auto-focus 70 such that each of the dies 200 can be scanned under an optimized optical condition.

Optical signals on the first and second regions R1 and R2 may be obtained by scanning the first region R1 of the target die DDI and the second region R2 of the reference die RDI using the inspection system 1000 of FIG. 1. A candidate image CAI for the first region R1 and a reference image REI for the second region R2 may be respectively obtained from the optical signals, as shown in FIGS. 4 and 5, respectively.

The optical signals may be represented in terms of various optical variables. For example, the optical variables may represent some optical properties (e.g., intensity and grayscale) of light that is reflected from a pattern of each of the first and second regions R1 and R2. In an embodiment, the candidate image CAI of FIG. 4 may be a grayscale image of the first region R1, and the reference image REI of FIG. 5 may be a grayscale image of the second region R2.

The candidate image CAI of FIG. 4 may include a first pattern image PTI1, and the reference image REI of FIG. 5 may include a second pattern image PTI2. The first pattern image PTI1 may be obtained from the first region R1 and may be used as an inspection pattern image, and the second pattern image PTI2 may be obtained from the second region R2 and may be used as a reference pattern image. For example, each of the first and second pattern images PTI1 and PTI2 may be an image obtained from a line-and-space pattern. Each of the first and second pattern images PTI1 and PTI2 may include a plurality of line-shaped patterns extended in a first direction D1.

The inspection pattern in the first region R1 of the target die DDI may include a defect. For example, the inspection pattern of the first region R1 may include a bridge pattern which is formed when a first line is connected to a second line adjacent thereto. In this case, the first pattern image PTI1 of FIG. 4 may include a defect image DEI which is produced by the bridge pattern.

Figure 6:
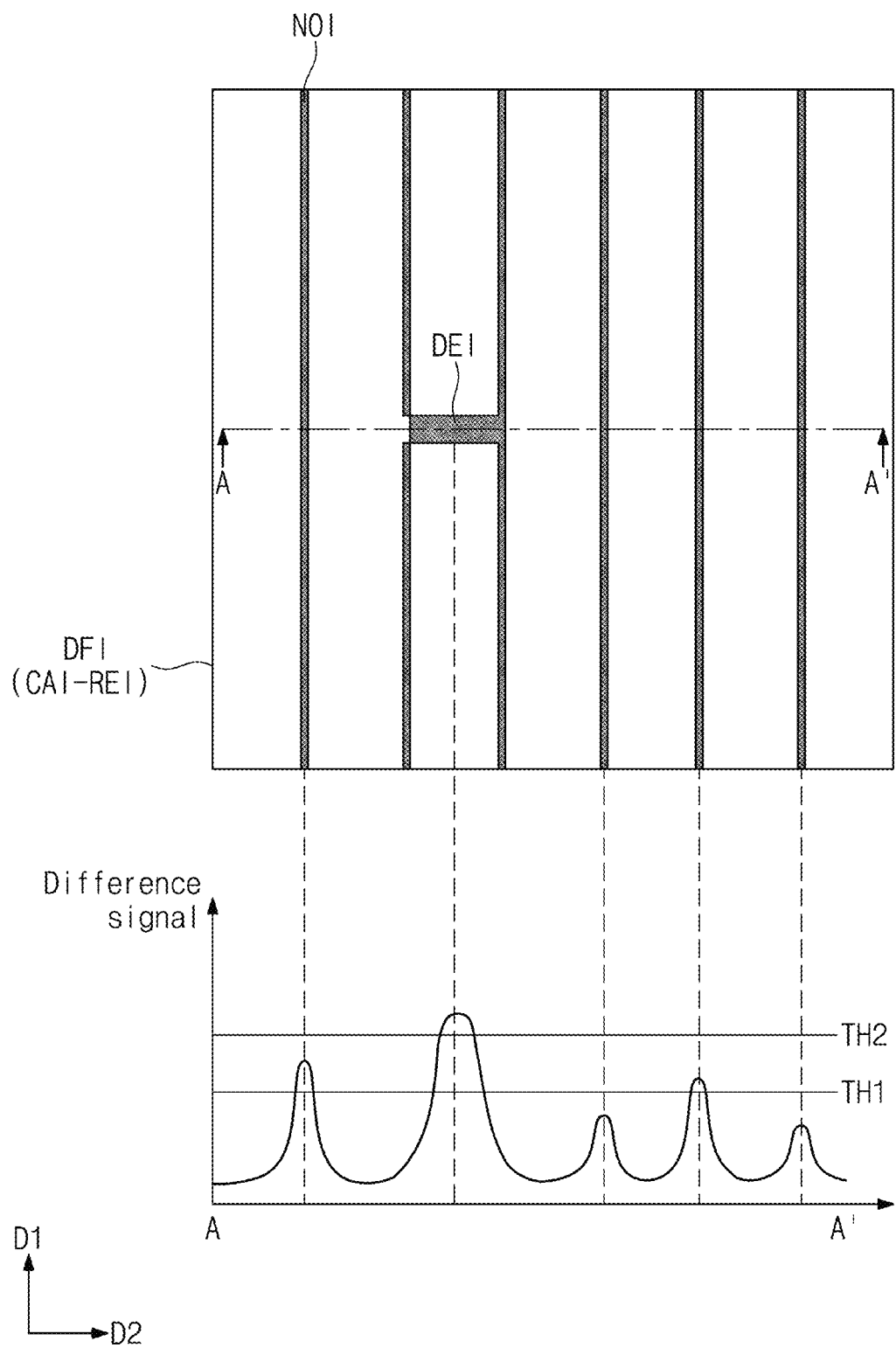
FIG. 6 is a diagram illustrating a difference image according to a comparative example.

FIG. 6 is a diagram illustrating a difference image according to a comparative example. In detail, FIG. 6 shows a difference between the candidate image CAI of FIG. 4 and the reference image REI of FIG. 5. For example, the shaded regions may indicate differences between the candidate image CAI and the reference image REI. Referring to FIG. 6, even when the second region R2 of FIG. 5 corresponds to the first region R1 of FIG. 4, the reference image REI of FIG. 5 may not be completely overlapped with the candidate image CAI of FIG. 4. For example, the candidate image CAI of FIG. 4 may be slightly offset from the reference image REI of FIG. 5. This may be due to slight differences, within an error tolerance, in aligning the dies 200 to each other during a semiconductor fabrication process and the inspection system 1000. Thus, there exists differences due to misalignment and it is hard to remove a difference in shape and position between the candidate image CAI of FIG. 4 and the reference image REI of FIG. 5.

A difference image DFI of FIG. 6 may be obtained as a difference between the candidate image CAI of FIG. 4 and the reference image REI of FIG. 5. The difference image DFI may include a noise image NOI and a defect image DEI. The noise image NOI may be caused by non-defective factors, such as differences in misalignment and/or size between the candidate and reference images CAI and REI. That is, the noise image NOI may not be caused by the defect in the first region R1. The defect image DEI may be caused by a defective factor.

The defect image DEI may be formed by a defect image DF in the candidate image CAI. The defect image DF may exist in the candidate image CAI of FIG. 4 but may not exist in the reference image REI of FIG. 5. In this case, the defect image DEI may result from the difference between the candidate and reference images CAI and REI. In other words, the defect image DEI may be an image formed by a defect in the first region R1.

In the difference image DFI of FIG. 6, it may be necessary to distinguish the defect image DEI from the noise image NOI. For example, because the noise image NOI is a noise signal which is not caused by a defect, it may be necessary to remove the noise image NOI through a filtering process.

Referring to the difference signal of FIG. 6, a signal of the noise image NOI may have a relatively small intensity, and a signal of the defect image DEI may have a relatively great intensity. Accordingly, if a threshold value for the difference signal is given, a signal whose intensity is greater than the threshold value may be classified as the defect image DEI, and a signal whose intensity is smaller than the threshold value may be classified as the noise image NOI.

However, the afore-described method may suffer from a technical limitation of low accuracy. In the example of FIG. 6, if a first threshold value TH1 is chosen as the threshold value, there are three signal peaks greater than the first threshold value TH1. If a second threshold value TH2 is chosen as the threshold value, there is one signal peak greater than the second threshold value TH2. If the threshold value is set to an excessively high value, there is a risk that a defect signal is classified as a noise signal, and if the threshold value is set to an excessively low value, there is a risk that a noise signal is classified as a defect signal. That is, the method according to the comparative example has a problem in that the accuracy of the result depends on how the threshold value is set.

Figure 7A:
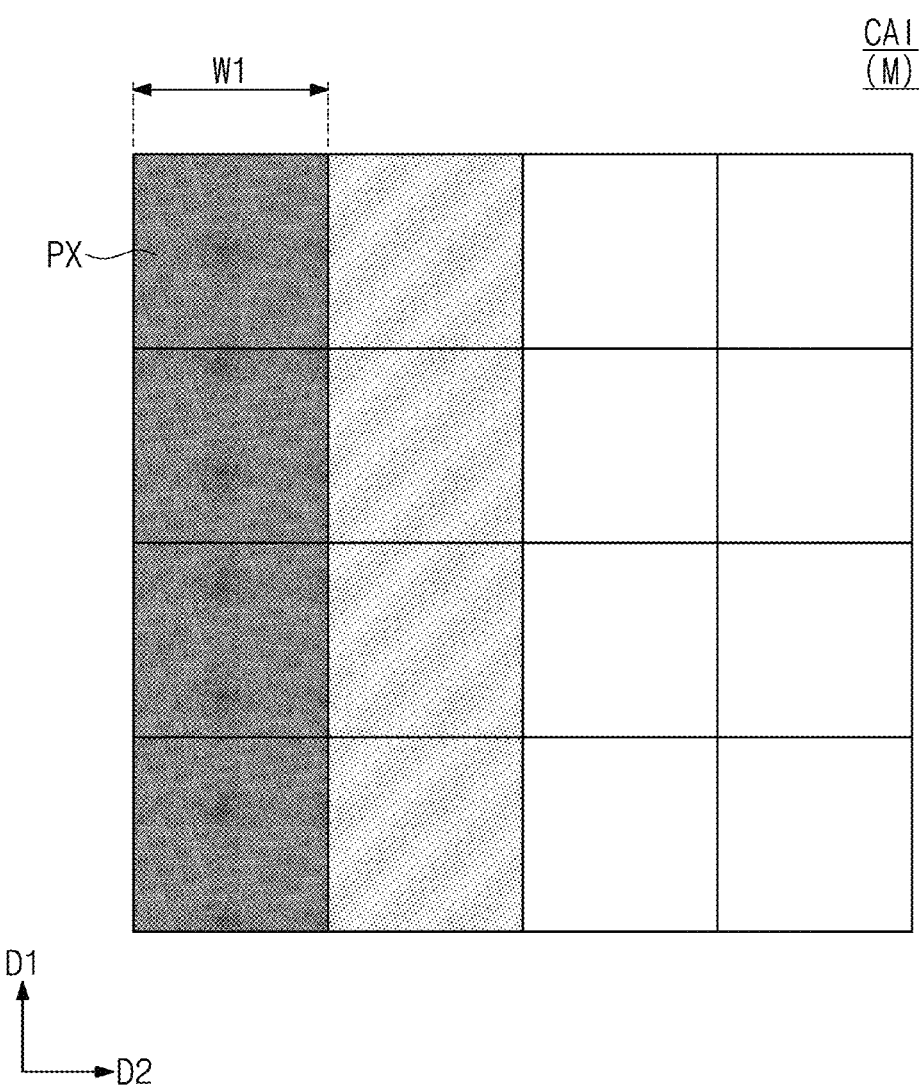
FIG. 7A is an enlarged view illustrating a region M of a candidate image of FIG. 4.

Hereinafter, a defect inspection method according to an embodiment will be described in more detail. FIG. 7A is an enlarged view illustrating a region M of the candidate image CAI of FIG. 4, and FIG. 7B is an enlarged view illustrating a region N of the reference image REI of FIG. 5.

Figure 7B:
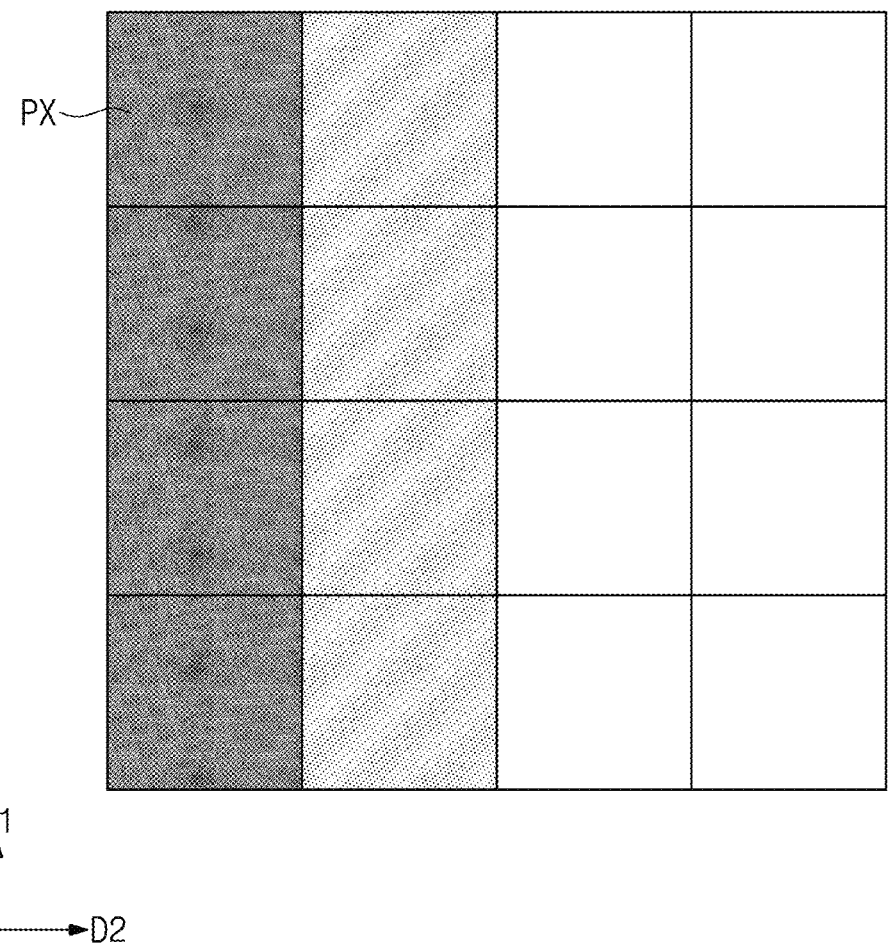
FIG. 7B is an enlarged view illustrating a region N of a reference image of FIG. 5.

Referring to FIGS. 7A and 7B, each of the candidate and reference images CAI and REI may be an optical image which is composed of a plurality of pixels PX. Due to a limitation in resolution of the inspection system 1000, the pixel PX may have a first width W1. In an embodiment, the first width W1 may range from 100 nm to 300 nm. As a semiconductor device is highly integrated, there is an increasing difficulty in exactly realizing an image of a pattern, which is a target of the inspection process, with the pixels PX of the inspection system 1000.

Thus, there may be a small offset difference between the candidate and reference images CAI and REI, as previously described with reference to FIG. 6. However, a simple comparison of the optical images of FIGS. 7A and 7B may not yield a distinguishable result on the offset difference between the candidate and reference images CAI and REI.

Figure 8A:
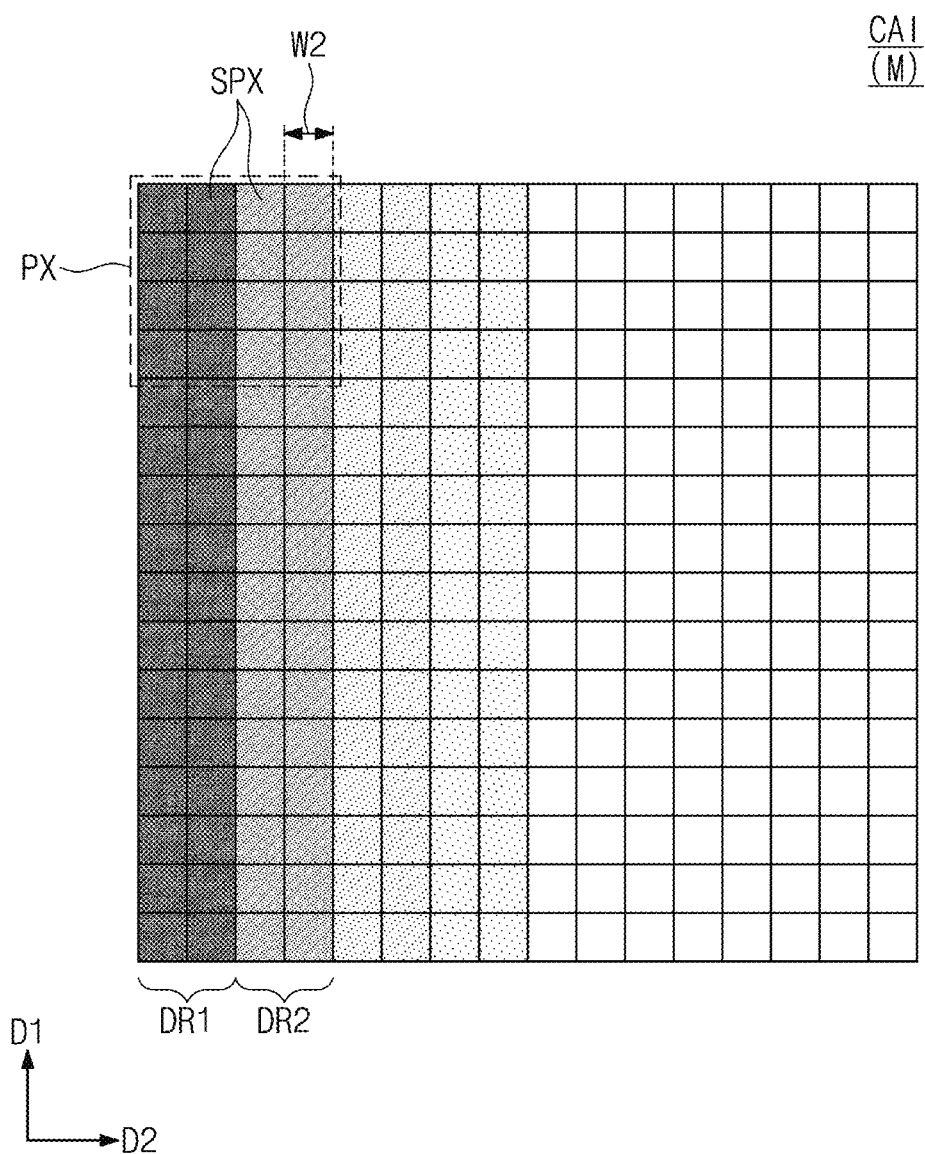
FIG. 8A is a diagram showing a high resolution candidate image obtained by performing a super resolution imaging process on the candidate image of FIG. 7A.
Figure 8B:
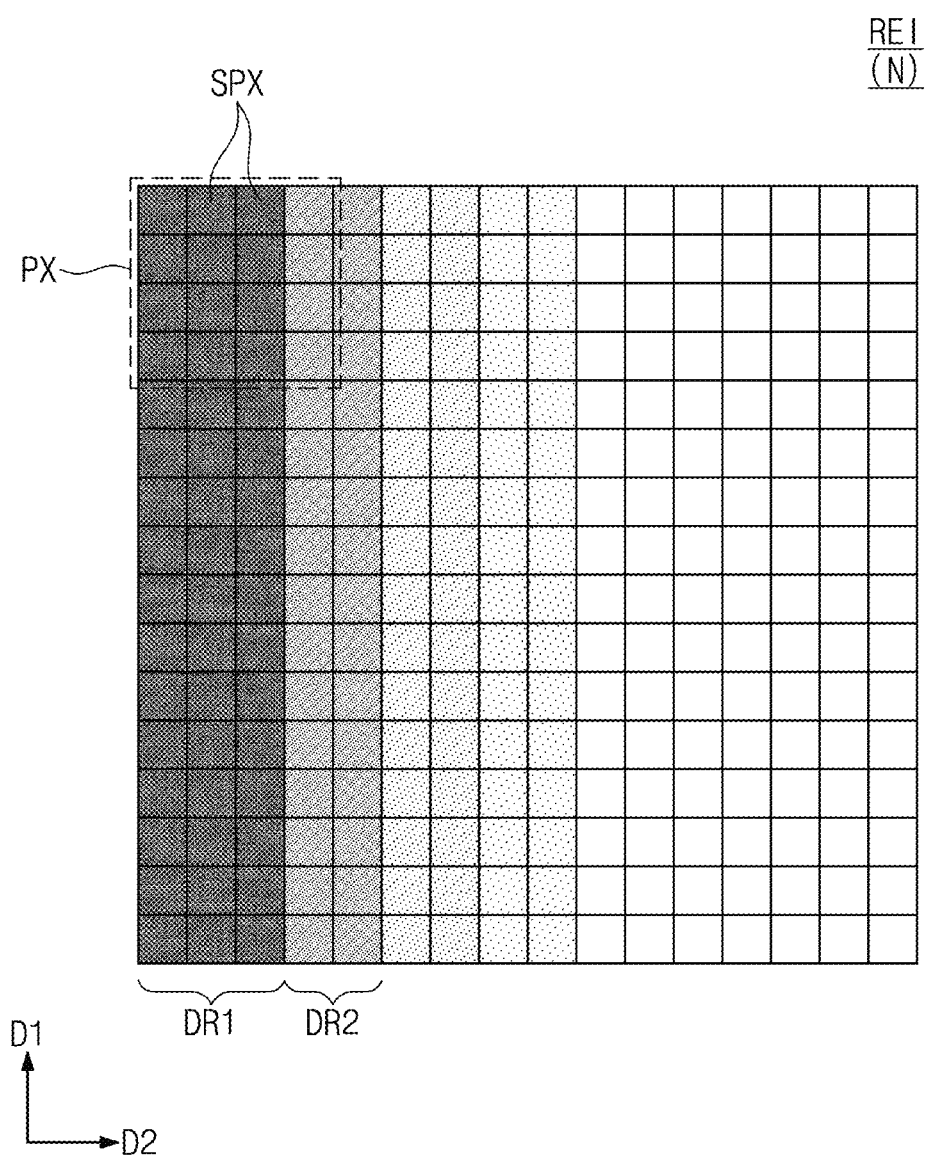
FIG. 8B is a diagram showing a high resolution reference image obtained by performing a super resolution imaging process on the reference image of FIG. 7B.

FIG. 8A is a diagram showing a result (i.e., a high resolution candidate image) obtained by performing a super resolution imaging process on the candidate image CAI of FIG. 7A. FIG. 8B is a diagram showing a result (i.e., a high resolution reference image) obtained by performing a super resolution imaging process on the reference image REI of FIG. 7B.

Referring to FIGS. 2, 8A, and 8B, a super resolution imaging process may be performed on the candidate image CAI of FIG. 7A to divide each of the pixels PX into a plurality of sub-pixels SPX (in S120). A super resolution imaging process may be performed on the reference image REI of FIG. 7B to divide each of the pixels PX into plurality of sub-pixels SPX.

The super resolution imaging process may be performed using a fast Fourier transform or a deep-learning based algorithm. Each pixel PX may be divided into a plurality of sub-pixels SPX, each of which is smaller than the pixel PX, by the super resolution imaging process. Accordingly, an image, which is obtained by the super resolution imaging process, may have an increased resolution, compared with the original image. In an embodiment, the super resolution imaging process may be performed by a fast Fourier transform using the following formula 1.

$$D\text{:Difference image array} \quad [\text{Formula 1}]$$
$$F\text{:Defective image array}$$
$$R\text{:Reference image array}$$
$$D_{\Delta x, \Delta y} \equiv F(x + \Delta x, y + \Delta y) - R(x, y)$$
$$D_{\Delta x, \Delta y} = \mathcal{F}_y^{-1}\mathcal{F}_x^{-1}\left[e^{i(k_x\Delta x + k_y\Delta y)}\mathcal{F}_x\mathcal{F}_y[F(x, y)]\right] - R(x, y)$$
$$\begin{pmatrix} \text{Fourier Transform } (\mathcal{F}) \\ \mathcal{F}(f(x)) \equiv \int f(x)e^{-ikx}dx \\ f(x + \Delta x) = \mathcal{F}^{-1}\left[e^{ik\Delta x}\mathcal{F}[f(x)]\right] \end{pmatrix}$$
$$D_{\Delta x, \Delta y} = \mathcal{F}_y^{-1}\mathcal{F}_x^{-1}\left[e^{i(k_x\Delta x - k_y\Delta y)}\mathcal{F}_x\mathcal{F}_y[F(x, y)]\right] - R(x, y)$$

The pixel PX may be divided into n×m sub-pixels SPX by performing the super resolution imaging process. Here, each of n and m is an integer between 2 and 20. For example, each pixel PX may be divided into 4×4 sub-pixels SPX, as shown in FIGS. 8A and 8B. The sub-pixel SPX may have a second width W2 that is smaller than the first width W1.

As shown in the super resolution candidate image CAI of FIG. 8A, the sub-pixels SPX constituting a first gray region DR1 and the sub-pixels SPX constituting a second gray region DR2 may be generated from each of the pixels PX. In FIG. 7A, each of the pixels PX may be illustrated as only a single gray region, but as a result of the super resolution imaging process, the pixel PX of FIG. 8A may be given to have at least two gray regions DR1 and DR2, thereby providing an image with an increased resolution.

As shown in the super resolution reference image REI of FIG. 8B, the sub-pixels SPX constituting a first gray region DR1 and the sub-pixels SPX constituting a second gray region DR2 may be generated from each of the pixels PX. However, from the comparison of FIGS. 8A and 8B, it can be seen that the sub-pixels SPX of the first and second gray regions DR1 and DR2 of FIG. 8B do not exactly coincide with the sub-pixels SPX of the first and second gray regions DR1 and DR2 of FIG. 8A. In other words, the comparison of FIGS. 8A and 8B shows that the reference image REI of FIG. 8B is offset from the candidate image CAI of FIG. 8A by a length of a single sub-pixel SPX in a second direction D2.

It may be difficult to find a difference between the candidate and reference images CAI and REI of FIGS. 7A and 7B, on which the super resolution imaging process is not performed. However, a difference between the candidate and reference images CAI and REI of FIGS. 8A and 8B produced by performing the super resolution imaging process according to an embodiment may be clearly found.

Figure 9:
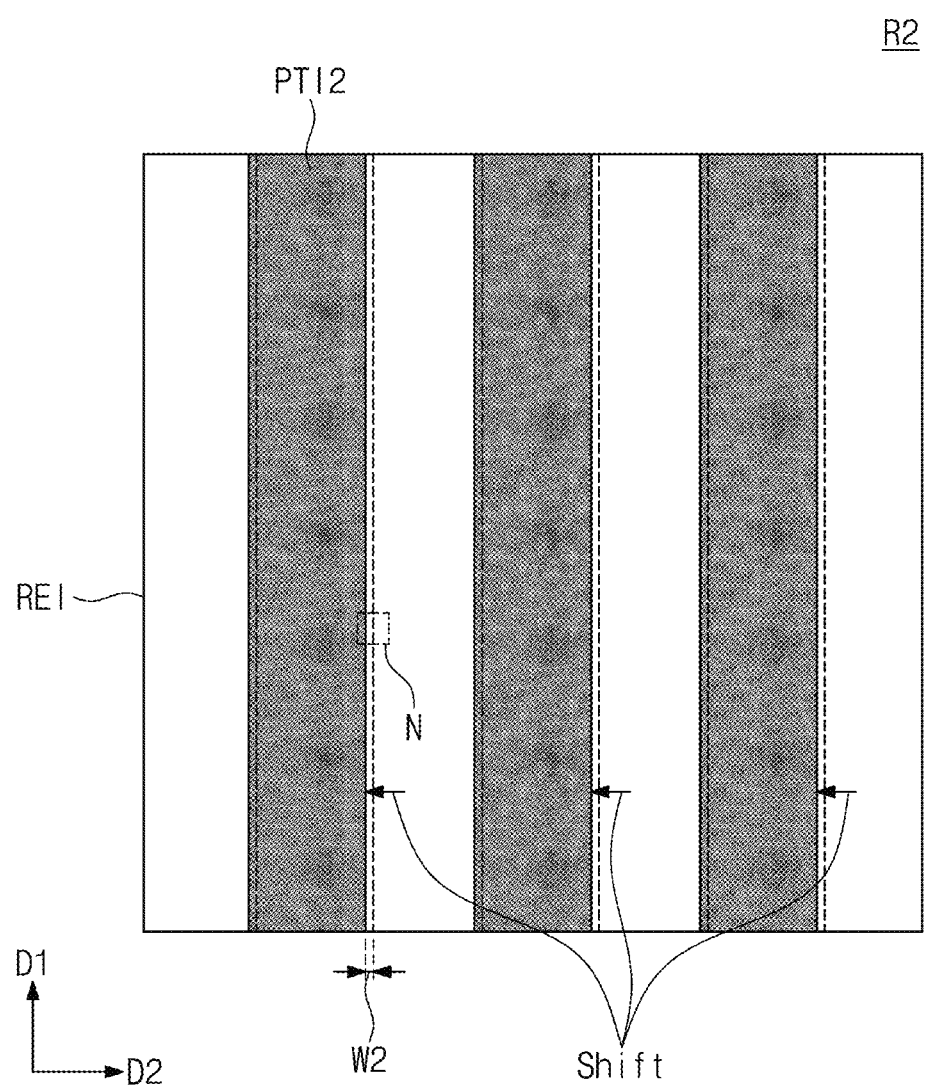
FIG. 9 is a diagram showing a result obtained by shifting a second pattern image of FIG. 4 using a super resolution imaging process.
Figure 10:
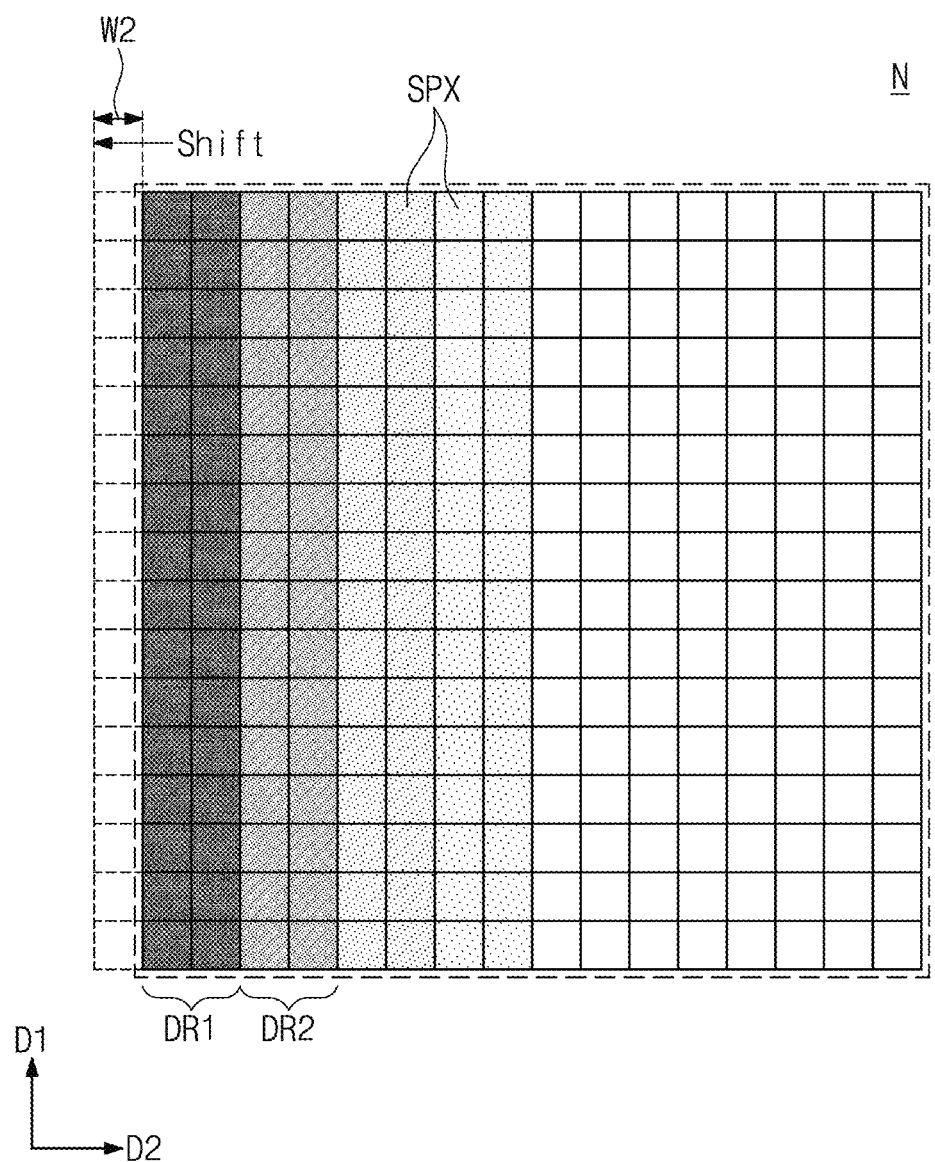
FIG. 10 is an enlarged view of a region N of FIG. 9, which is provided to illustrate a method of shifting a second pattern image.

FIG. 9 is a diagram showing a result obtained by shifting the second pattern image PTI2 of FIG. 5 using a super resolution imaging process. FIG. 10 is an enlarged view of a region N of FIG. 9, which is provided to illustrate a method of shifting the second pattern image PTI2.

Referring to FIGS. 2, 9, and 10, the second pattern image PTI2 of the reference image REI may be shifted by the width W2 of the sub-pixel in a direction opposite to the second direction D2 (in S130). That is, the second pattern image PTI2 may be shifted in units of sub-pixels. In detail, a super resolution image may be shifted per sub-pixel SPX, as illustrated in FIG. 10. The shift of the second pattern image PTI2 may be performed by a width, which is freely chosen from multiples of the width of the sub-pixel SPX. For the comparative example of FIG. 7B, the shift of the second pattern image PTI2 should be performed by at least a width of the pixel PX, and thus, a fine shift is impossible. However, in embodiments, by performing the super resolution imaging process, it may be possible to finely shift the second pattern image PTI2 in units of the sub-pixel SPX.

Figure 11:
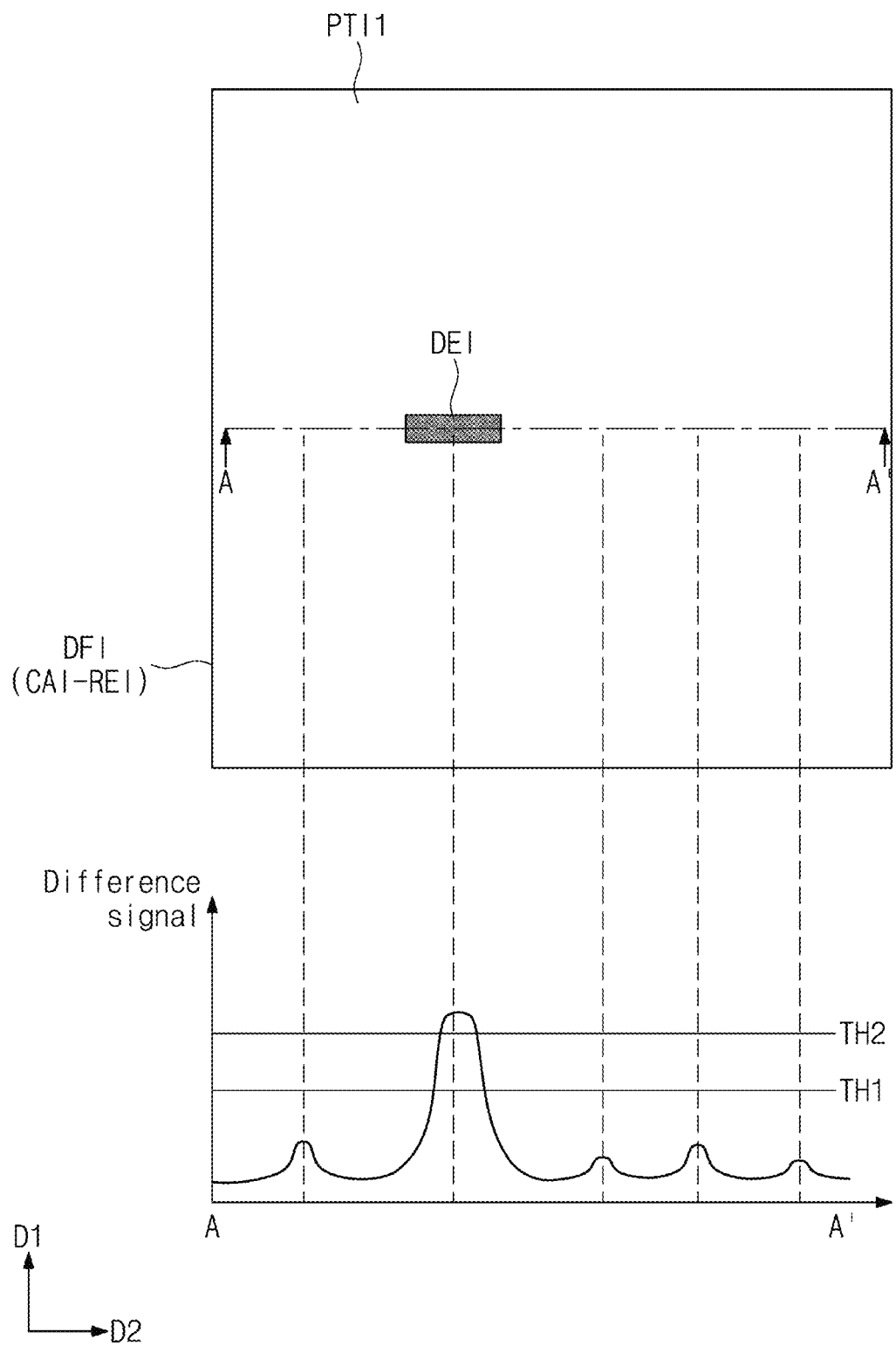
FIG. 11 is a diagram illustrating a difference image according to an embodiment.

FIG. 11 is a diagram illustrating a difference image according to an embodiment. Referring to FIGS. 2 and 11, the difference image DFI may be obtained as a difference between the candidate image CAI of FIG. 4 and the shifted reference image REI of FIG. 9 (in S140). As a result of the afore-described shifting operation performed in units of the sub-pixel, the second pattern image PTI2 of FIG. 9 may be moved to maximally coincide with the first pattern image PTI1 of FIG. 4. Accordingly, the difference image DFI of FIG. 11 may include only the defect image DEI, and the noise image NOI of FIG. 6 may be excluded.

For the difference signal shown in FIG. 11, because the difference image DFI of FIG. 11 does not include substantially the noise image NOI, a noise signal may be absent or may be negligible. Thus, even when any one of the first and second threshold values TH1 and TH2 is set to the threshold value, the number of a signal peak that is greater than the threshold value and corresponds to the defect image DEI, may be only one.

In the defect inspection method according to an embodiment, by finely shifting the reference image REI through a super resolution imaging process, it may be possible to exactly align the reference image REI to the candidate image CAI. Accordingly, it may be possible to obtain the difference image DFI, which is indicative of a defect, but not noise. In the defect inspection method according to an embodiment, a defect may be exactly detected, regardless of a setting value for the threshold value, and thus, the accuracy of the defect inspection process may be improved.

Figure 12:
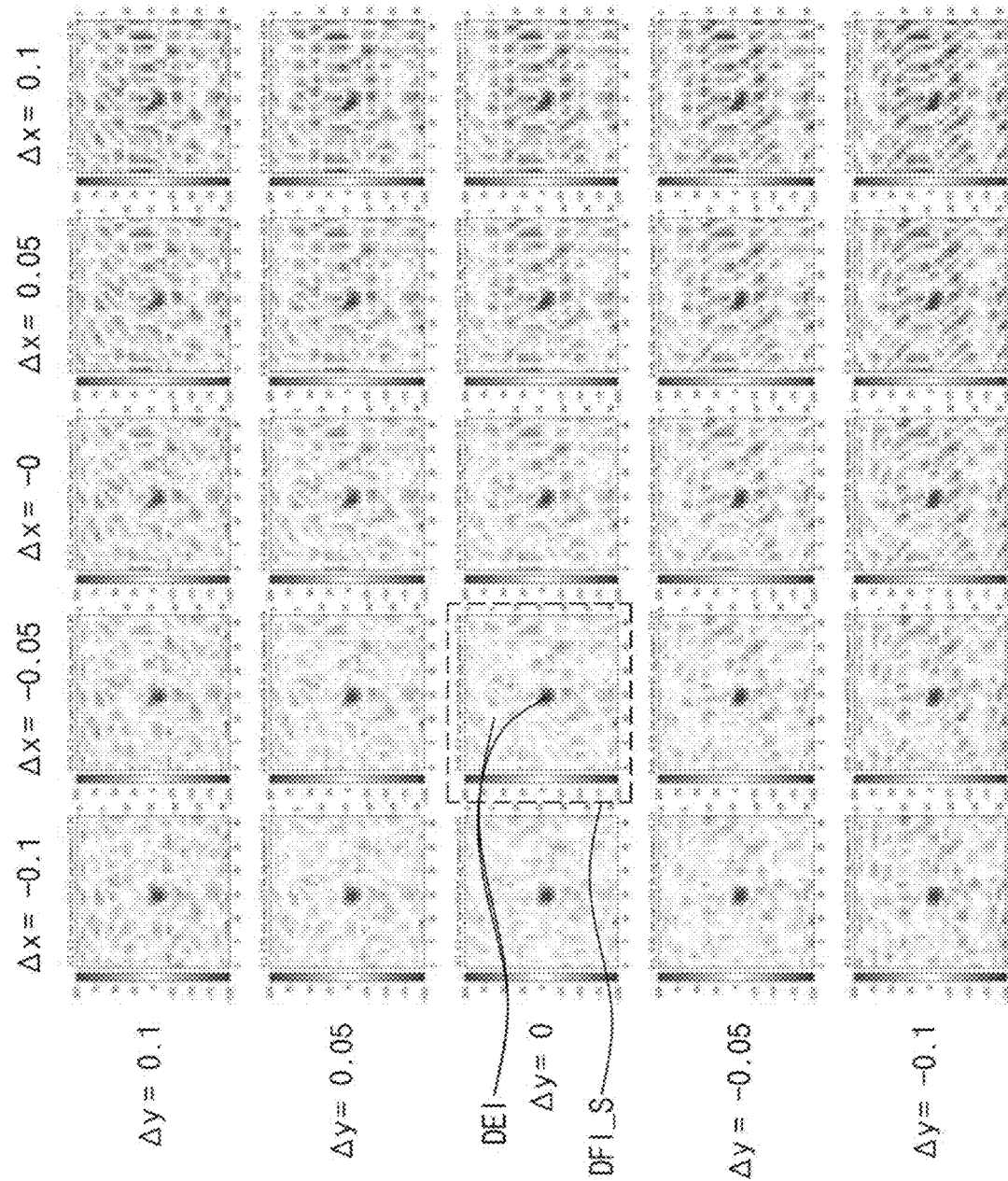
FIG. 12 is a diagram showing difference images (i.e., differences between reference and candidate images) obtained by changing a shifted displacement of a reference image, according to an embodiment.

FIG. 12 is a diagram showing difference images (i.e., differences between reference and candidate images) obtained by changing a shifted displacement of a reference image, according to an embodiment. Referring to FIGS. 2 and 12, Δx represents an amount of a shift of the second pattern image PTI2 in the second direction D2, and Δy represents an amount of a shift of the second pattern image PTI2 in the first direction D1. For example, Δx=1 means a width of the pixel PX in the second direction D2, and Δy=1 means a width of the pixel PX in the first direction D1. As shown in FIG. 12, the second pattern image PTI2 may be finely shifted by setting each of the shifts Δx and Δy to 0.05 or 0.1. This is due to the afore-described super resolution imaging process.

As shown in FIG. 12, 25 difference images DFI, showing a difference between the candidate image CAI and the shifted reference image REI, may be produced. Several difference images DFI may be produced depending on values of each of Δx and Δy. From the obtained difference images DFI, one difference image DFI may be chosen such that it has the smallest difference between the candidate and reference images CAI and REI (in S140). For example, the difference image DFI, which is created when the reference image REI maximally coincide with the candidate image CAI, may be chosen as an optimized difference image DFI_S. According to an embodiment, the difference image DFI at Δy=0 and Δx=−0.05 may be chosen as the optimized difference image DFI_S.

By analyzing a difference signal of the optimized difference image DFI_S, it may be possible to find whether there is a defect in the candidate image CAI. Because a definite defect image DEI solely exists (i.e., there is no noise image NOI) in the optimized difference image DFI_S of FIG. 12, it may be possible to easily find that a defect exists in the candidate image CAI.

The difference image DFI shown in FIG. 11 does clearly show that a defect exists in the candidate image CAI, but it may be difficult to determine the kind of the defect from the difference image DFI of FIG. 11. The inspection method according to an embodiment may provide an additional operation of determining a kind of a defect in the defect image DEI of the difference image DFI.

Figure 13:
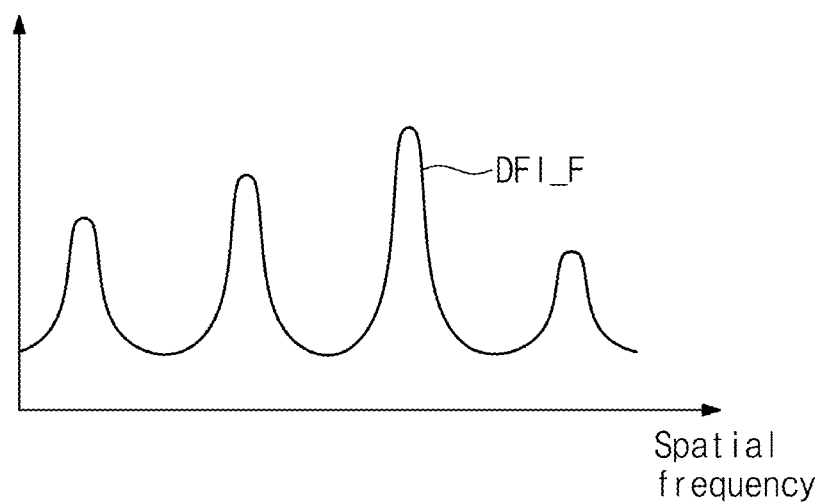
FIG. 13 is a graph obtained by transforming the difference image of FIG. 11 to a spatial frequency domain.
Figure 14:
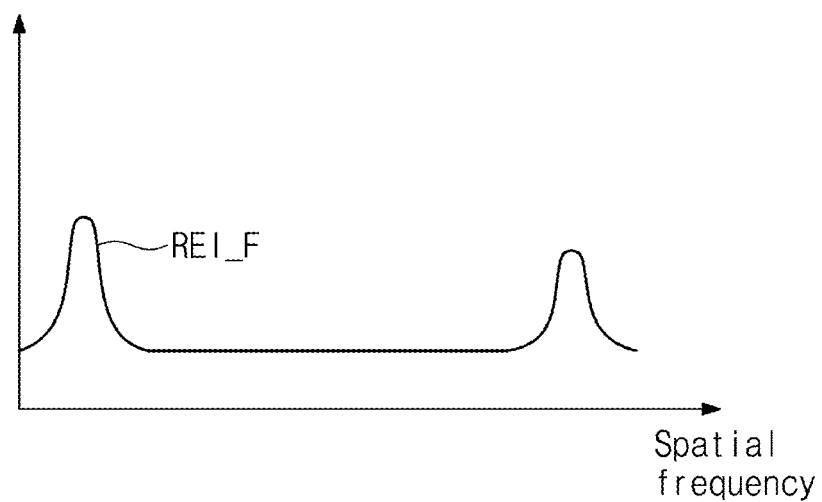
FIG. 14 is a graph obtained by transforming the reference image of FIG. 9 to a spatial frequency domain.
Figure 15:
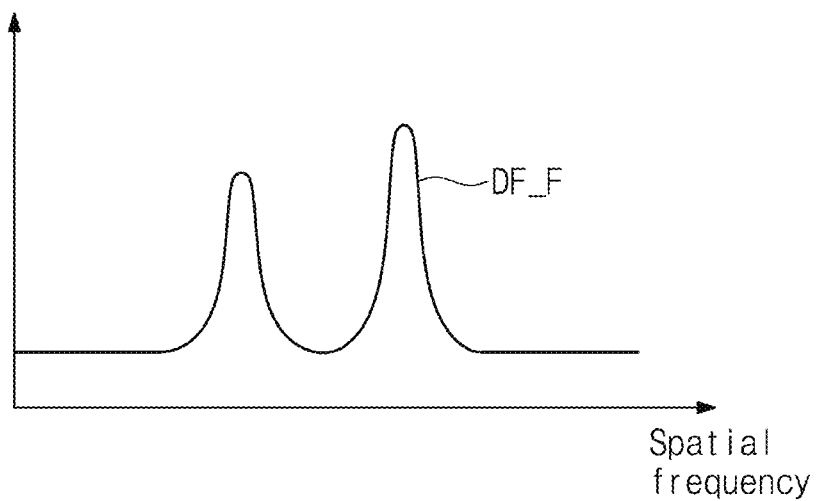
FIG. 15 is a graph obtained by removing a spatial frequency component of FIG. 14 from a spatial frequency component of FIG. 13.
Figure 16:
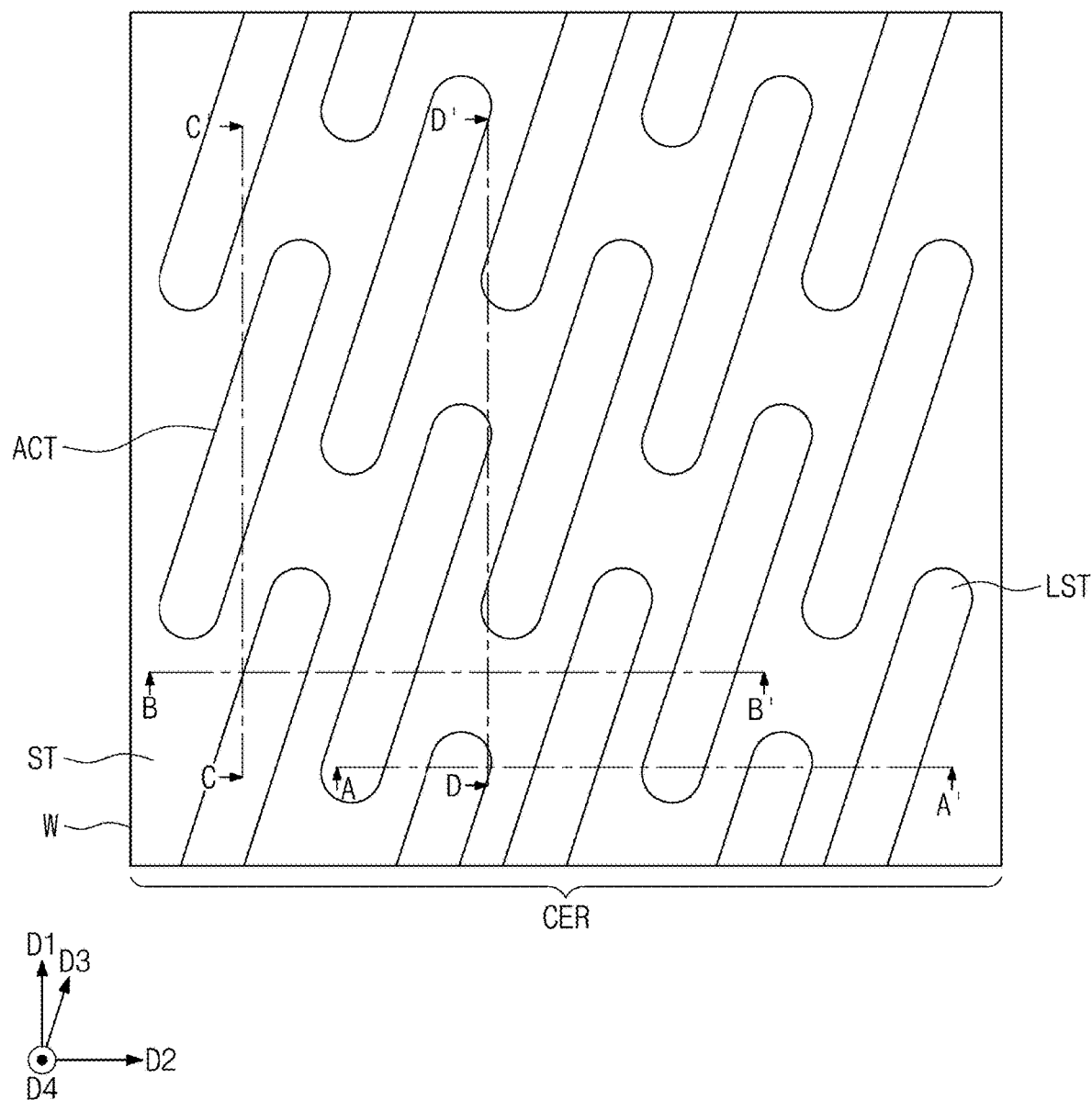
FIGS. 16, 18, 20, 22, 24, 26, 28, and 30 are plan views illustrating a method of fabricating a semiconductor device, according to an embodiment.
Figure 17A:
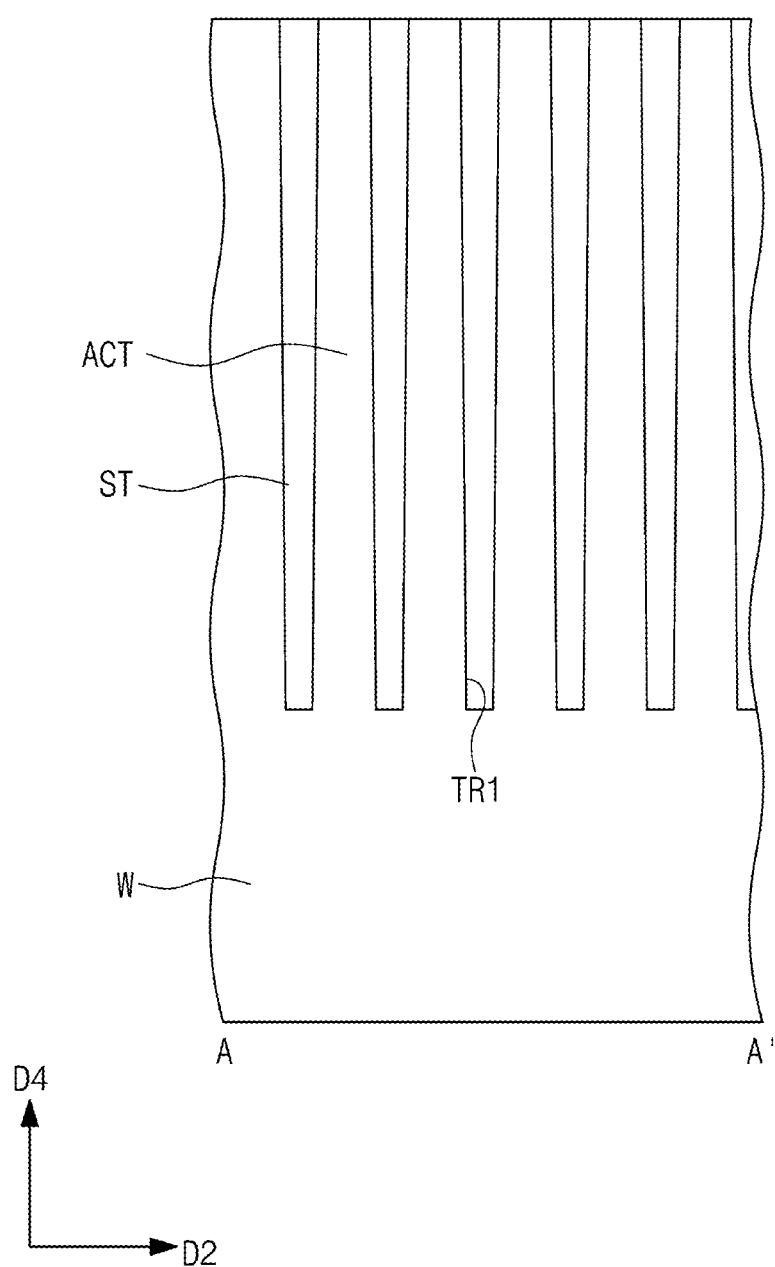
FIGS. 17A, 19A, 21A, 23A, 25A, 27A, 29A, and 31A are sectional views taken along lines A-A' of FIGS. 16, 18, 20, 22, 24, 26, 28, and 30, respectively.
Figure 17B:
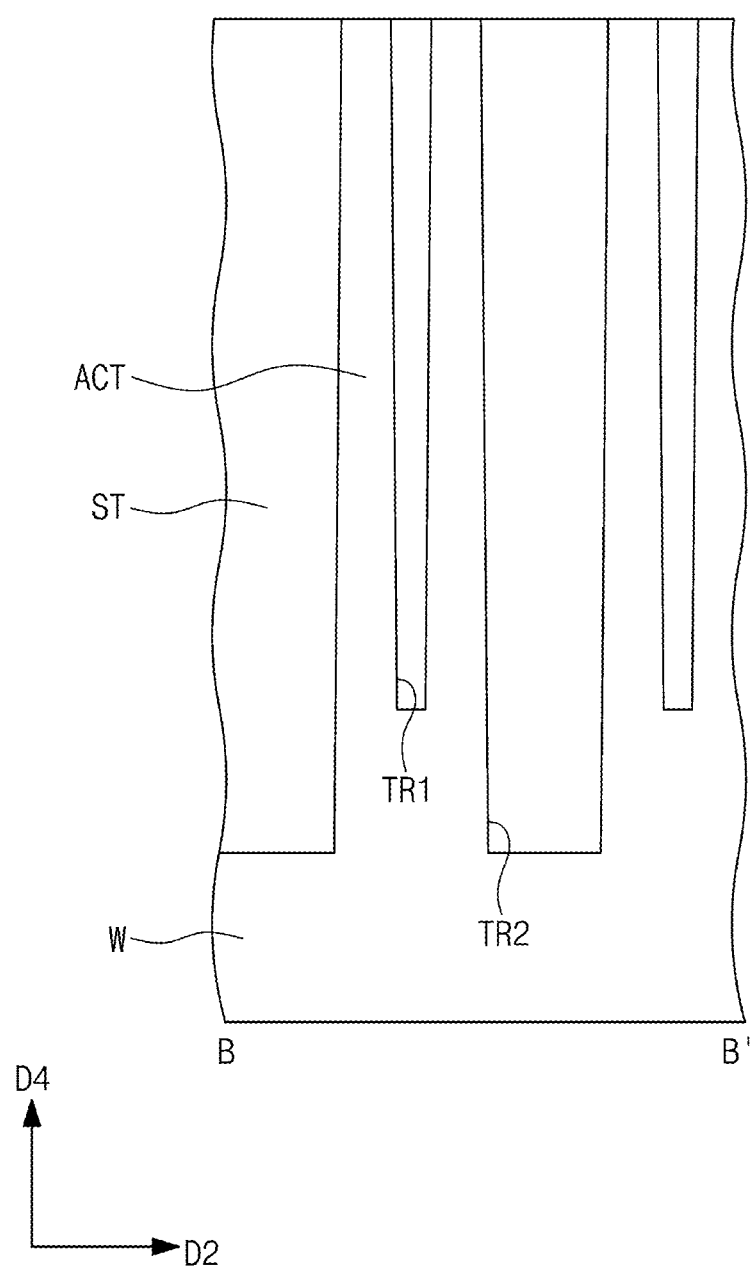
FIGS. 17B, 19B, 21B, 23B, 25B, 27B, 29B, and 31B are sectional views taken along liens B-B' of FIGS. 16, 18, 20, 22, 24, 26, 28, and 30, respectively.
Figure 17C:
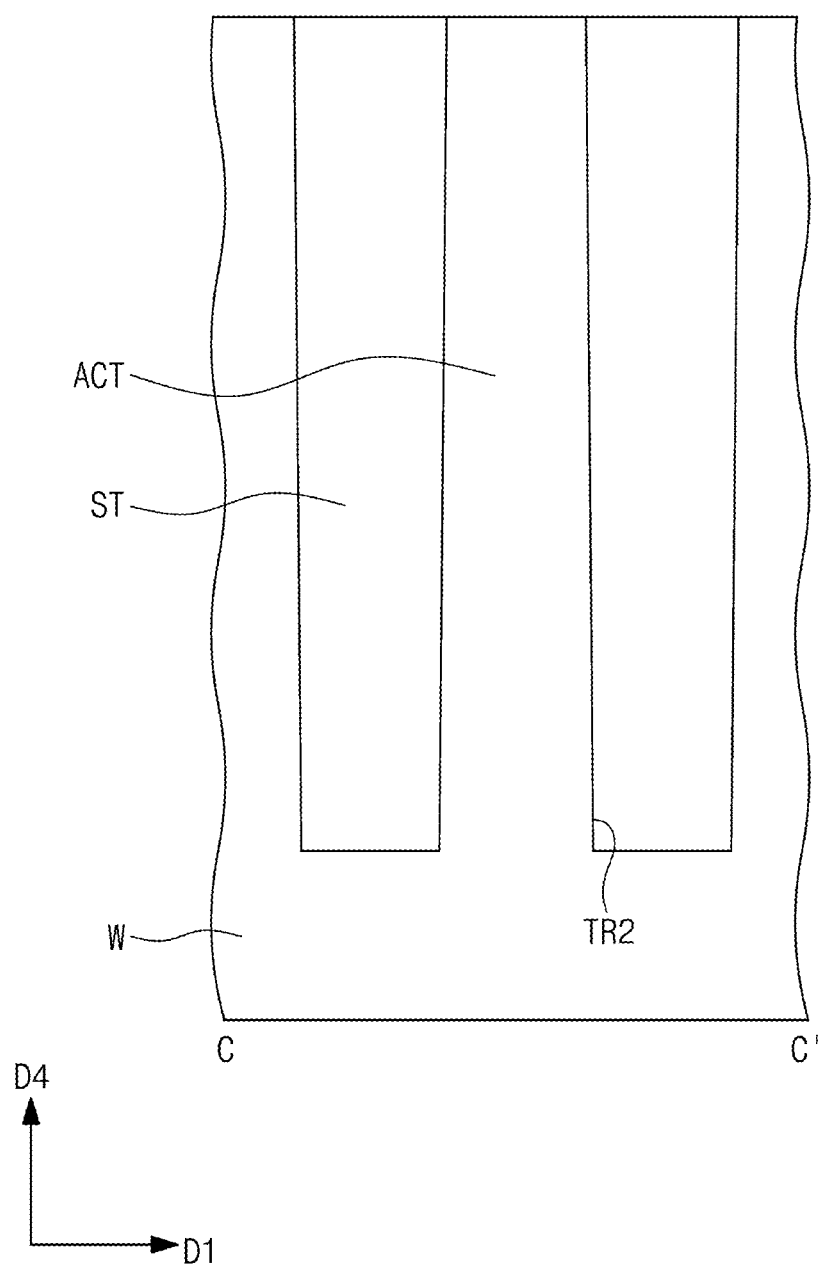
FIGS. 17C, 19C, 21C, 23C, 25C, 27C, 29C, and 31C are sectional views taken along lines C-C' of FIGS. 16, 18, 20, 22, 24, 26, 28, and 30, respectively.
Figure 17D:
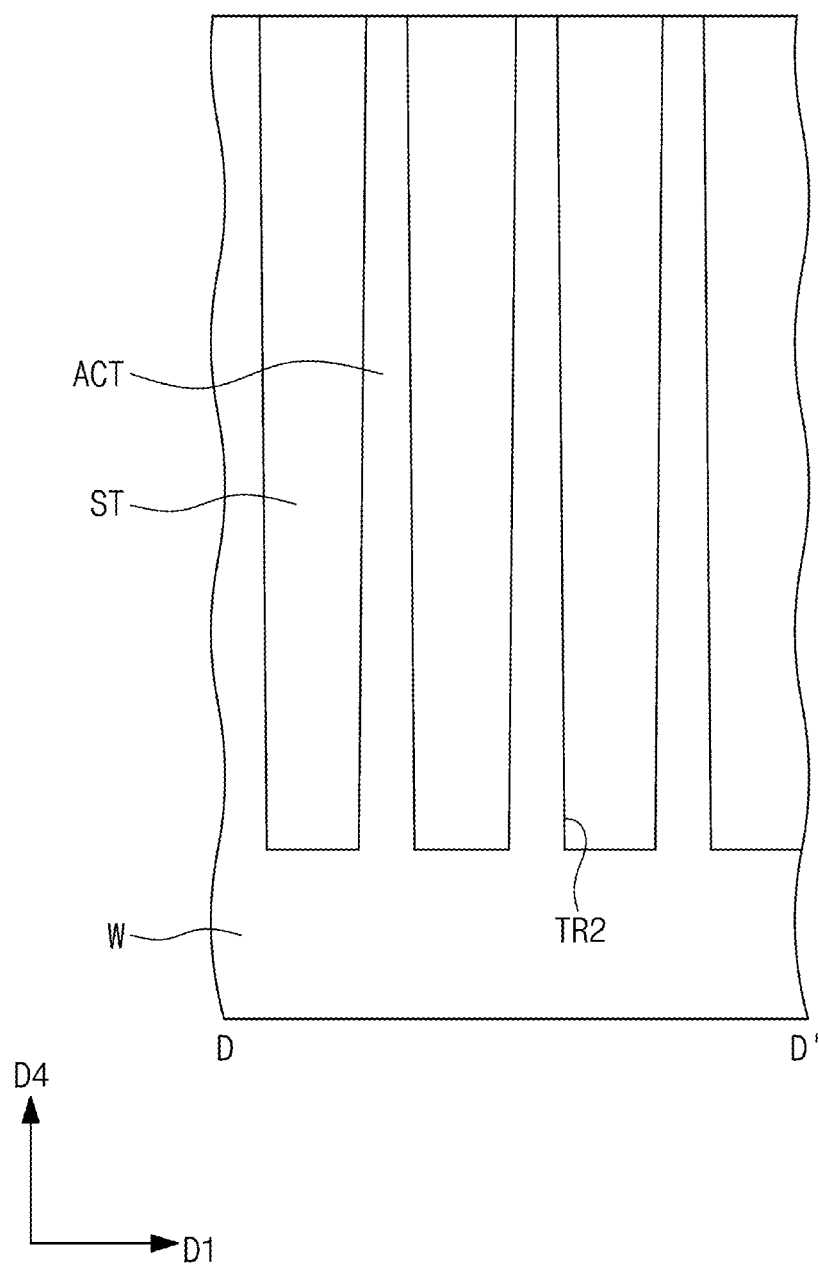
FIGS. 17D, 19D, 21D, 23D, 25D, 27D, 29D, and 31D are sectional views taken along lines D-D' of FIGS. 16, 18, 20, 22, 24, 26, 28, and 30, respectively.
Figure 18:
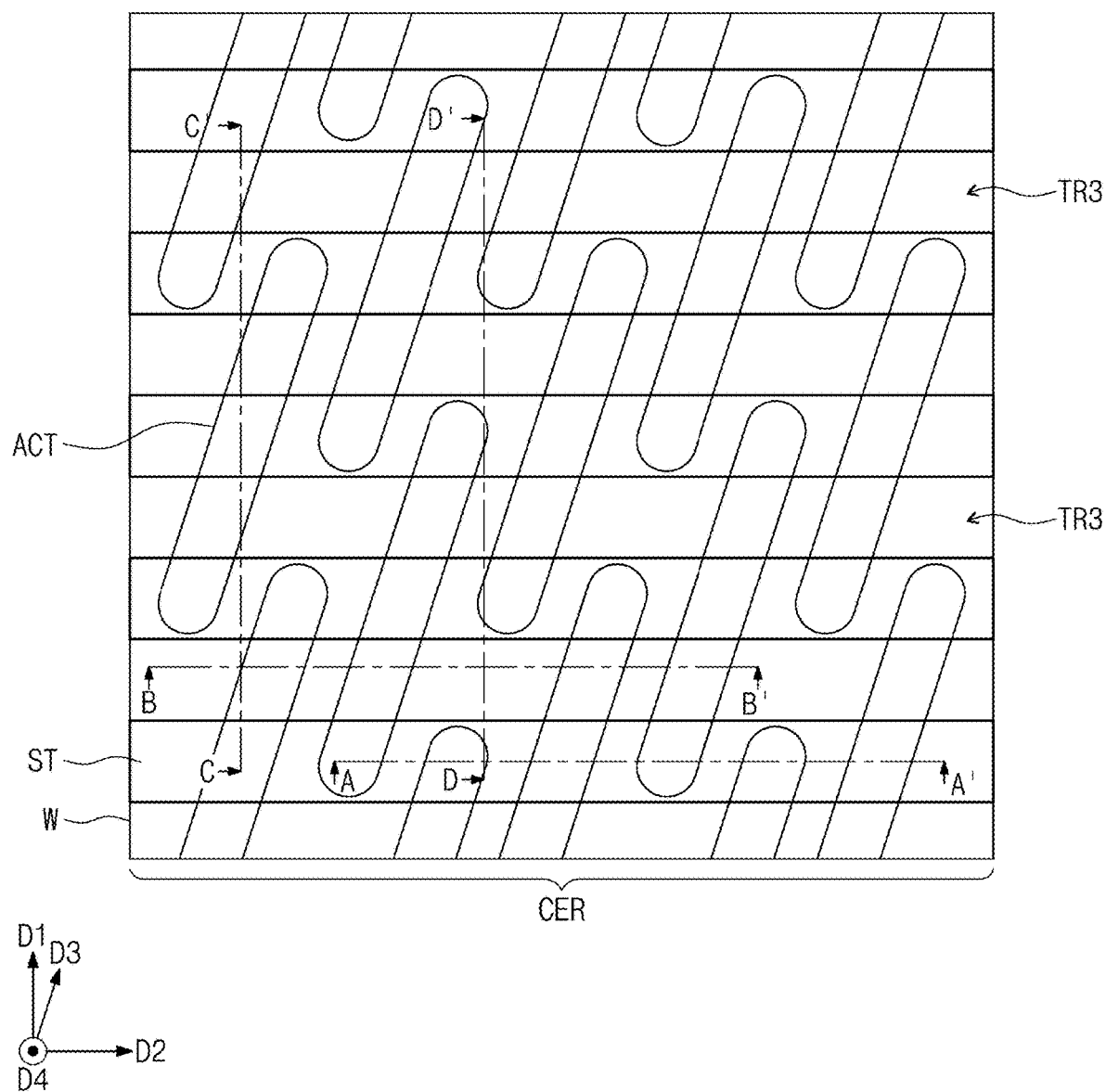
Figure 19A:
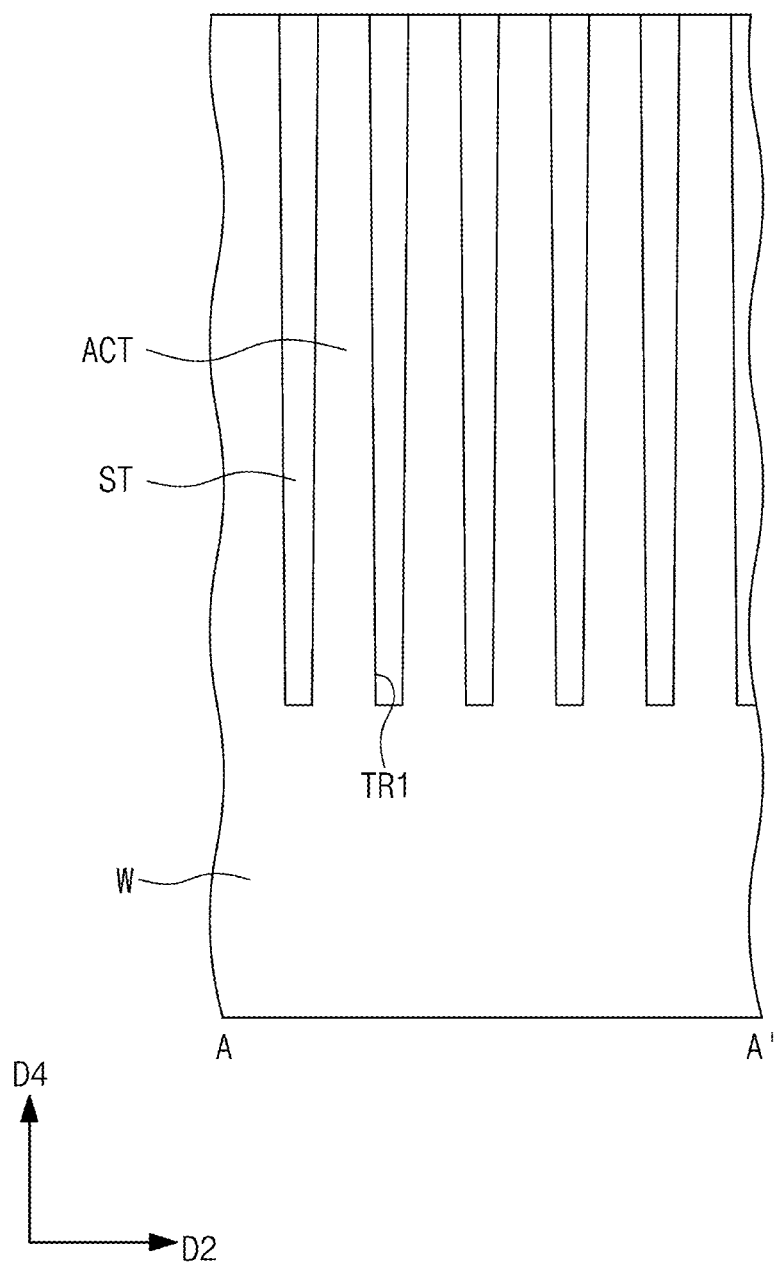
Figure 19B:
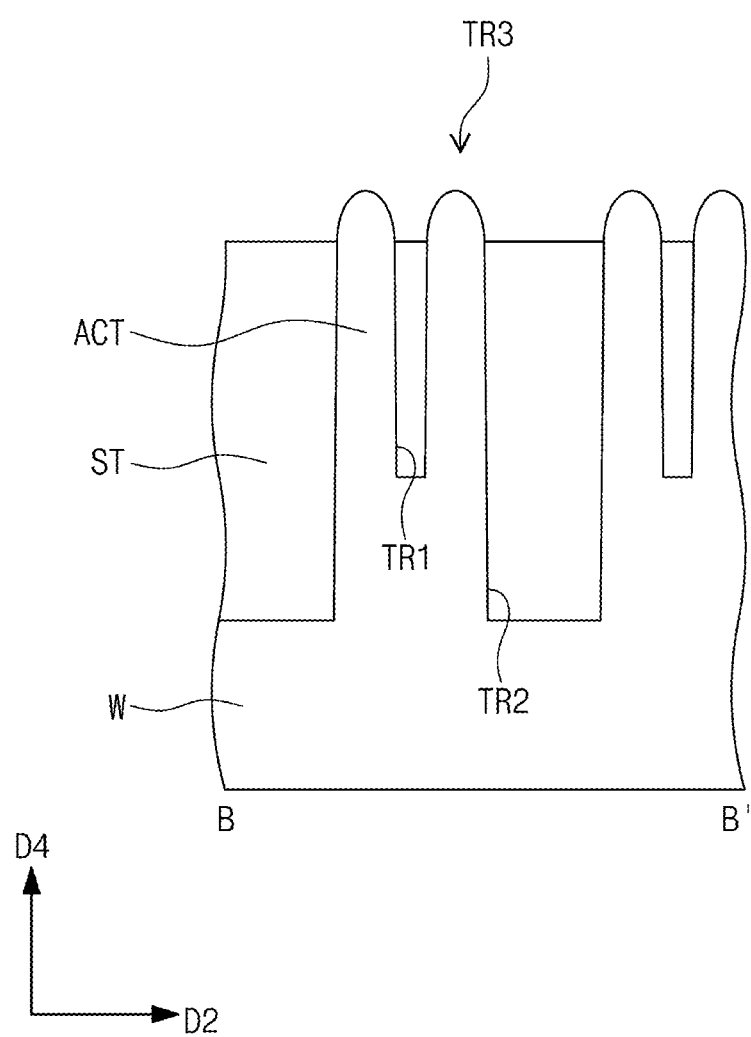
Figure 19C:
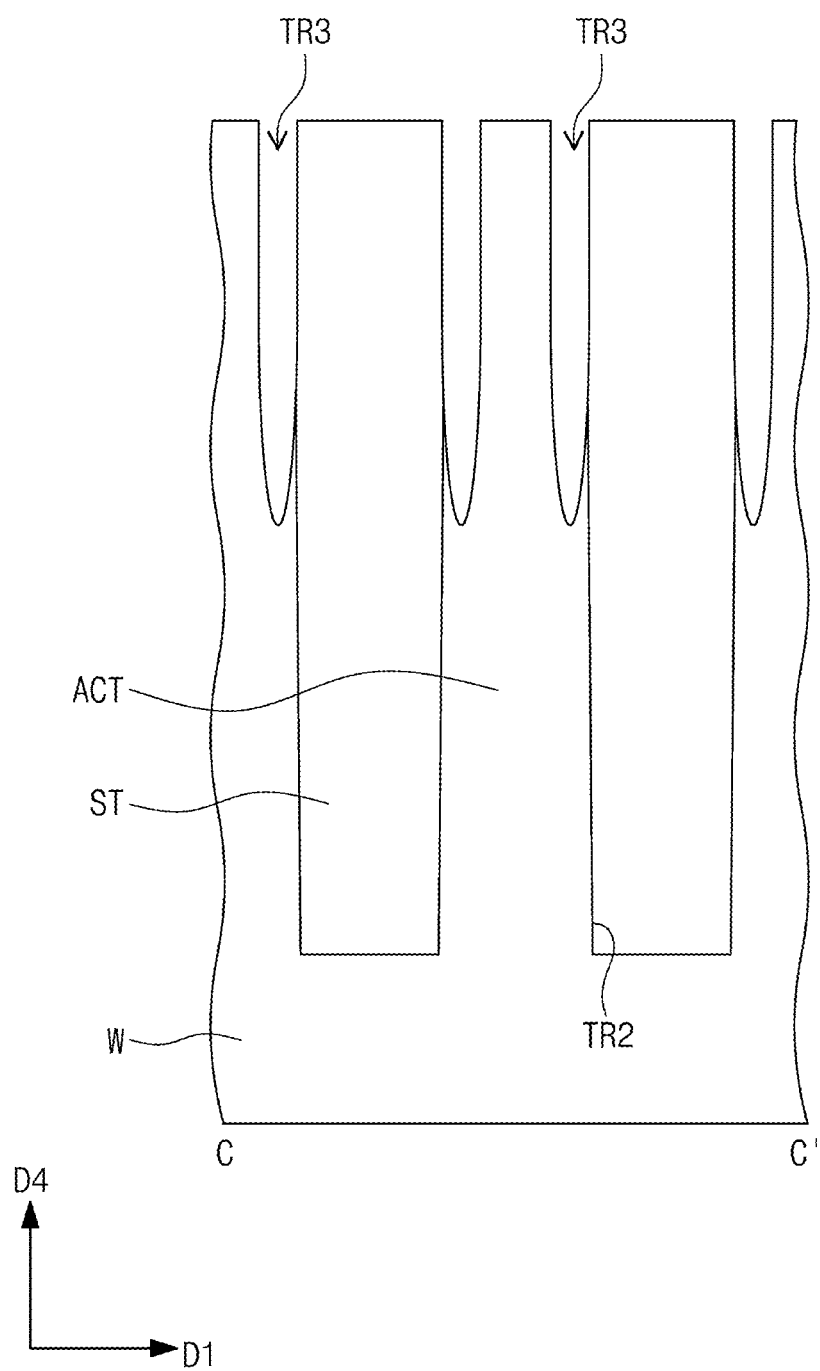
Figure 19D:
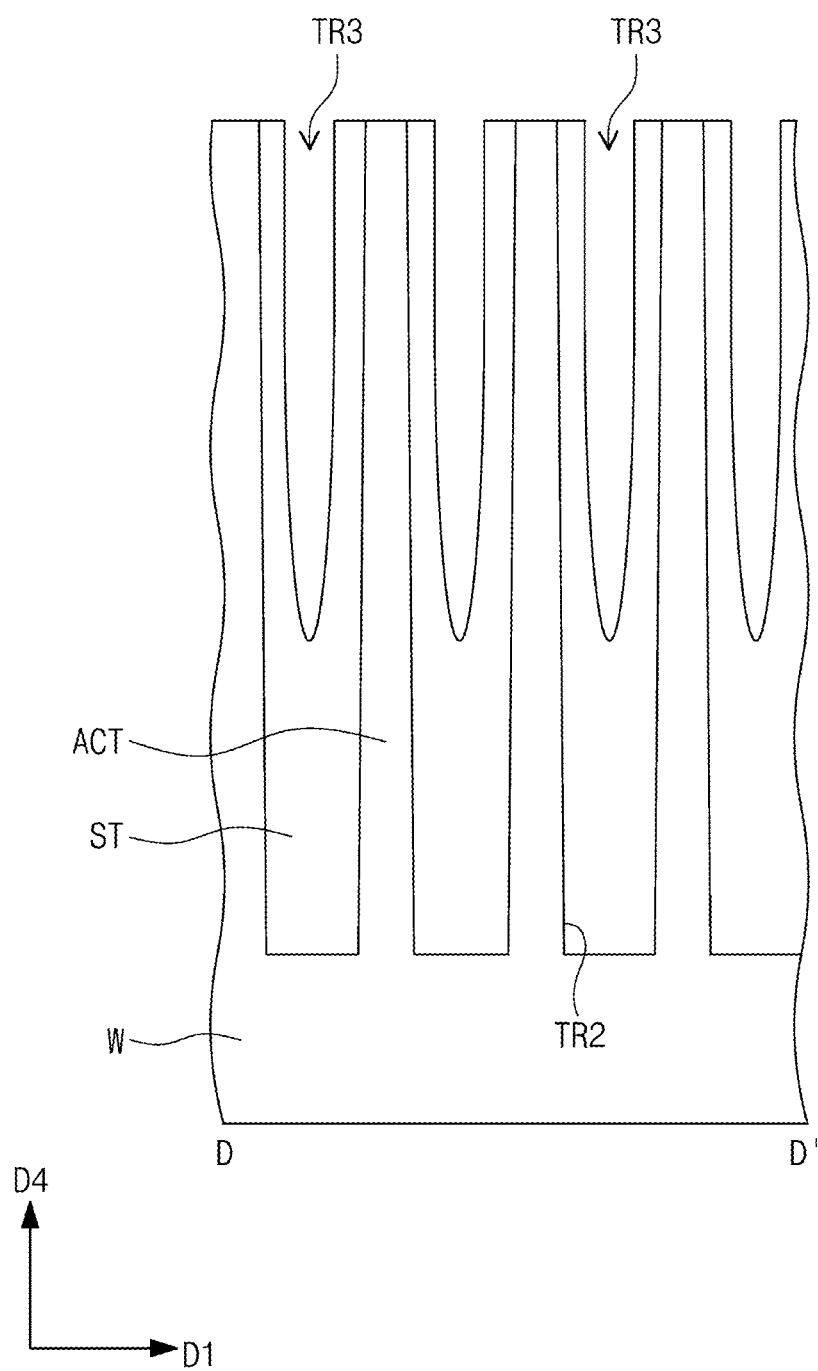
Figure 20:
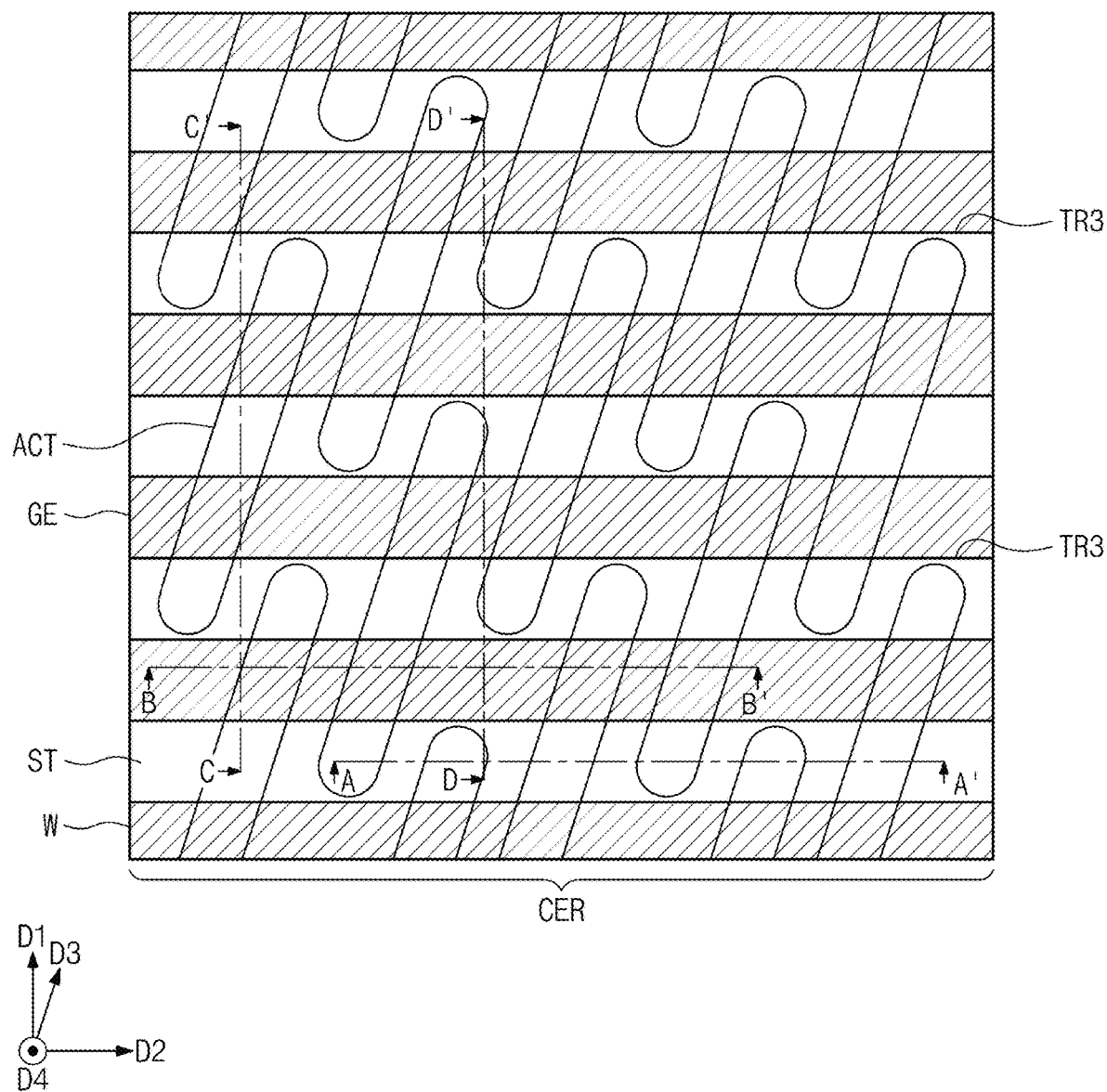
Figure 21A:
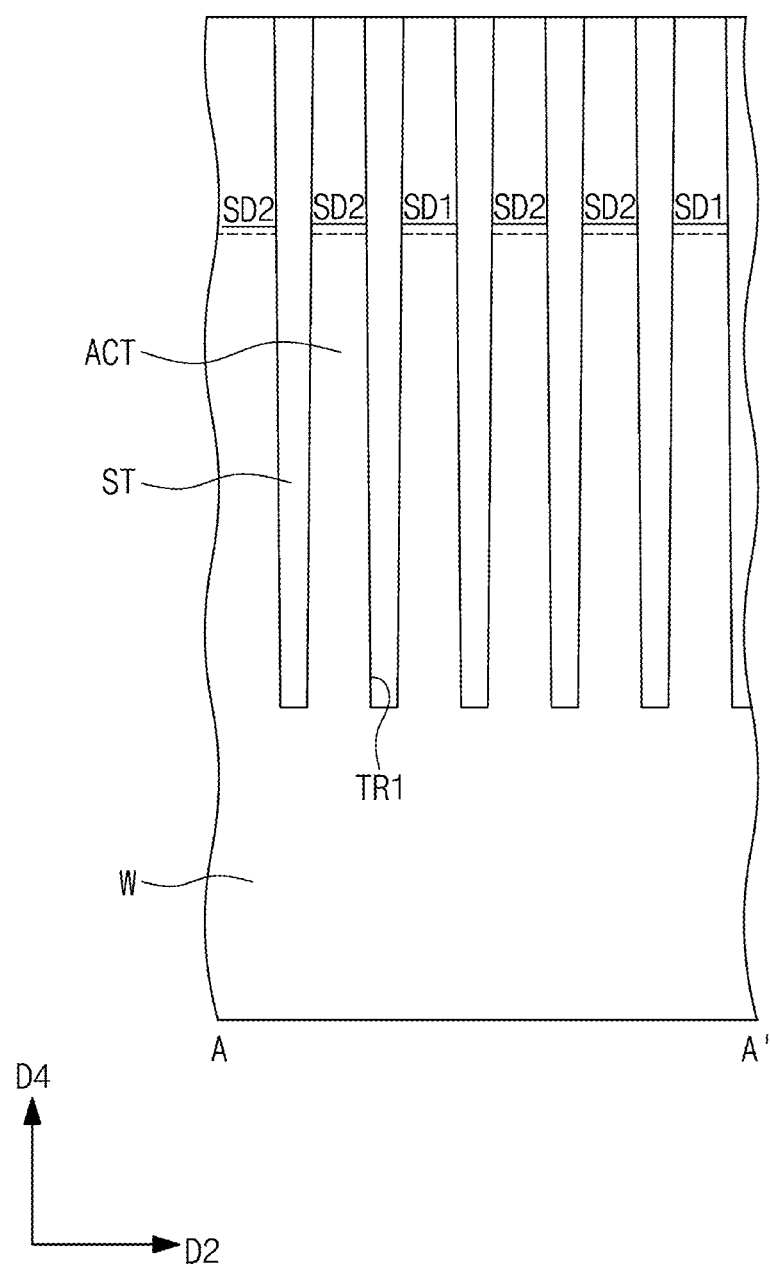
Figure 21B:
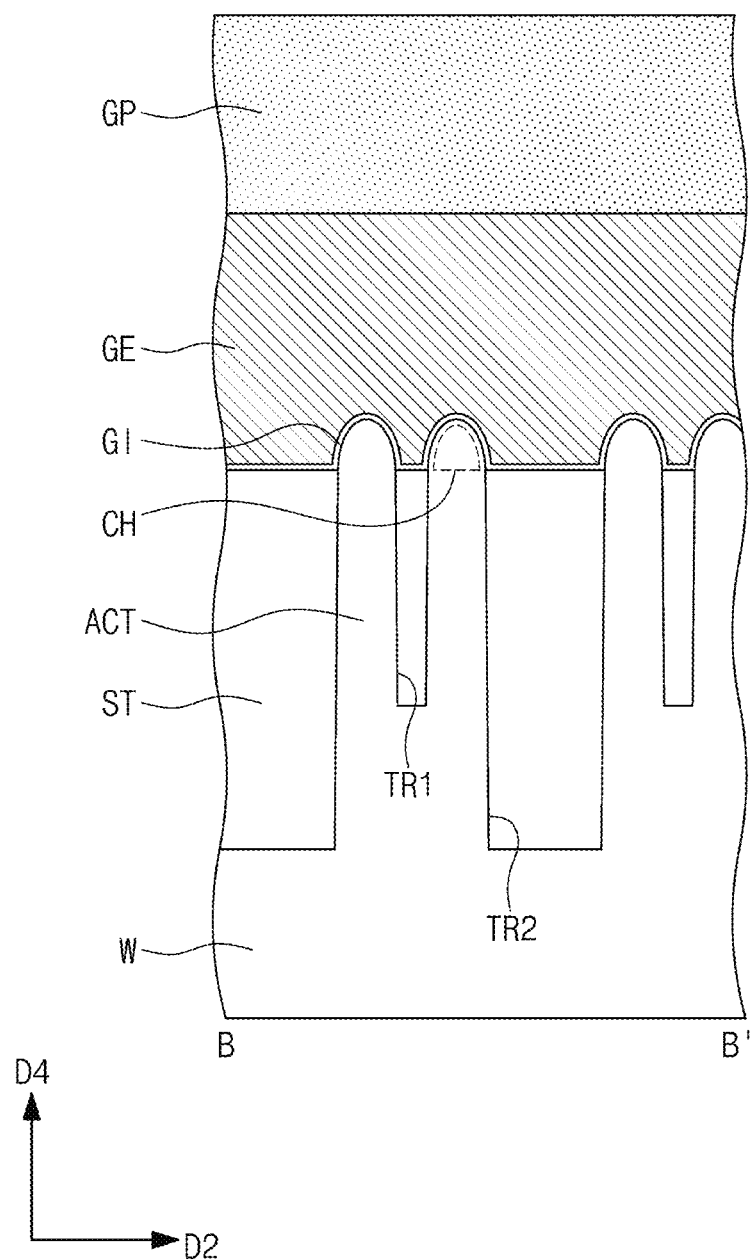
Figure 21C:
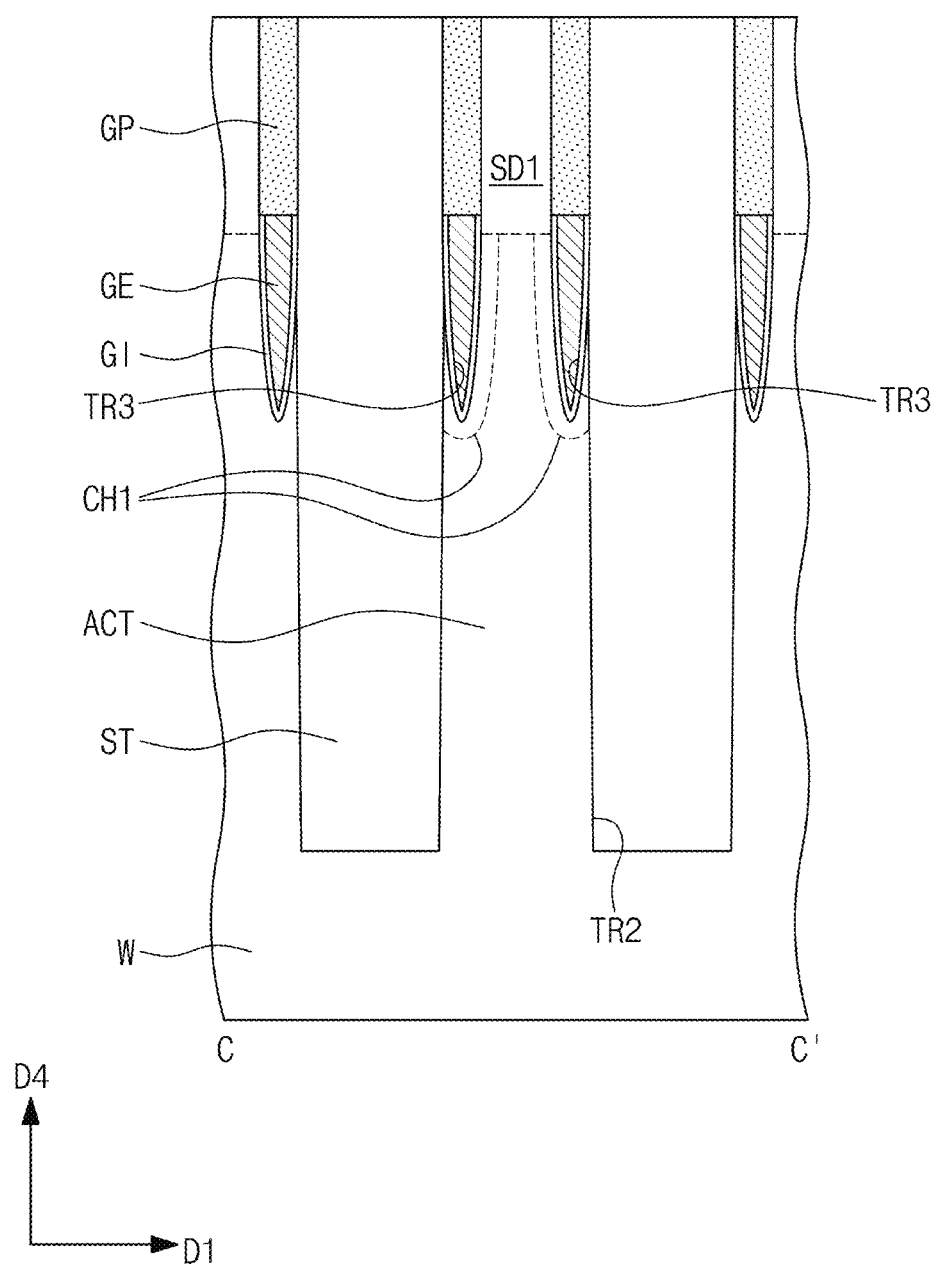
Figure 21D:
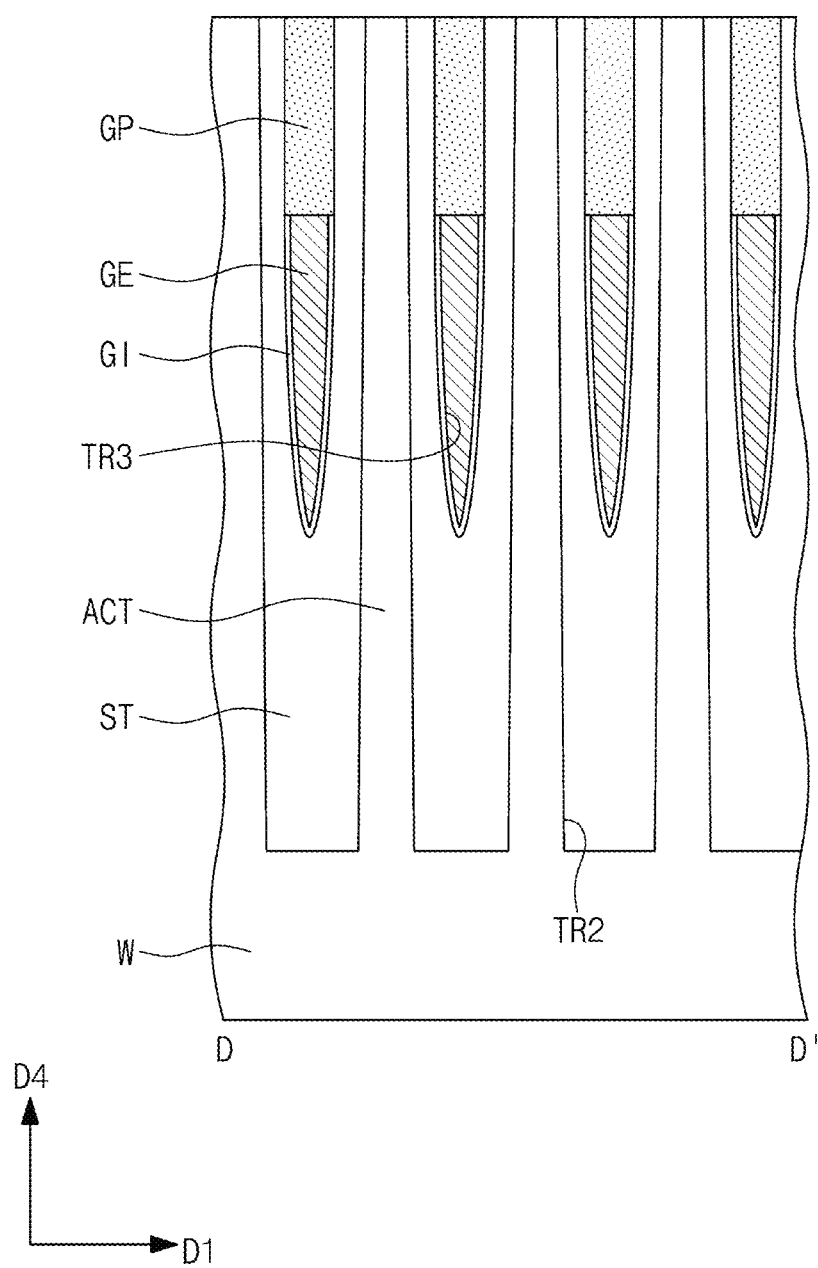
Figure 22:
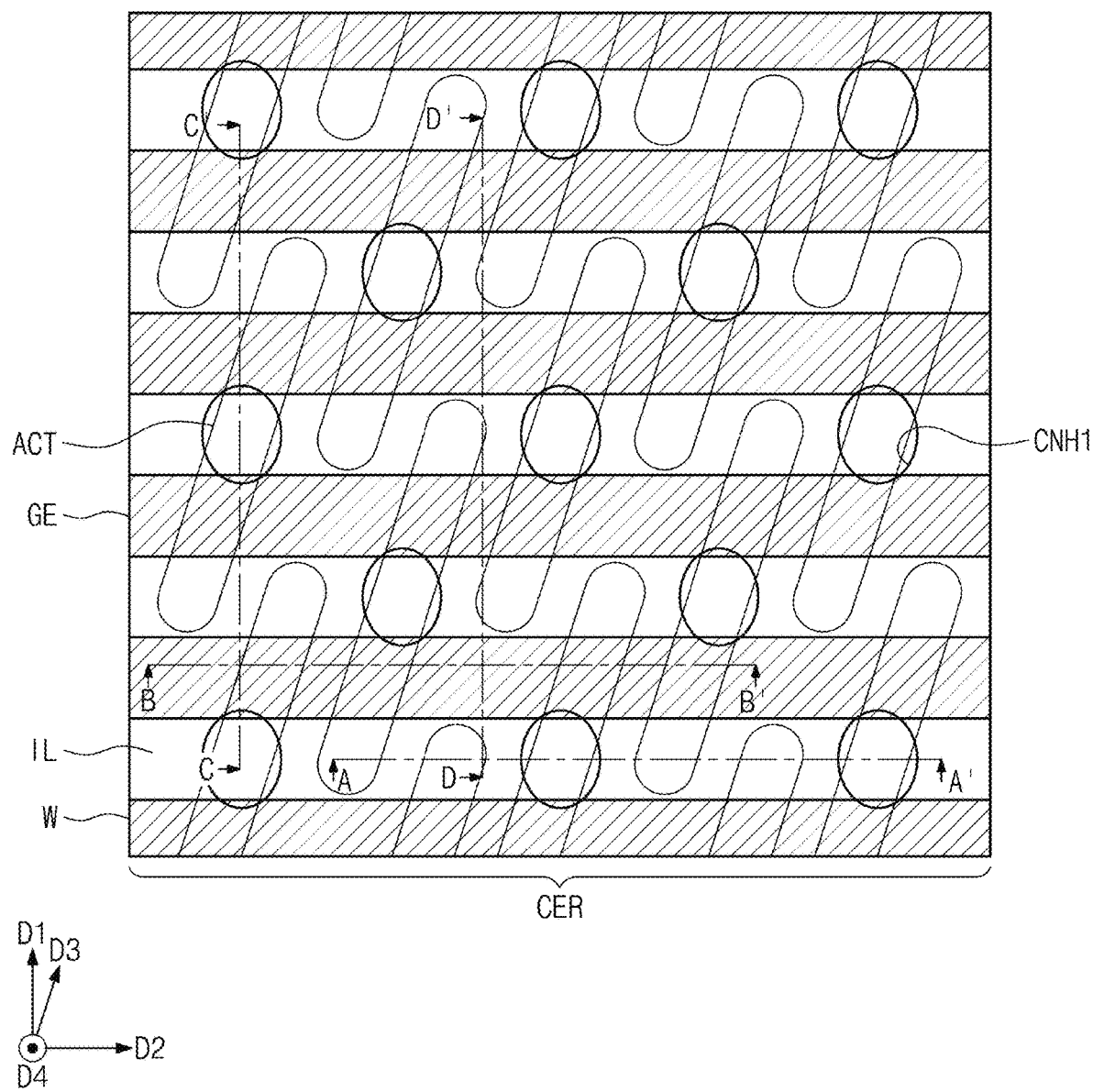
Figure 23A:
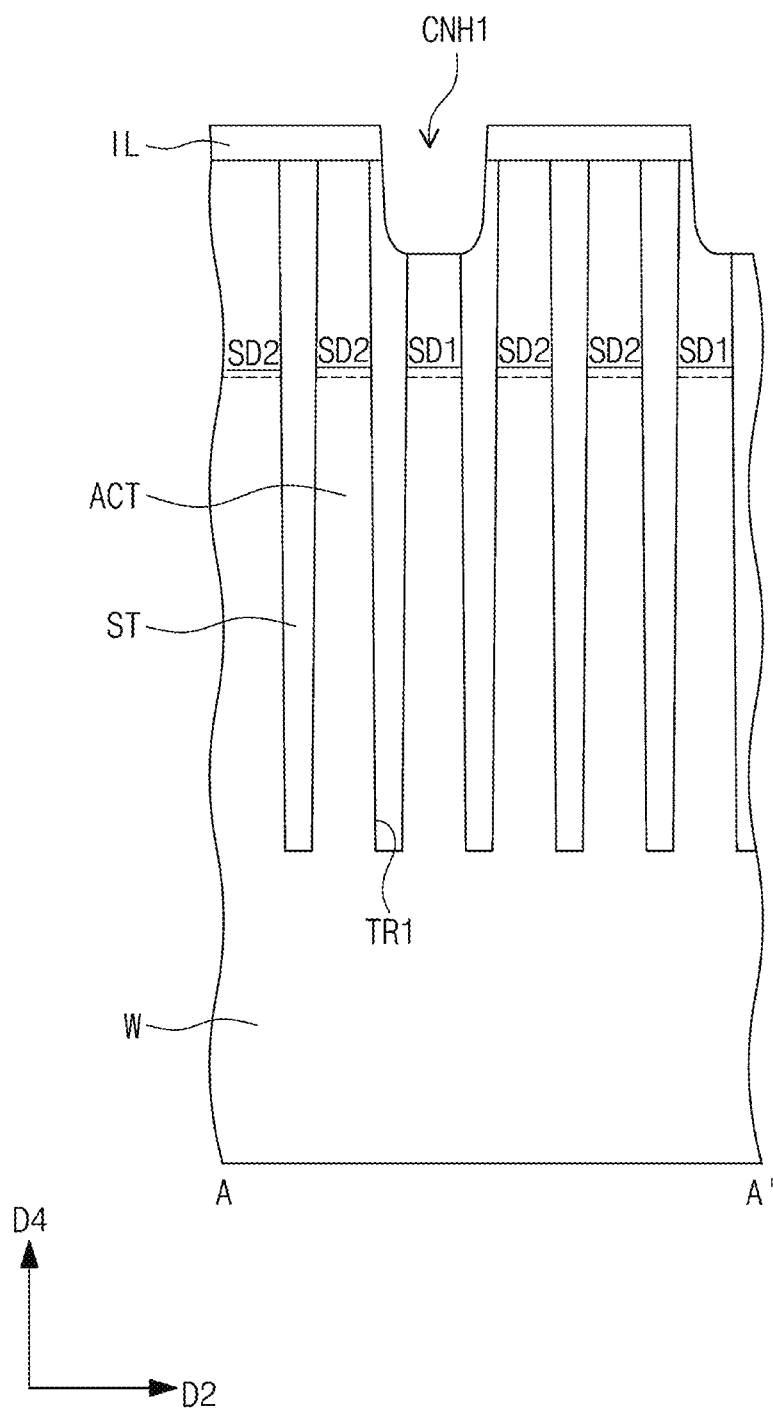
Figure 23B:
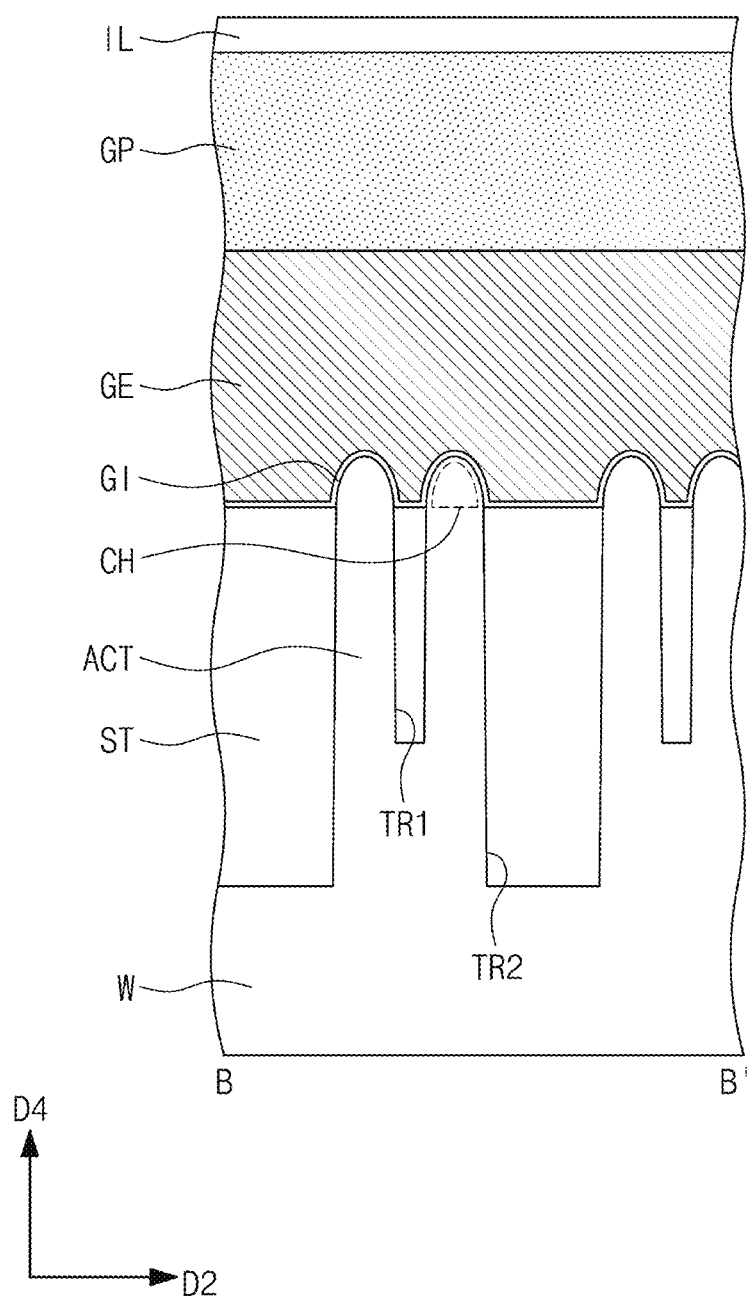
Figure 23C:
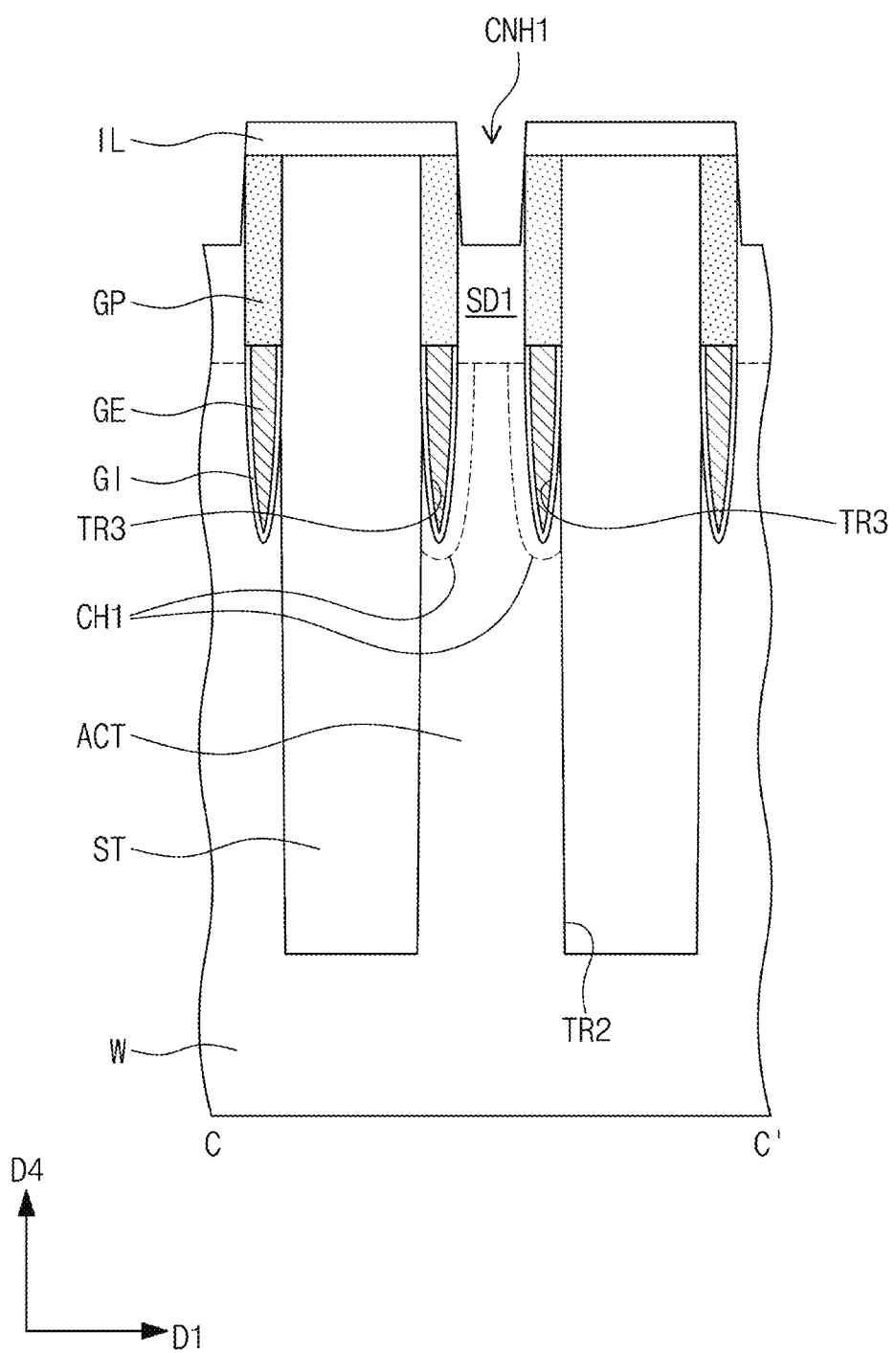
Figure 23D:
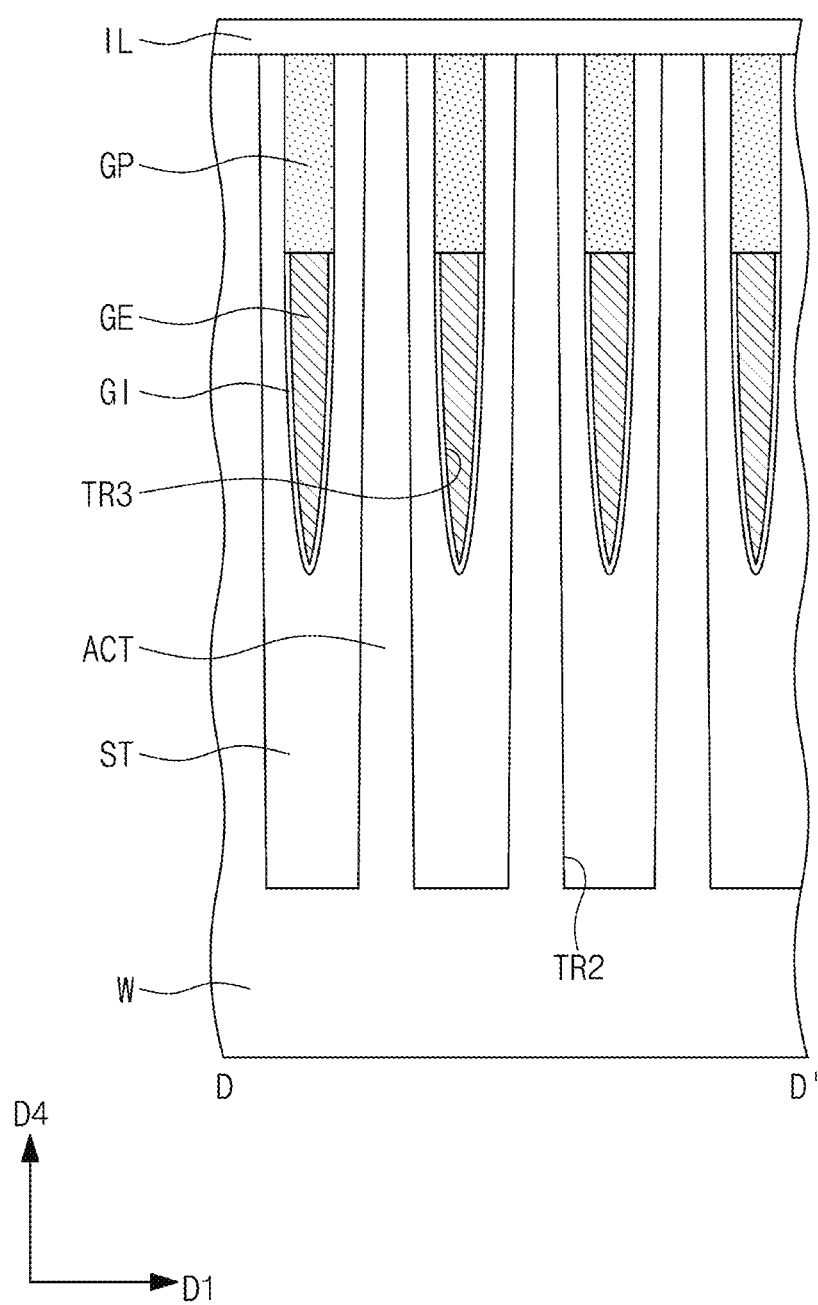
Figure 24:
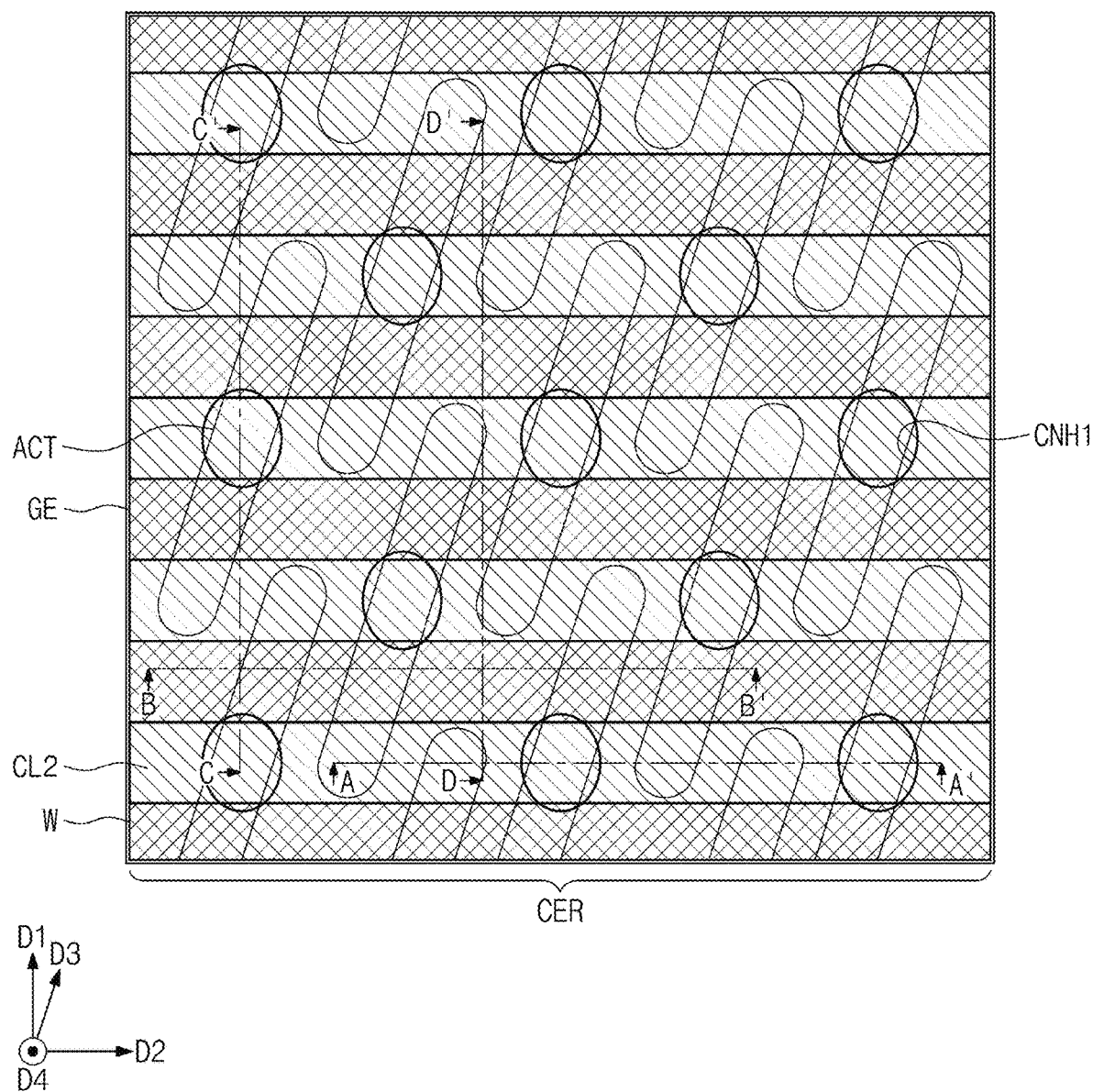
Figure 25A:
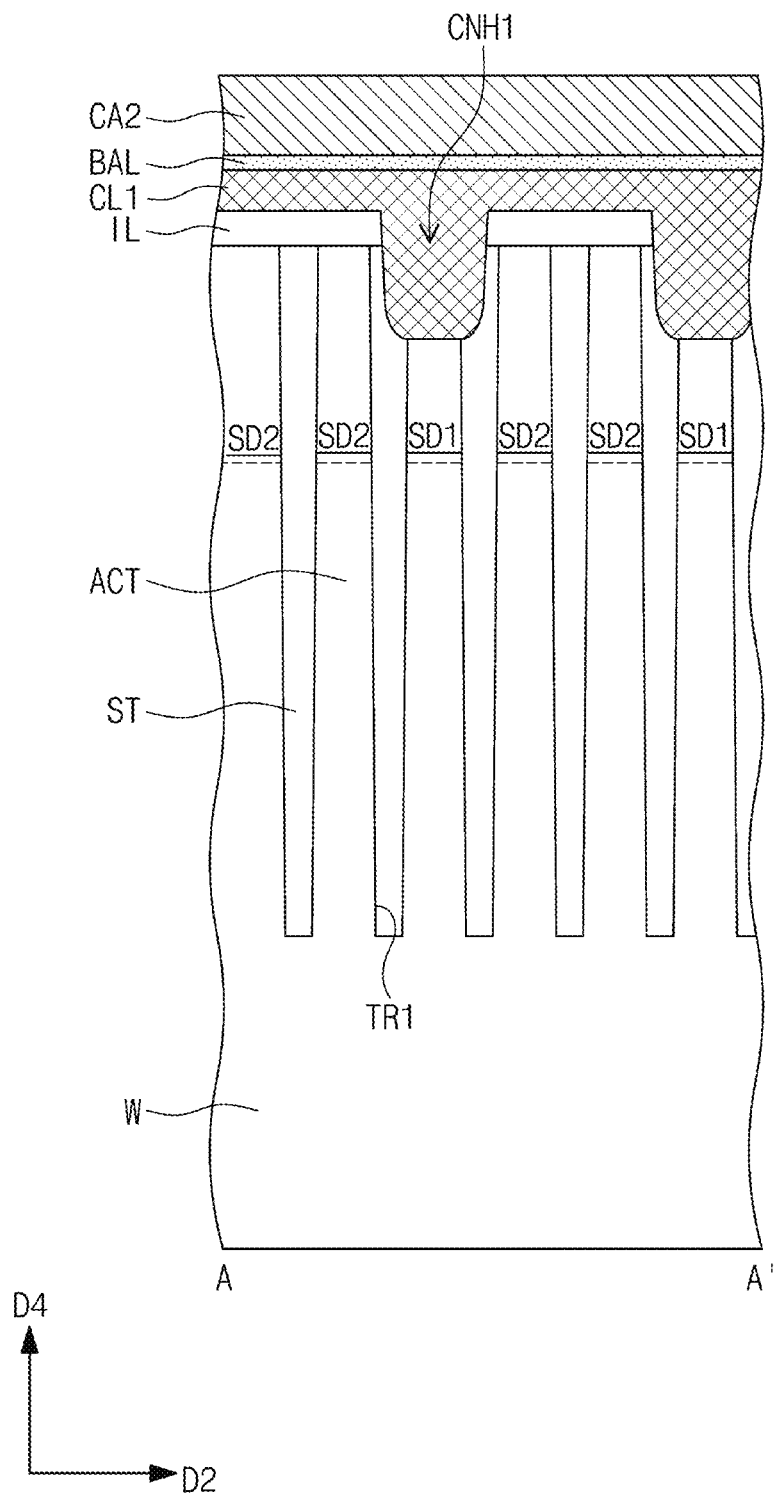
Figure 25B:
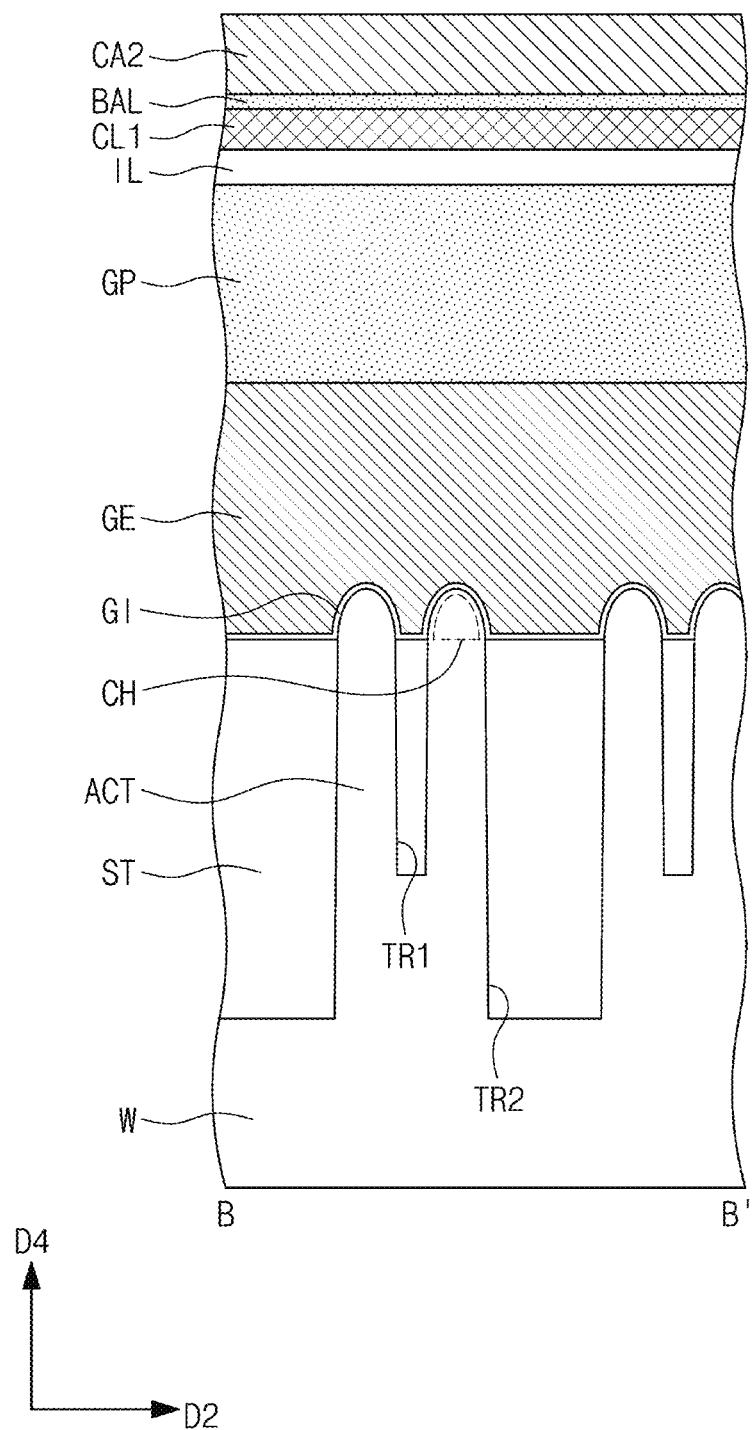
Figure 25C:
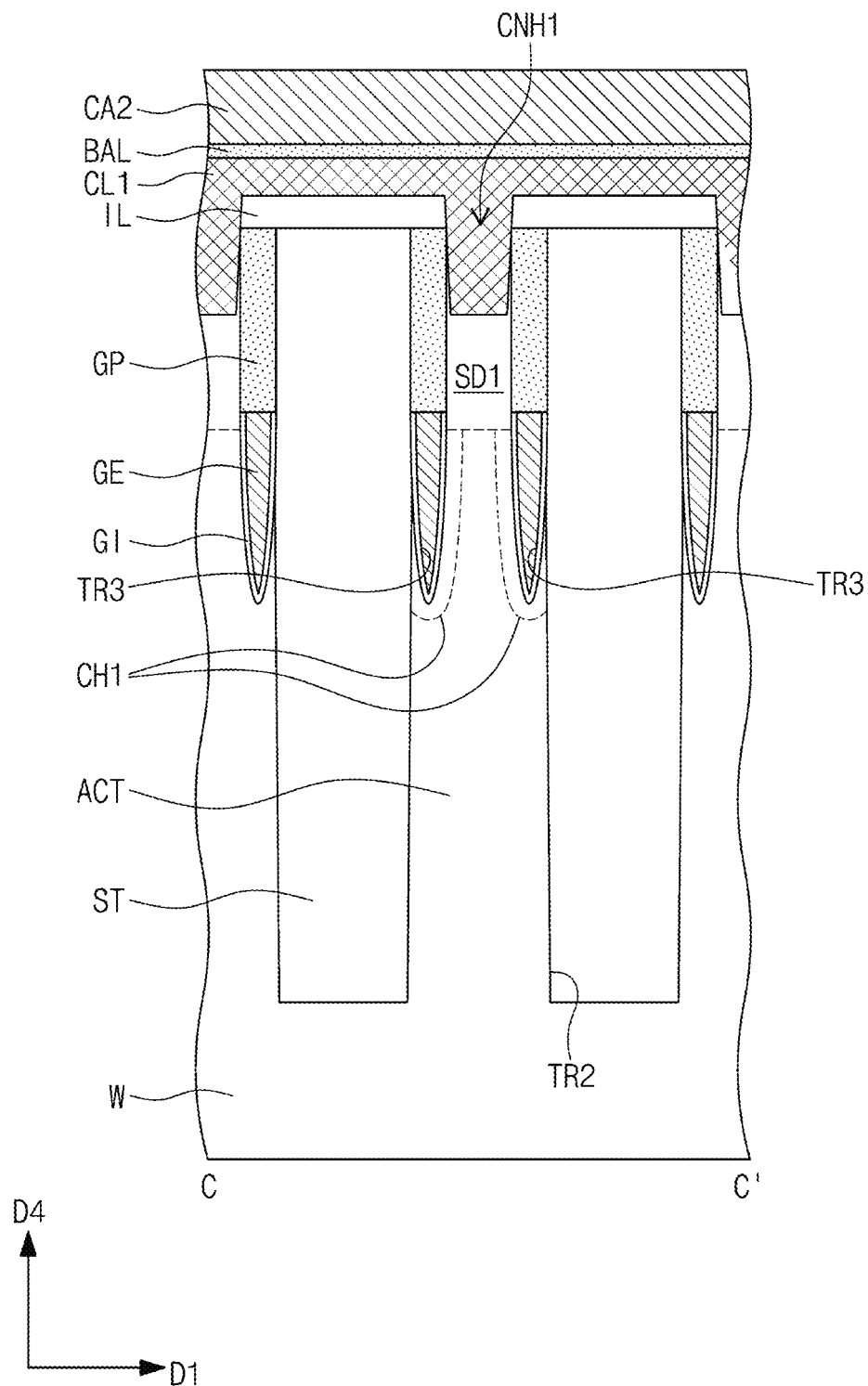
Figure 25D:
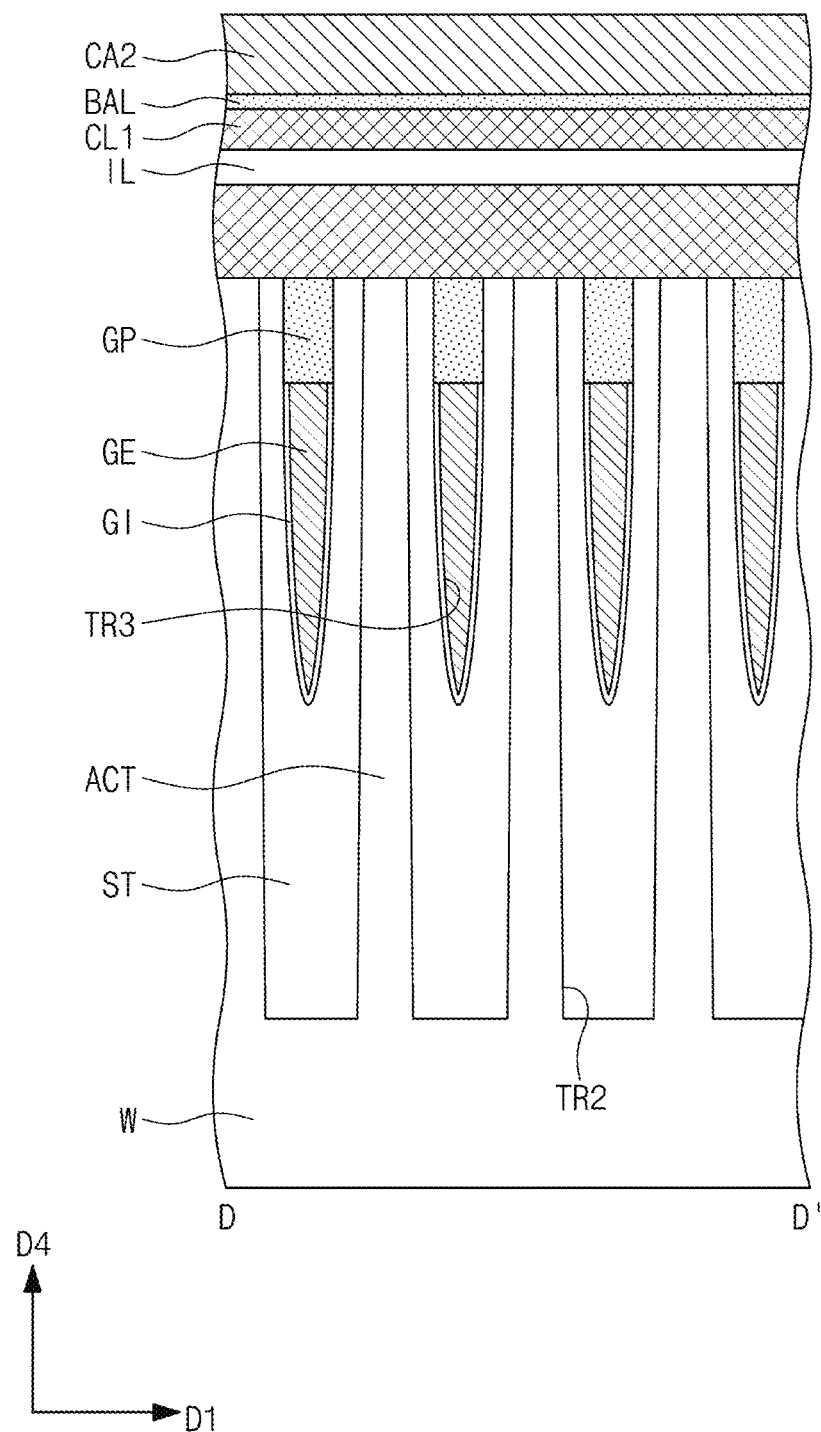
Figure 26:
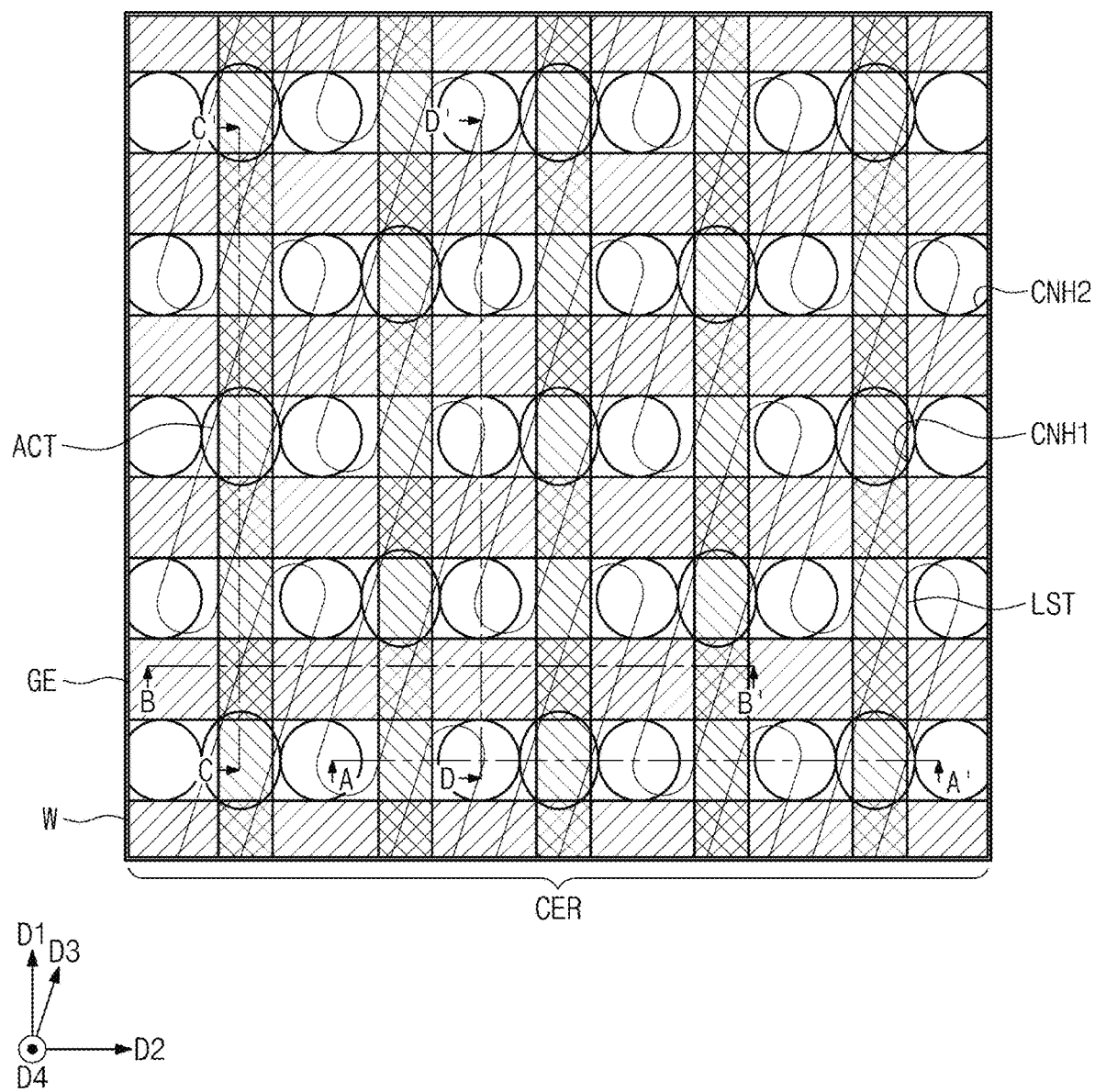
Figure 27A:
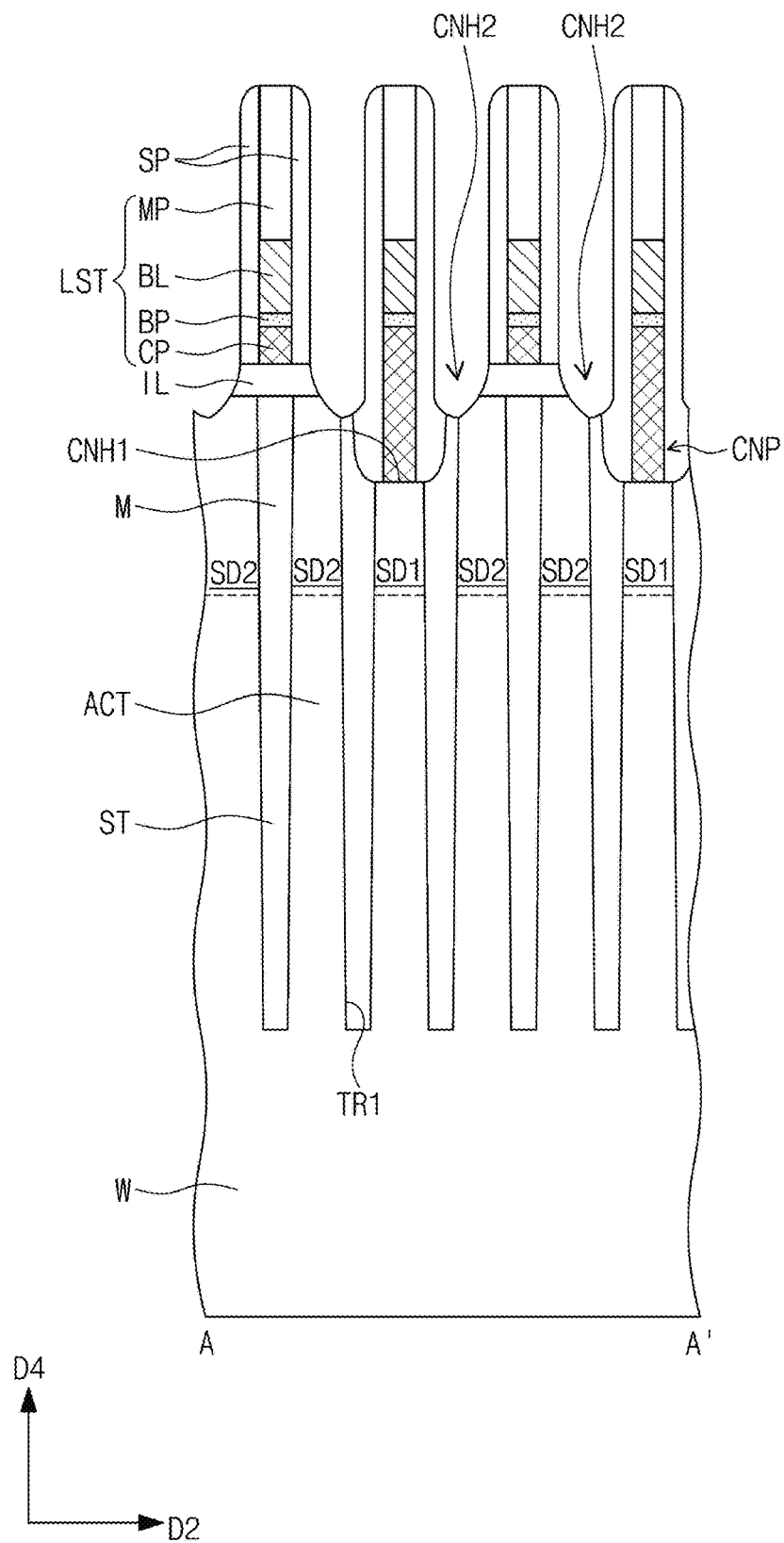
Figure 27B:
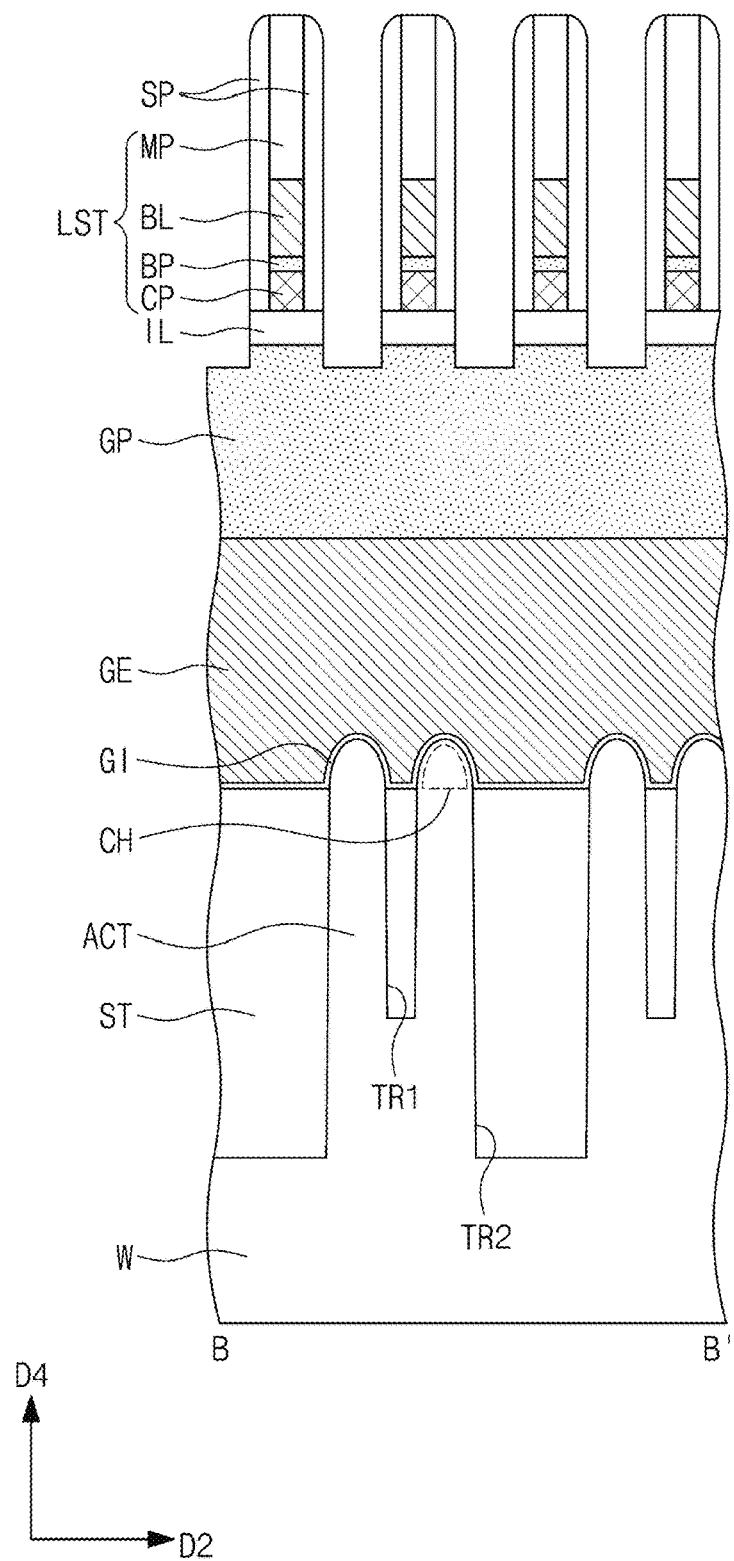
Figure 27C:
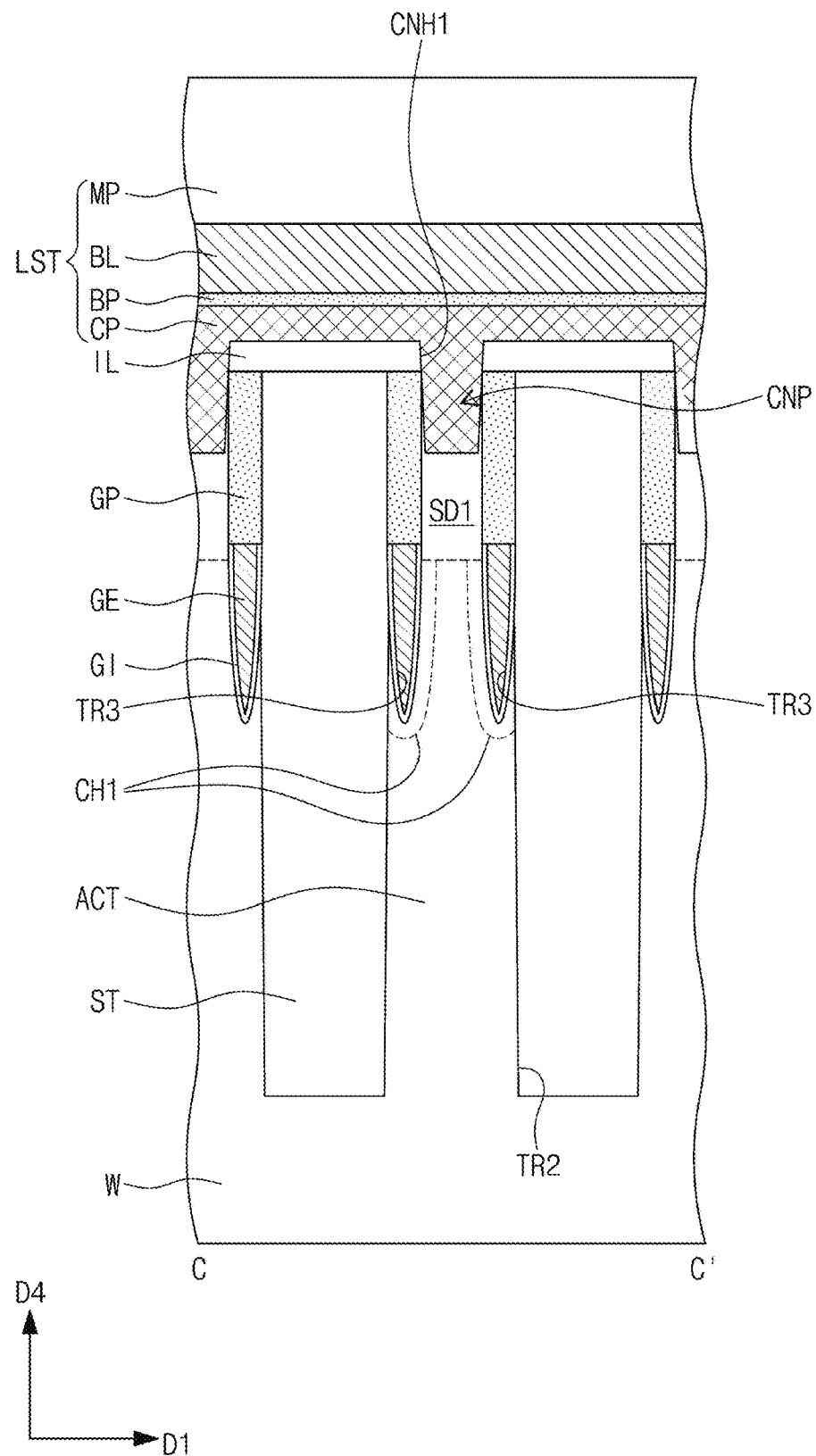
Figure 27D:
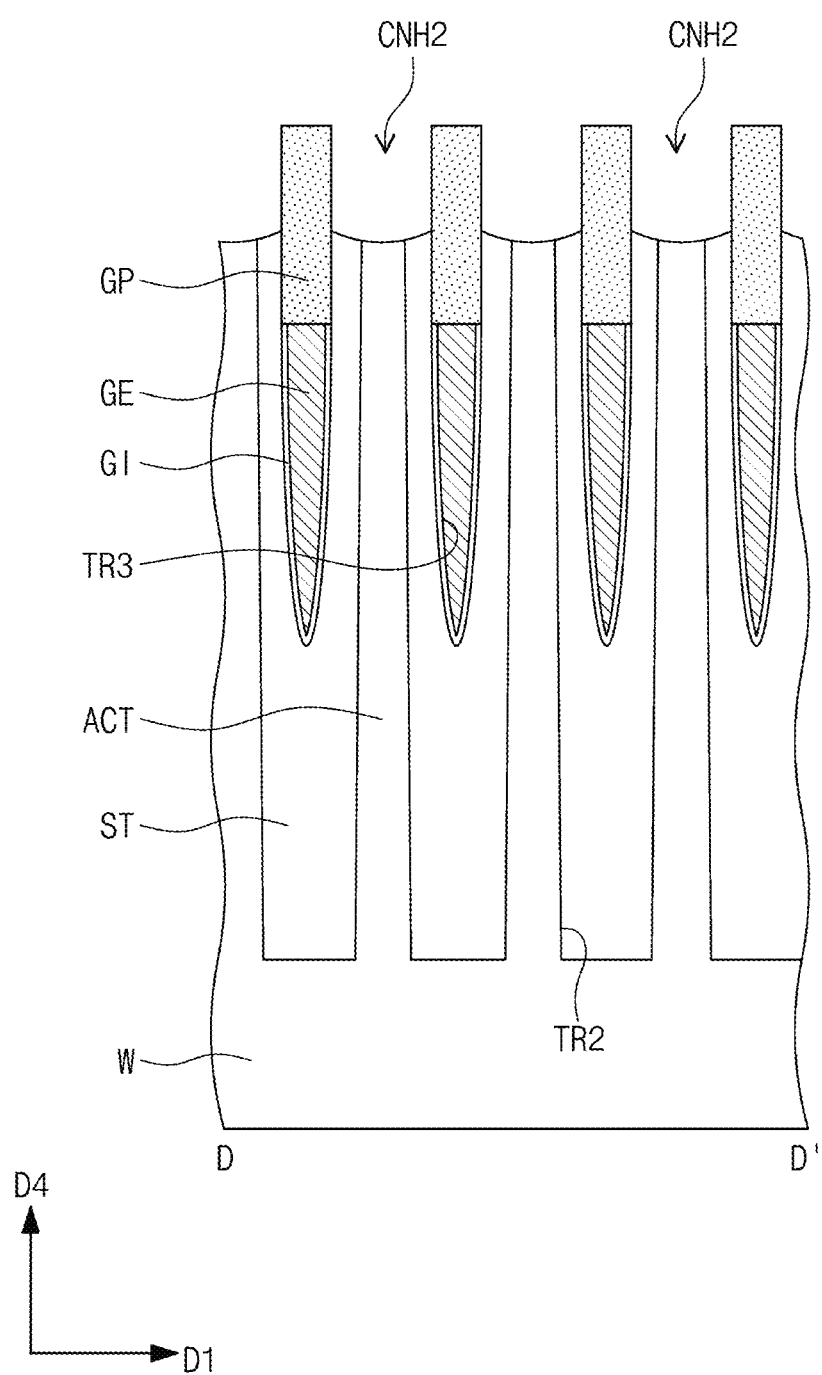
Figure 28:
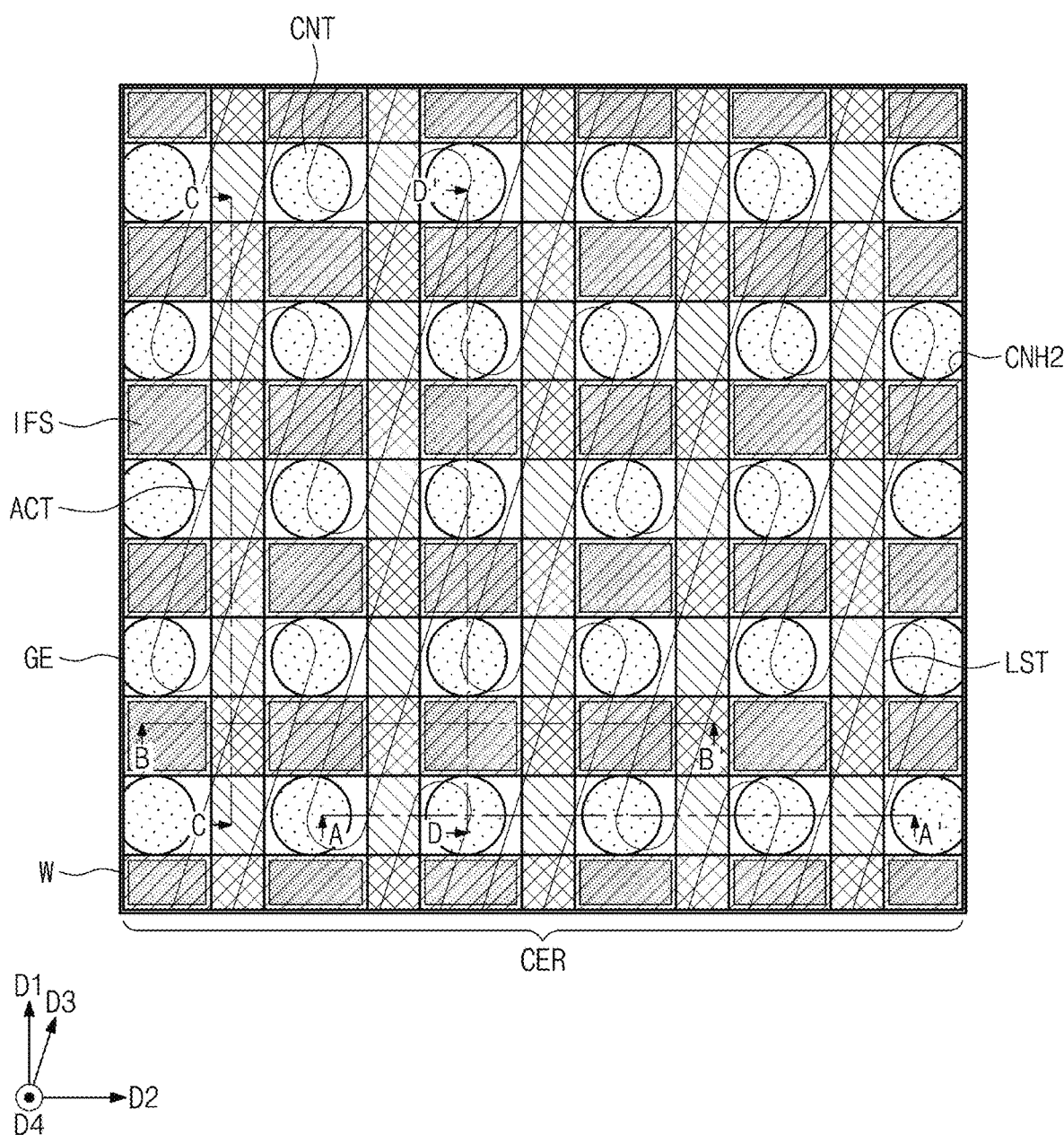
Figure 29A:
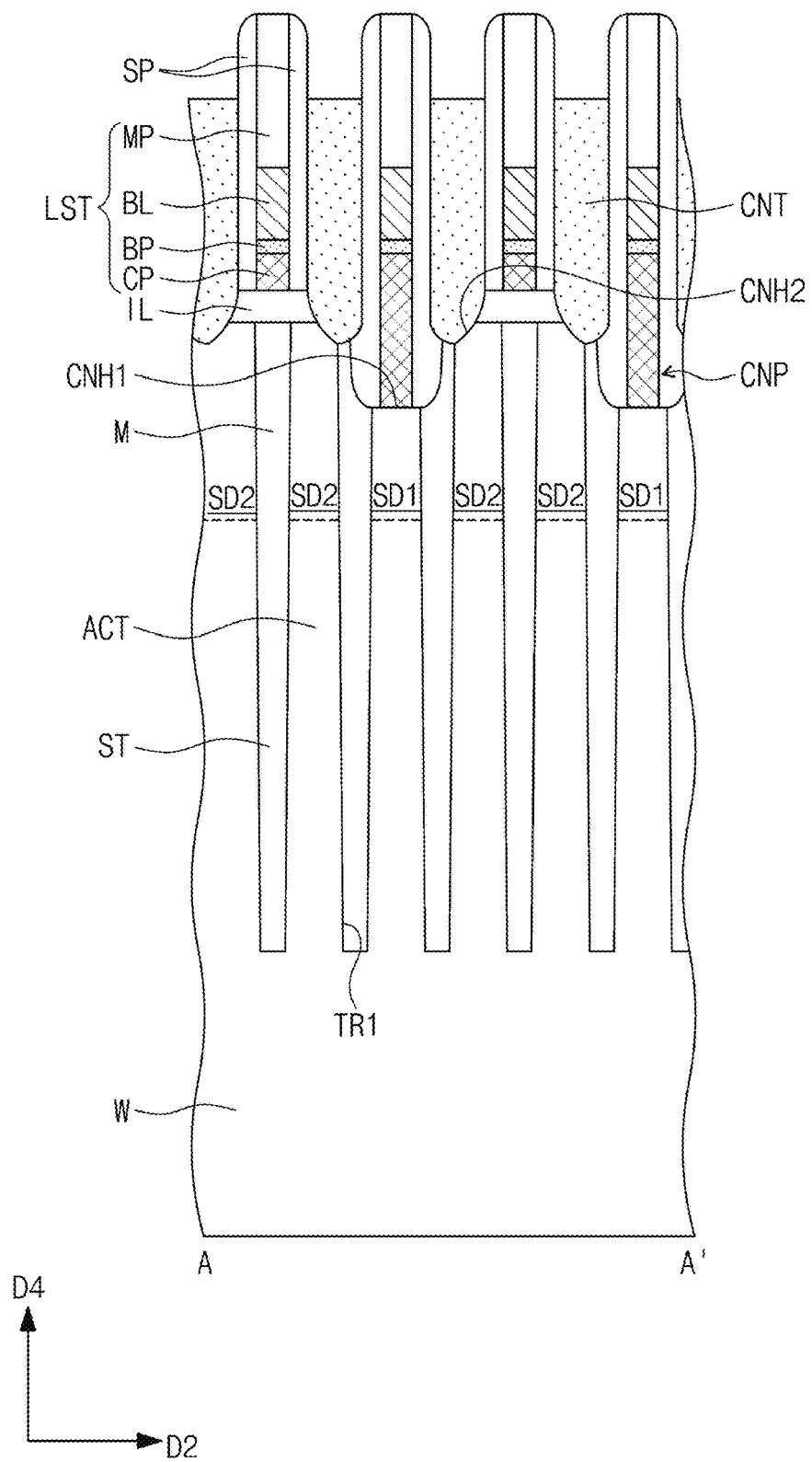
Figure 29B:
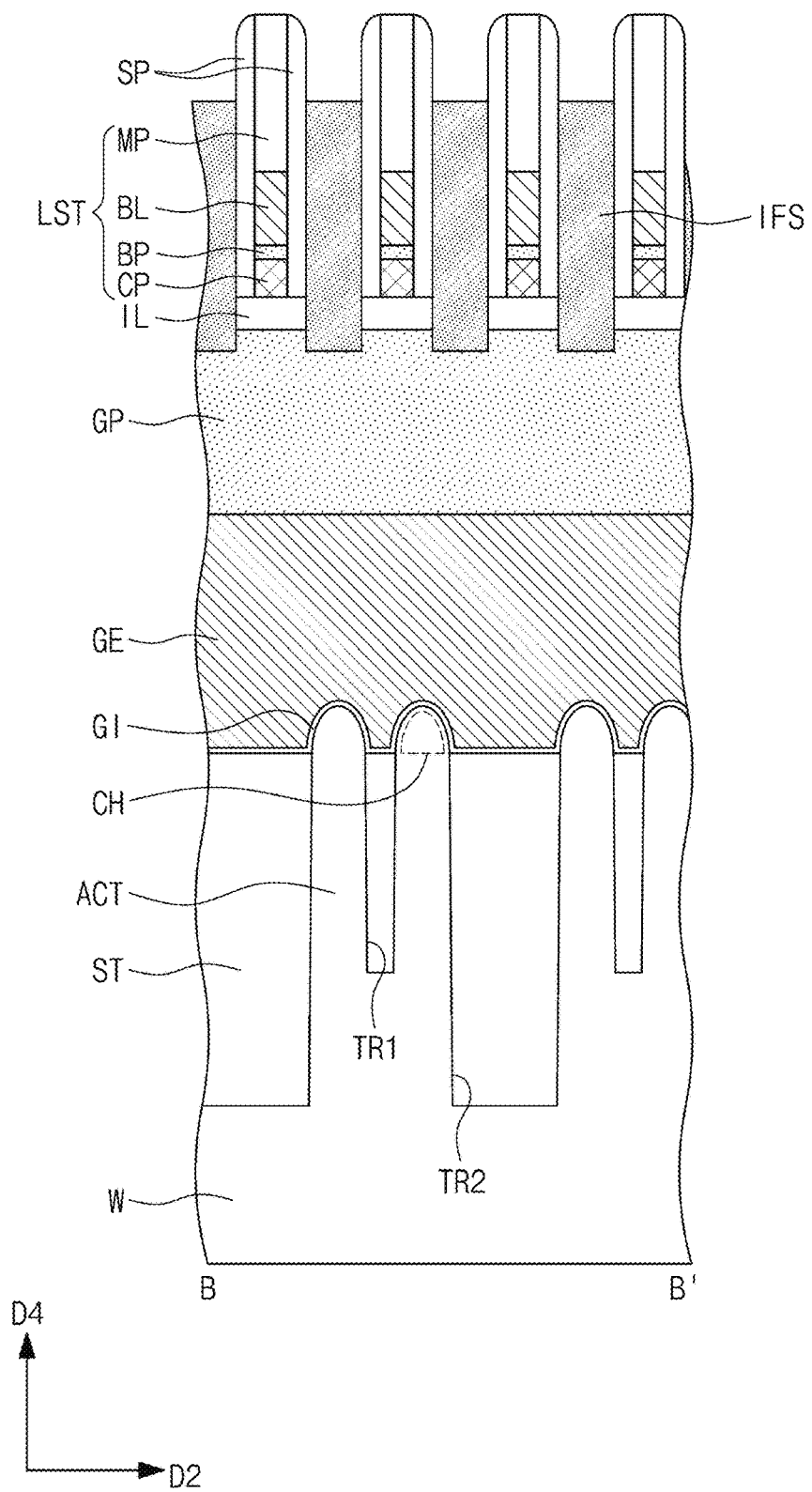
Figure 29C:
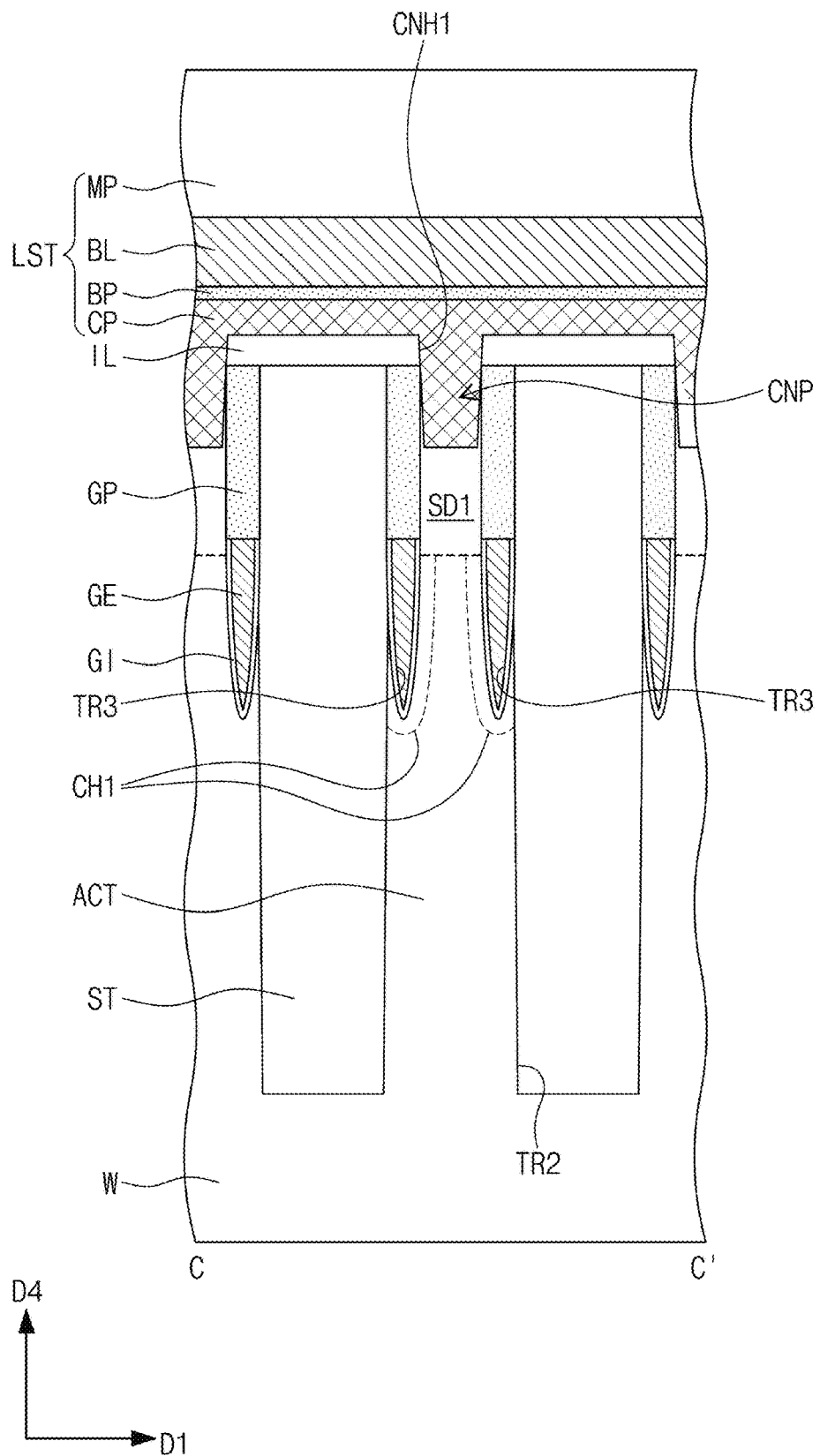
Figure 29D:
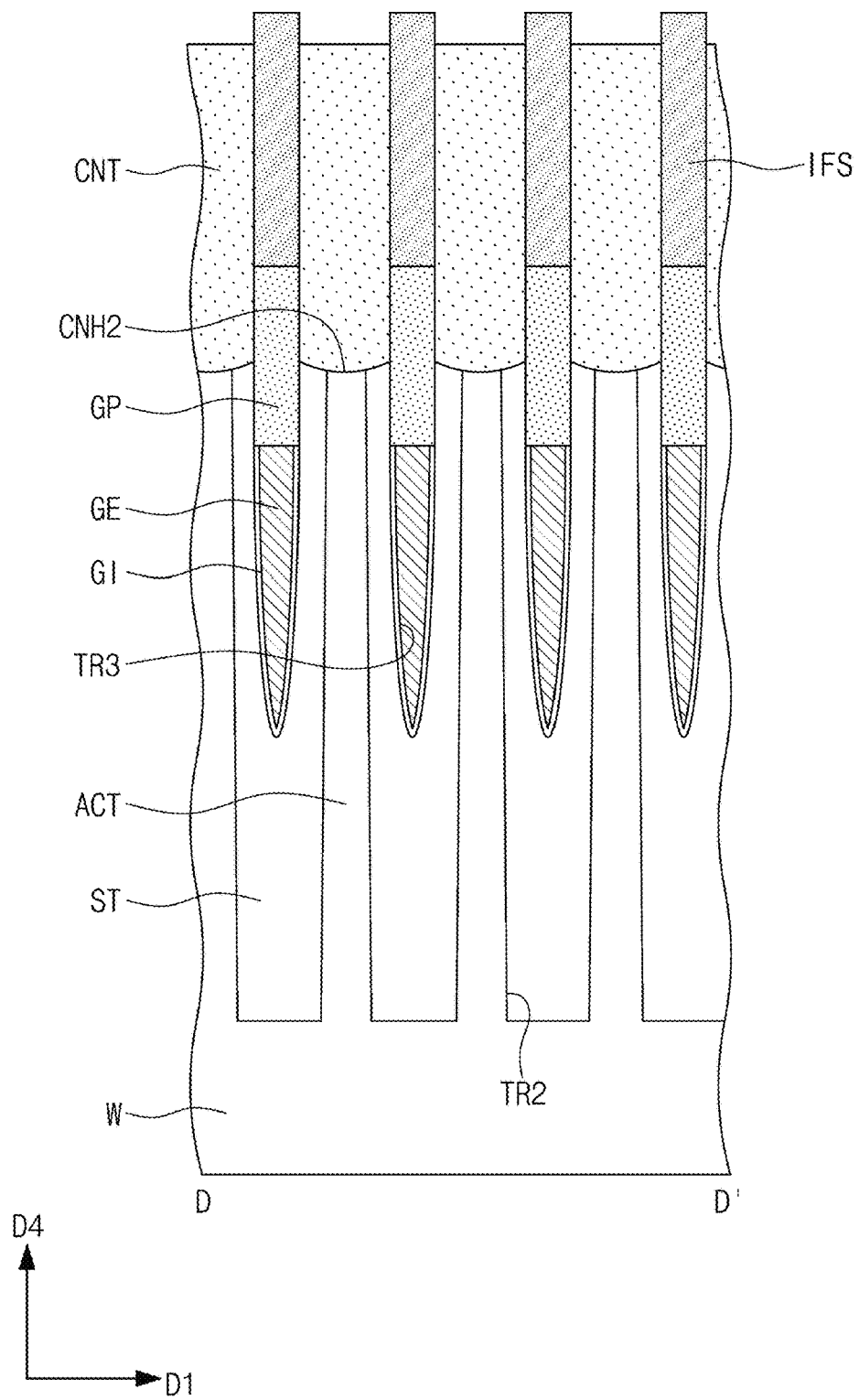
Figure 30:
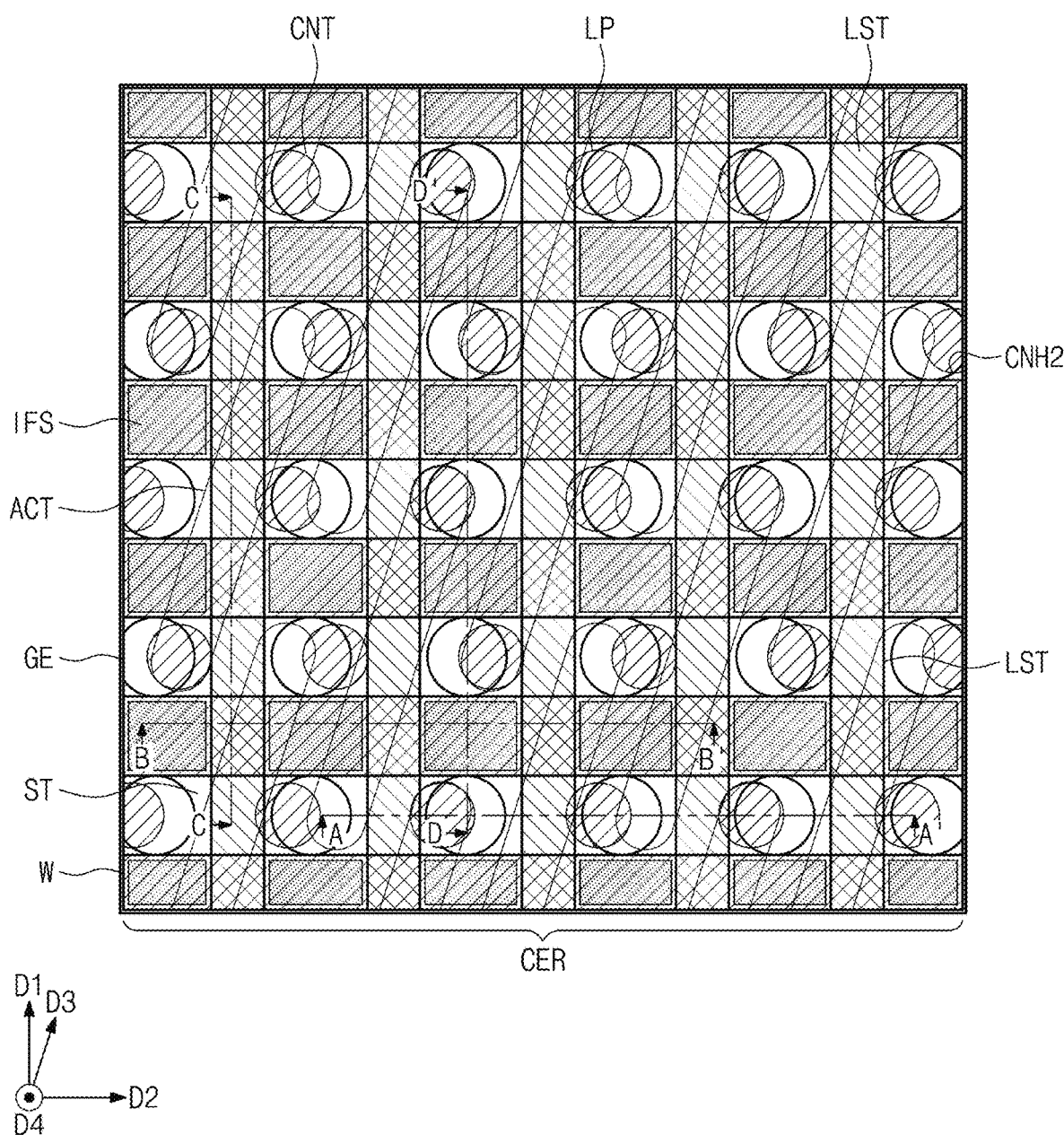
Figure 31A:
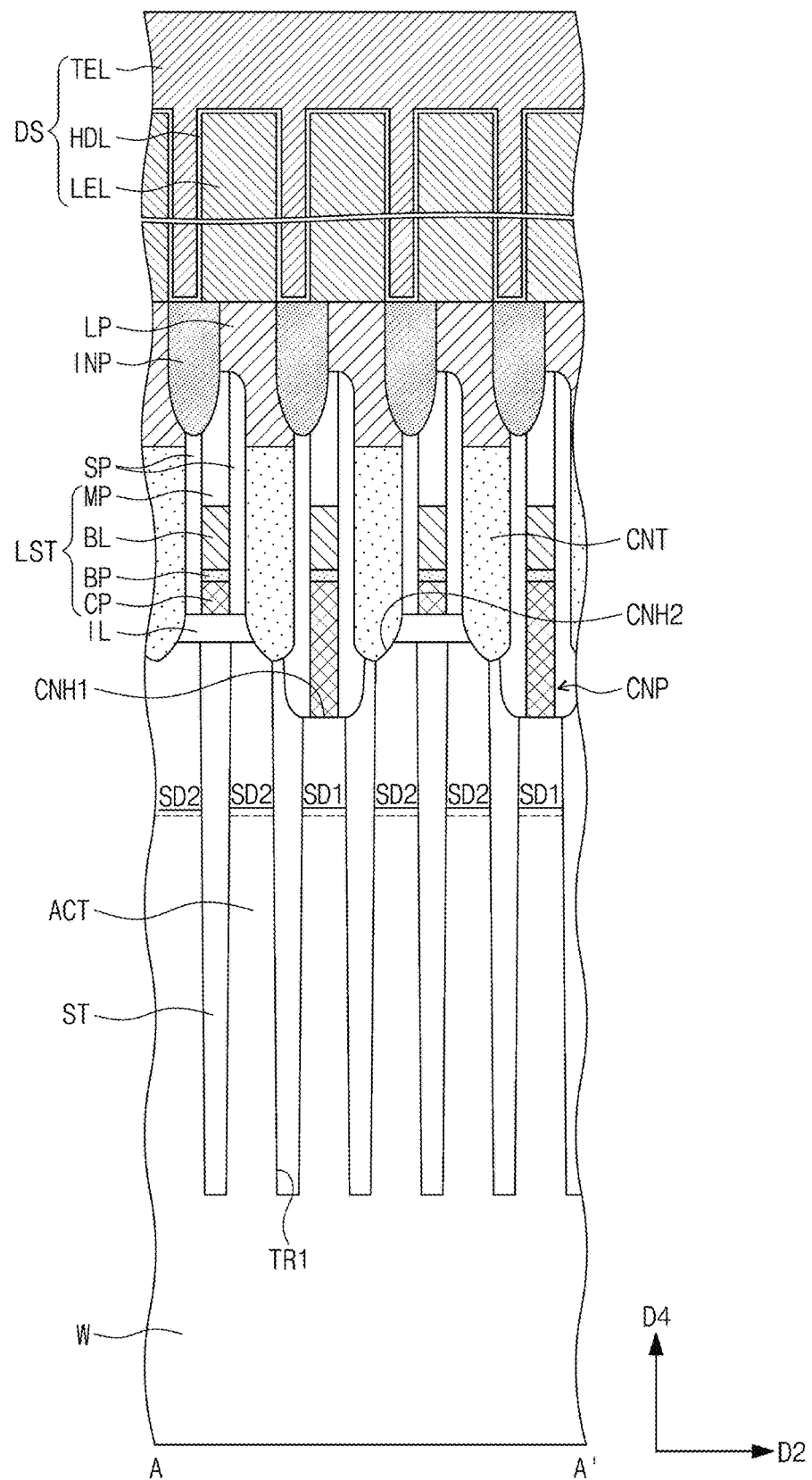
Figure 31B:
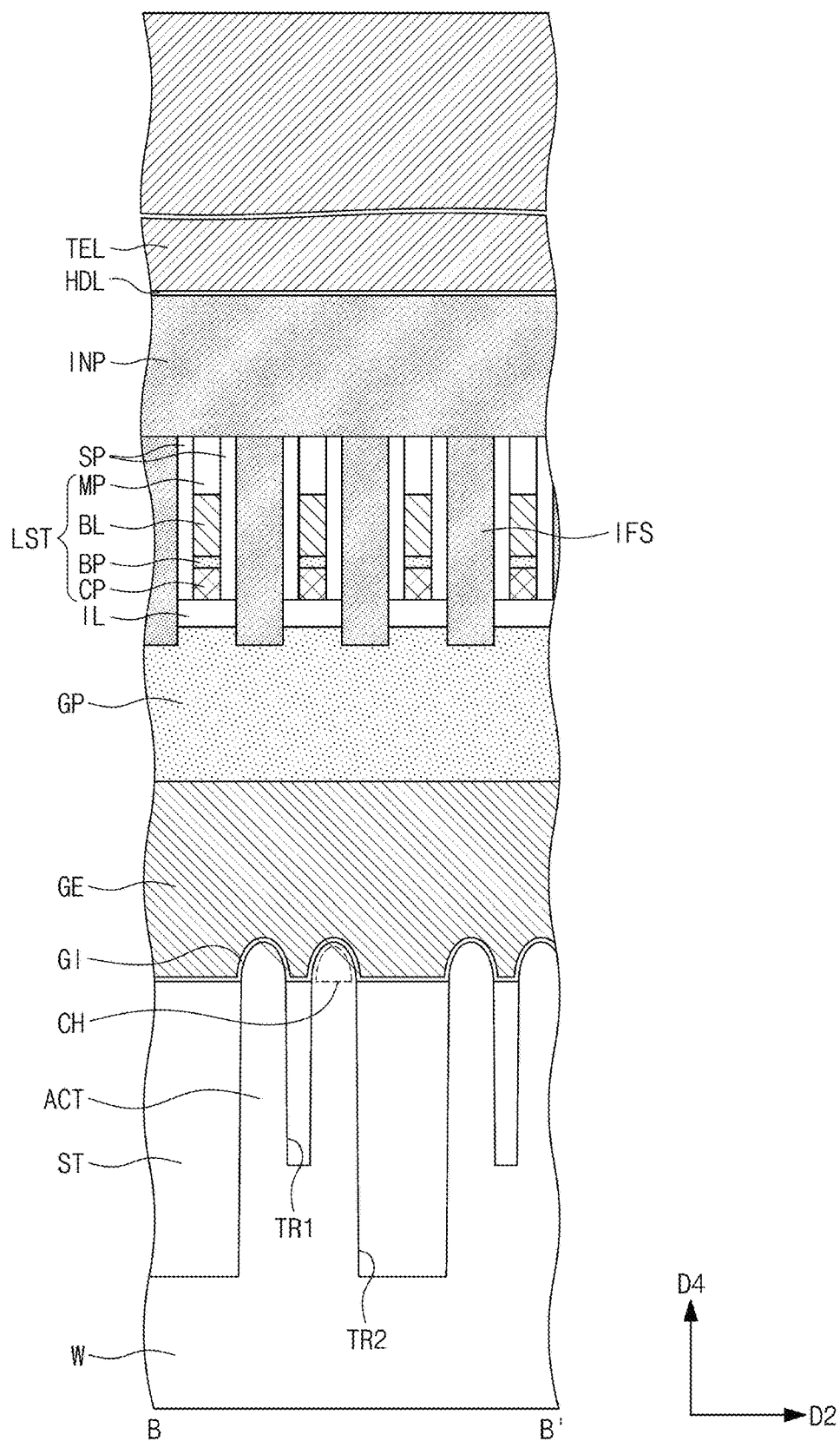
Figure 31C:
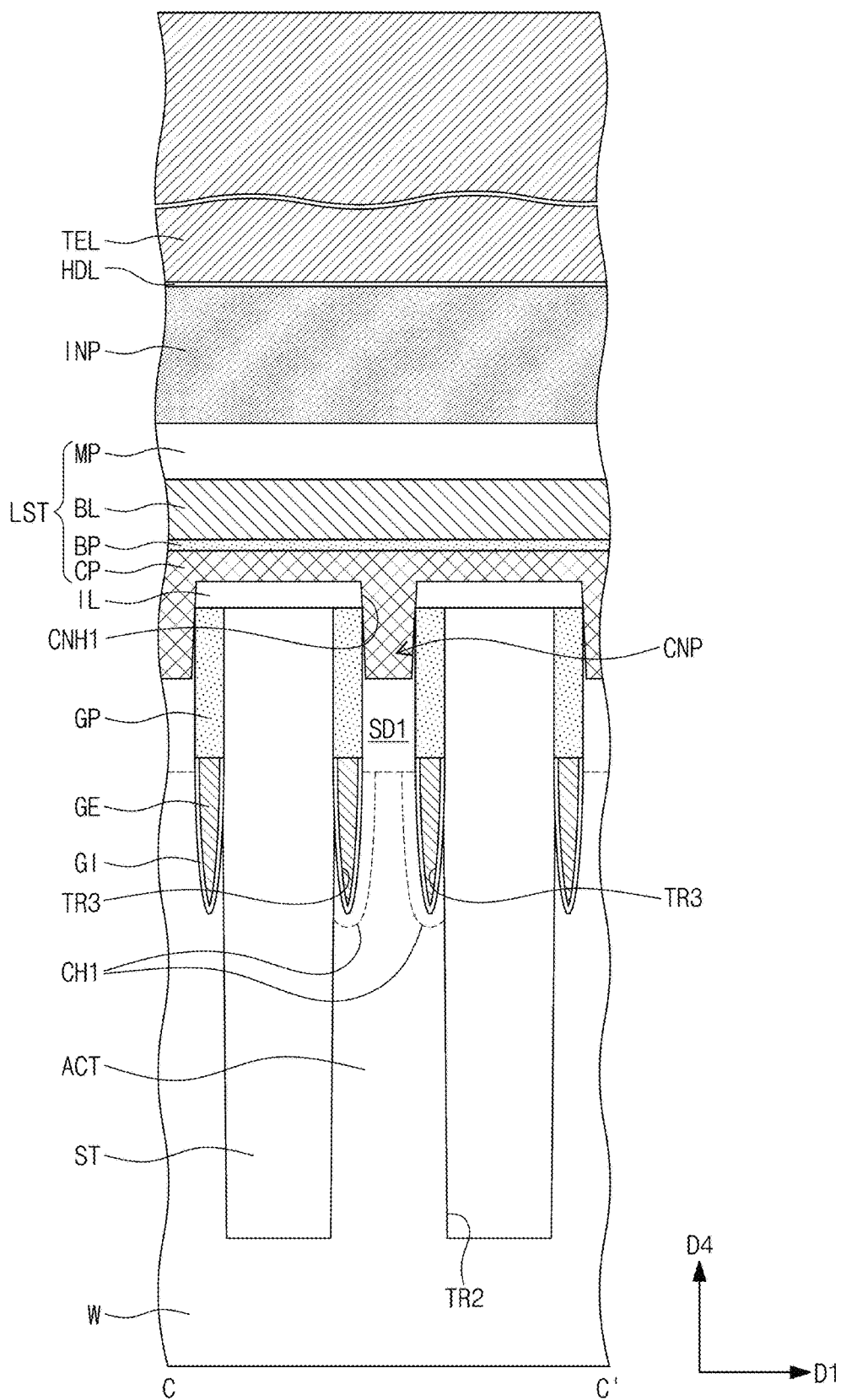
Figure 31D:
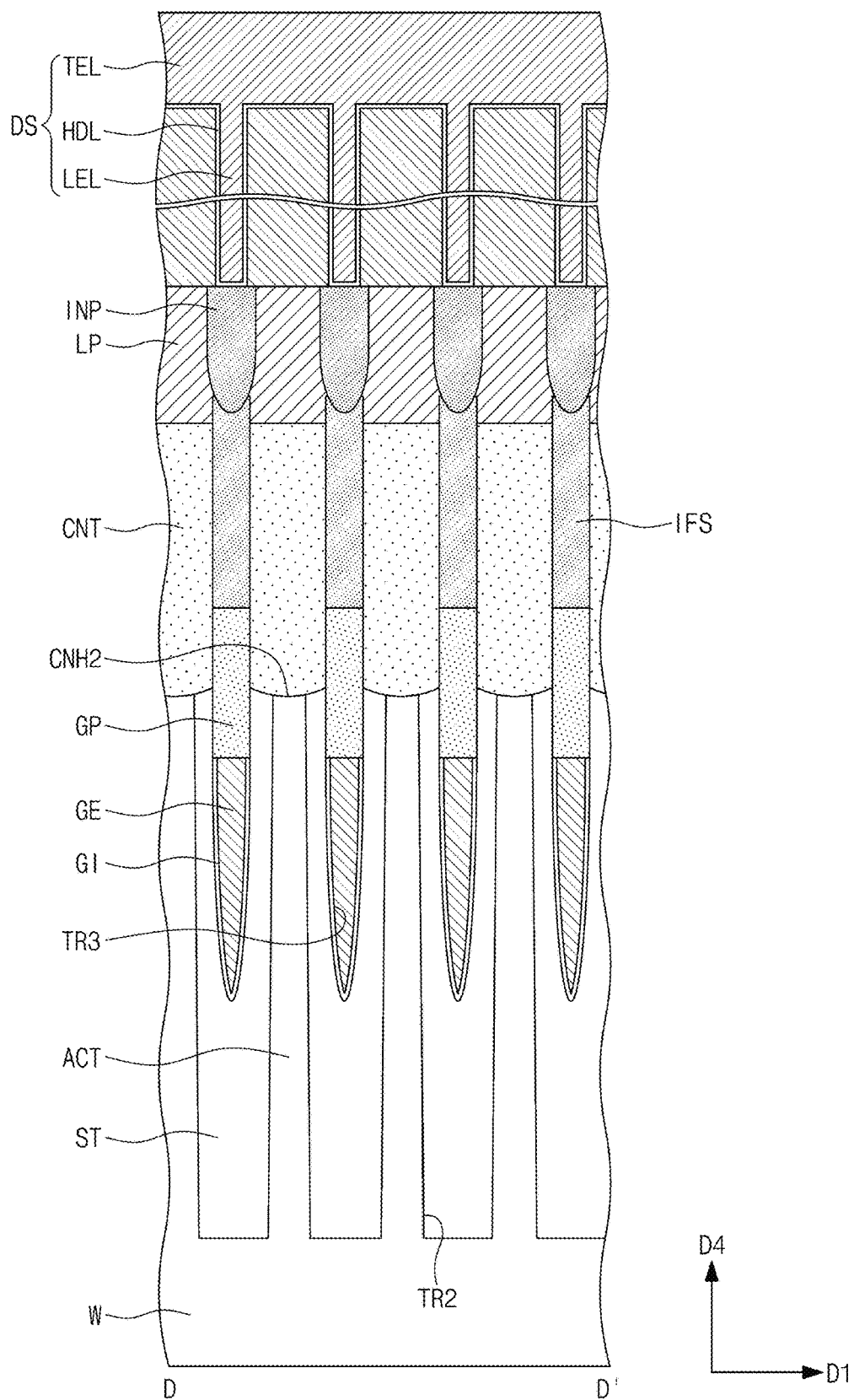

FIG. 13 is a graph obtained by transforming the difference image of FIG. 11 to a spatial frequency domain. FIG. 14 is a graph obtained by transforming the reference image of FIG. 9 to a spatial frequency domain. FIG. 15 is a graph obtained by removing a spatial frequency component of FIG. 14 from a spatial frequency component of FIG. 13.

Referring to FIG. 13, a rescaling operation may be performed on the difference image DFI of FIG. 11. In detail, a fast Fourier transform may be used to transform a difference signal on the difference image DFI of FIG. 11 to a spatial frequency domain (in S150). FIG. 13 is a graph showing a first spatial frequency component DFI_F which is transformed from the difference image of FIG. 11 to a spatial frequency domain.

The first spatial frequency component DFI_F of FIG. 13 may include spatial frequency components not only for the defect image DEI but also for a noise image. Thus, it may be necessary to extract only the spatial frequency component for the defect image DEI from the first spatial frequency component DFI_F of FIG. 13 (e.g., through a filtering process).

Referring to FIG. 14, a fast Fourier transform may be used to transform the reference image REI of FIG. 9 to a spatial frequency domain. FIG. 14 is a graph showing a second spatial frequency component REI_F which is transformed from the reference image of FIG. 9 to a spatial frequency domain. A third spatial frequency component DF_F of FIG. 15 may be obtained by excluding the second spatial frequency component REI_F of FIG. 14 from the first spatial frequency component DFI_F of FIG. 13 (in S160).

Because the reference image REI of FIG. 9 does not include a signal for a defect at all, the second spatial frequency component REI_F of FIG. 14 may be a spatial frequency component for only a noise, not for a defect. Accordingly, the third spatial frequency component DF_F of FIG. 15 may be a spatial frequency component, which is associated with only a defect, or from which a noise-associated component is removed. The operation of obtaining the third spatial frequency component DF_F of FIG. 15 may be achieved by a fast Fourier transform using the following formula 2.

[Formula 2]

Reference image → R

Difference image → D $$\hat{R} = \int_{-\infty}^{\infty}\int_{-\infty}^{\infty} Re^{i(k_x x + k_y y)} dx dy$$

$$\hat{D} = \int_{-\infty}^{\infty}\int_{-\infty}^{\infty} De^{i(k_x x + k_y y)} dx dy$$

Reduce the $$\hat{D}'_{ij} = \frac{a}{|\hat{R}_{ij}| + a}\hat{D}_{ij}$$

where $a$ is an arbitrary constant.

$$\hat{D}''_{ij} = \frac{\sum_{k,j}|\hat{D}_{ij}|}{\sum_{k,j}|\hat{D}'_{ij}|}\hat{D}'_{ij}$$

By analyzing a wave form of the third spatial frequency component DF_F of FIG. 15, it may be possible to determine the type of defect (in S170). For example, by analyzing the wave form of the third spatial frequency component DF_F, it may be possible to conclude that the defect in the first region R1 of the target die DDI is a bridge-type defect.

According to an embodiment, the afore-described defect inspection method may be performed not only on the first region R1 of the target die DDI of FIG. 3 but also on the remaining regions. It may be determined whether a degree of a defect detected from the target die DDI is within an allowable range. The degree of the defect may be determined by comprehensively considering the presence or absence of the defect shown in FIG. 11 and the type of the defect shown in FIG. 15. If the degree of the detected defect is beyond the allowable range, an alert may be produced. If the degree of the detected defect is within the allowable range, subsequent processes may be performed on the wafer W to fabricate a semiconductor device.

FIGS. 16, 18, 20, 22, 24, 26, 28, and 30 are plan views illustrating a method of fabricating a semiconductor device, according to an embodiment. FIGS. 17A, 19A, 21A, 23A, 25A, 27A, 29A, and 31A are sectional views taken along lines A-A' of FIGS. 16, 18, 20, 22, 24, 26, 28, and 30, respectively. FIGS. 17B, 19B, 21B, 23B, 25B, 27B, 29B, and 31B are sectional views taken along liens B-B' of FIGS. 16, 18, 20, 22, 24, 26, 28, and 30, respectively. FIGS. 17C, 19C, 21C, 23C, 25C, 27C, 29C, and 31C are sectional views taken along lines C-C' of FIGS. 16, 18, 20, 22, 24, 26, 28, and 30, respectively. FIGS. 17D, 19D, 21D, 23D, 25D, 27D, 29D, and 31D are sectional views taken along lines D-D' of FIGS. 16, 18, 20, 22, 24, 26, 28, and 30, respectively.

A method of fabricating a semiconductor device according to an embodiment may include a semiconductor fabrication process, which is performed on the wafer W described with reference to FIG. 3. The semiconductor fabrication process may be performed on the dies 200 of the wafer W. In the following embodiment, the fabrication method will be described with reference to the first region R1 of the wafer W of FIG. 3.

Referring to FIGS. 16 and 17A to 17D, active patterns ACT may be formed by patterning an upper portion of the wafer W. Each of the active patterns ACT may extend in a third direction D3 that is parallel to a top surface of the wafer W. The active patterns ACT may be two-dimensionally arranged in the first and second directions D1 and D2. The active patterns ACT may be spaced apart from each other in the third direction D3. The active patterns ACT may be realized using a photolithography process.

First and second trenches TR1 and TR2 may be defined between the active patterns ACT. The first trench TR1 may be defined between a pair of active patterns ACT, which are adjacent to each other in the second direction D2. The second trench TR2 may be defined between a pair of the active patterns ACT, which are adjacent to each other in the third direction D3.

A device isolation layer ST may be formed to fill the first and second trenches TR1 and TR2. The device isolation layer ST may be formed to fully fill the first and second trenches TR1 and TR2 and to cover the active patterns ACT. A planarization process may be performed on the device isolation layer ST to expose the top surfaces of the active patterns ACT.

A defect inspection process may be performed on the active patterns ACT that are formed on the wafer W. The defect inspection process may include performing the defect inspection method of FIG. 2 using the defect system of FIG. 1.

In more detail, an optical image on the active patterns ACT of the first region R1 may be obtained as the candidate image CAI, and an optical image on the active patterns ACT of the second region R2 may be obtained as the reference image REI. By performing the inspection process on the candidate and reference images CAI and REI in the same manner as described with reference to FIG. 2, it may be determined whether a degree of a defect in the active patterns ACT is within an allowable range. In the case where the degree of the defect in the active patterns ACT is within the allowable range, a subsequent process may be performed.

Referring to FIGS. 18 and 19A to 19D, the active patterns ACT and the device isolation layer ST may be patterned to form third trenches TR3. When viewed in a plan view, each of the third trenches TR3 may be a line-shaped region extending in the second direction D2.

The formation of the third trenches TR3 may include forming a hard mask pattern with openings, and etching the exposed portions of the active patterns ACT and the device isolation layer ST using the hard mask pattern as an etch mask. The third trench TR3 may be formed to be shallower than the first trench TR1.

Referring to FIGS. 20 and 21A to 21D, a gate insulating layer GI, a gate electrode GE, and a gate capping layer GP may be sequentially formed in each of the third trenches TR3. In detail, the gate insulating layer GI may be formed to conformally cover the third trench TR3. The gate insulating layer GI may be formed of or include at least one of silicon oxide, silicon nitride, silicon oxynitride, and/or high-k dielectric materials.

The gate electrode GE may be formed by forming a conductive layer on the gate insulating layer GI to fill the third trench TR3. The conductive layer may be formed of or include at least one of conductive metal nitrides and/or metallic materials.

The gate insulating layer GI and the gate electrode GE may be recessed to form an empty region, and then, the gate capping layer GP may be formed in the empty region or on the recessed gate electrode GE. A top surface of the gate capping layer GP may be coplanar with a top surface of the active pattern ACT.

An ion implantation process may be performed on the active patterns ACT to form a first source/drain region SD1 and a pair of second source/drain regions SD2 in an upper portion of the active pattern ACT. The pair of second source/drain regions SD2 may be spaced apart from each other in the third direction D3, with the first source/drain region SD1 interposed therebetween. In an embodiment, the first and second source/drain regions SD1 and SD2 may be doped with the same impurities.

A channel region CH may be defined in a portion of the active pattern ACT located below the gate electrode GE. When viewed in a plan view, the channel region CH may be interposed between the first source/drain region SD1 and the second source/drain region SD2. The gate electrode GE may be provided on a top surface and both sides surfaces of the channel region CH (e.g., see FIG. 21B).

A defect inspection process may be performed on the gate electrodes GE that are formed on the wafer W. The defect inspection process may be the same as the afore-described inspection process on the active patterns ACT. In the case where a degree of a defect in the gate electrodes GE is within an allowable range, a subsequent process may be performed.

Referring to FIGS. 22 and 23A to 23D, an insulating layer IL may be formed on the entire top surface of the wafer W. As an example, the insulating layer IL may be a multi-layered structure, in which a silicon oxide layer and a silicon oxynitride layer are stacked. The insulating layer IL may be patterned to form first contact holes CNH1, each of which exposes a corresponding one of the first source/drain regions SD1 of the active patterns ACT. When the first contact hole CNH1 is formed, an upper portion of the first source/drain region SD1 may be partially recessed. Similarly, when the first contact hole CNH1 is formed, an upper portion of the device isolation layer ST around the first source/drain region SD1 may be partially recessed. The defect inspection process according to an embodiment may be performed on the first contact holes CNH1.

Referring to FIGS. 24 and 25A to 25D, a first conductive layer CL1, a barrier layer BAL, and a second conductive layer CL2 may be sequentially formed on the insulating layer IL. The first conductive layer CL1 may be formed to fill the first contact holes CNH1. That is, the first conductive layer CL1 may be in contact with the first source/drain regions SD1 of the active patterns ACT. The first conductive layer CL1 may be vertically spaced apart from the second source/drain regions SD2 of the active patterns ACT by the insulating layer IL. The first conductive layer CL1 may be formed of or include at least one of doped semiconductor materials.

The barrier layer BAL may be formed to be interposed between the first conductive layer CL1 and the second conductive layer CL2. The barrier layer BAL may be formed of or include at least one of conductive metal nitrides. The second conductive layer CL2 may be formed of or include at least one of metallic materials. The barrier layer BAL may prevent or suppress a metallic material in the second conductive layer CL2 from being diffused into the first conductive layer CL1.

Referring to FIGS. 26 and 27A to 27D, line structures LST, which extend in the first direction D1 in parallel, may be formed on the insulating layer IL. The line structures LST may be arranged in the second direction D2.

In detail, mask patterns MP may be formed on the second conductive layer CL2. The mask patterns MP may be formed to have a line shape extending in the first direction D1. In an embodiment, the mask patterns MP may be formed of or include at least one of silicon nitride or silicon oxynitride.

A bit line BL, a barrier pattern BP, and a conductive pattern CP may be respectively formed by sequentially patterning the second conductive layer CL2, the barrier layer BAL, and the first conductive layer CL1 using the mask patterns MP as a mask. The mask pattern MP, the bit line BL, the barrier pattern BP, and the conductive pattern CP may be vertically overlapped with each other. The mask pattern MP, the bit line BL, the barrier pattern BP, and the conductive pattern CP may constitute the line structure LST. When viewed in a plan view, the bit lines BL may extend to cross the gate electrodes GE.

The conductive pattern CP may include contact portions CNP filling the first contact holes CNH1, respectively. The conductive pattern CP may be connected to the first source/drain region SD1 through the contact portion CNP. In other words, the bit line BL may be electrically connected to the first source/drain region SD1 through the conductive pattern CP.

A pair of spacers SP may be formed on opposite side surfaces of each of the line structures LST. The formation of the spacers SP may include conformally forming a spacer layer on the entire top surface of the wafer W and anisotropically etching the spacer layer.

An etching process may be performed on the entire surface of the wafer W using the spacers SP and the mask patterns MP as an etch mask, and as a result, second contact holes CNH2 may be formed to expose the second source/drain regions SD2, respectively. In detail, the second contact hole CNH2 may be formed to penetrate the insulating layer IL and may extend to a level lower than the top surface of the wafer W. When the second contact hole CNH2 is formed, an upper portion of the second source/drain region SD2 may be partially recessed. When the second contact hole CNH2 is formed, an upper portion of the device isolation layer ST around the second source/drain region SD2 may be partially recessed. The defect inspection process may be performed on the line structures LST. In the case where the degree of the defect is within the allowable range, a subsequent process may be performed.

Referring to FIGS. 28 and 29A to 29D, a plurality of insulating fences IFS may be formed on the gate capping layer GP. The insulating fences IFS may not be overlapped with the second contact holes CNH2 and may be formed to expose the second contact holes CNH2.

Contacts CNT may be respectively formed in the second contact holes CNH2 by filling the second contact holes CNH2 with a conductive material. The contacts CNT may be connected to the second source/drain regions SD2. In detail, the conductive material may be formed on the entire top surface of the wafer W and then may be recessed until a top surface of the conductive material is lower than top surfaces of the insulating fences IFS. In this case, the conductive material may be cut by the insulating fences IFS, and as a result, the contacts CNT may be formed in the second contact holes CNH2, respectively. The contacts CNT and the insulating fences IFS may be alternately arranged in the first direction D1.

The conductive material filling the second contact holes CNH2 may be formed of or include at least one of doped semiconductor materials. In an embodiment, the second contact holes CNH2 may be filled with a doped semiconductor material, and then, impurities in the semiconductor material may be diffused into the second source/drain regions SD2.

Referring to FIGS. 30 and 31A to 31D, landing pads LP may be formed on the contacts CNT, respectively. In detail, a metal layer may be formed on the contacts CNT and the insulating fences IFS. The metal layer may be patterned to form the landing pads LP. The defect inspection process may be performed on the landing pads LP. In the case where the degree of the defect is within the allowable range, a subsequent process may be performed.

An insulating pattern INP may be formed by filling a space between the landing pads LP with an insulating material. First electrodes LEL may be formed on the landing pads LP, respectively. The defect inspection process according to an embodiment may be performed on the first electrodes LEL. In the case where the degree of the defect is within the allowable range, a subsequent process may be performed.

A dielectric layer HDL may be conformally formed on the first electrodes LEL. A second electrode TEL may be formed on the dielectric layer HDL. The first electrode LEL, the dielectric layer HDL, and the second electrode TEL may constitute a data storing element DS (e.g., a capacitor). Metal layers (e.g., M1, M2, M3, M4, and so forth) may be further formed on the second electrode TEL.

Figure 32:
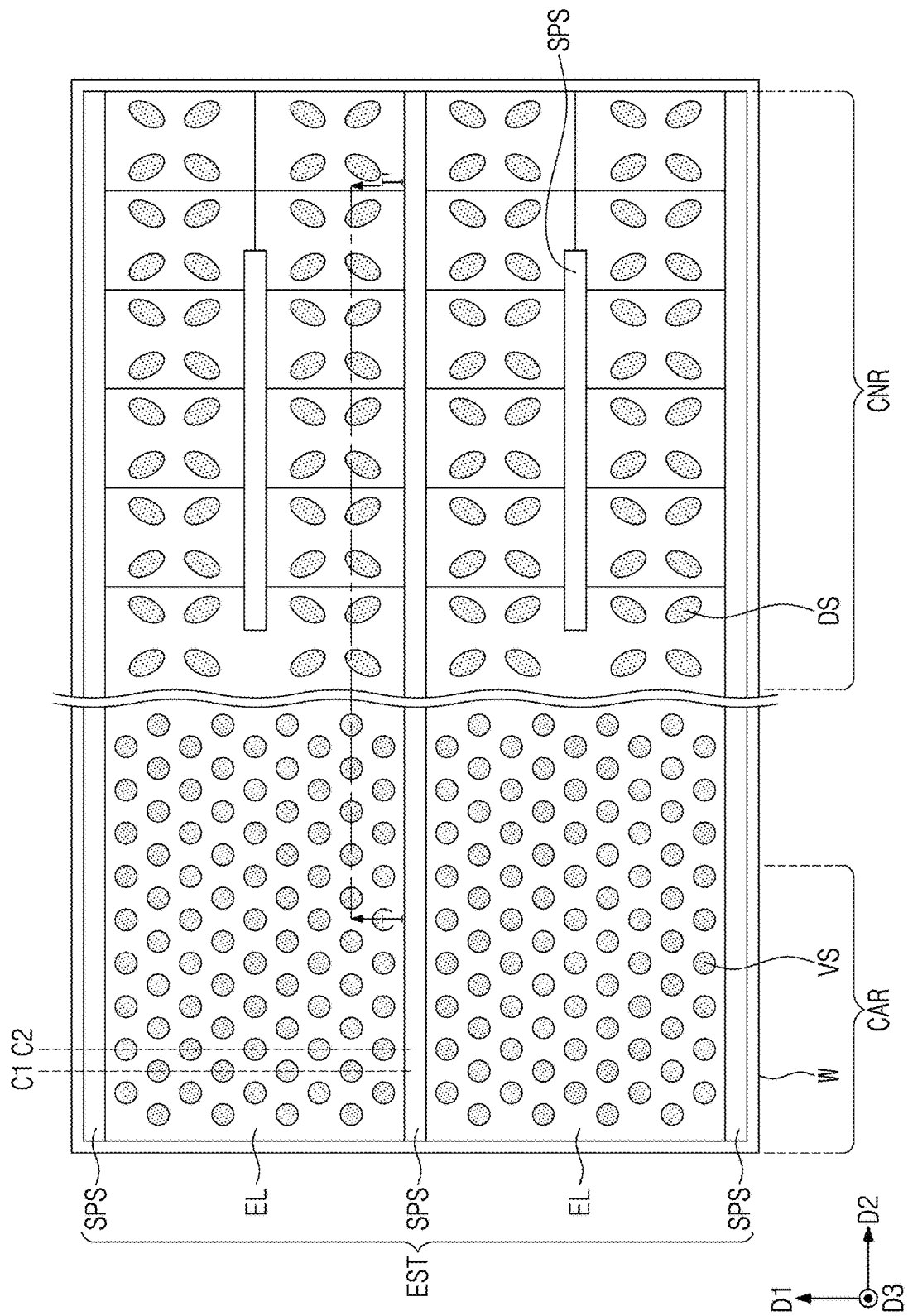
FIG. 32 is a plan view illustrating a method of fabricating a three-dimensional semiconductor memory device, according to an embodiment.

FIG. 32 is a plan view illustrating a method of fabricating a three-dimensional semiconductor memory device according to an embodiment. FIGS. 33 to 38 are sectional views taken along a line I-I' of FIG. 32 to illustrate the method of fabricating a three-dimensional semiconductor memory device according to an embodiment.

A method of fabricating a semiconductor device according to an embodiment may include a semiconductor fabrication process, which is performed on the wafer W described with reference to FIG. 3. The semiconductor fabrication process may be performed on the dies 200 of the wafer W. In the following embodiment, the fabrication method will be described with reference to the first region R1 of the wafer W of FIG. 3.

Figure 33:
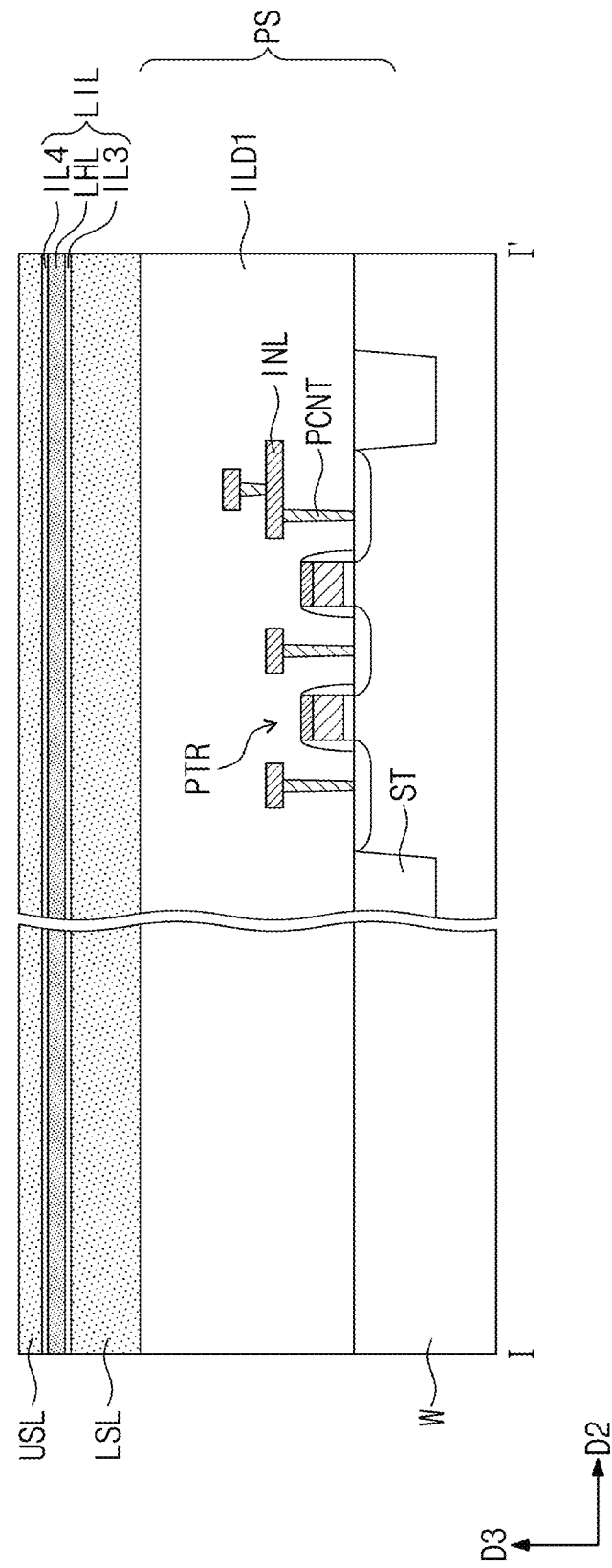
FIGS. 33 to 38 are sectional views, which are taken along a line I-I' of FIG. 32 to illustrate a method of fabricating a three-dimensional semiconductor memory device according to an embodiment.

Referring to FIGS. 32 and 33, a peripheral circuit structure PS may be formed on the wafer W. The formation of the peripheral circuit structure PS may include forming peripheral transistors PTR on the wafer W and forming lower interconnection lines INL on the peripheral transistors PTR. For example, the formation of the peripheral transistors PTR may include forming the device isolation layer DIL on the wafer W to define the active regions, forming a gate insulating layer and a gate electrode on the active regions, and injecting impurities into upper portions of the active regions to form source/drain regions. A first interlayer insulating layer ILD1 may be formed to cover the peripheral transistors PTR and the lower interconnection lines INL.

A lower semiconductor layer LSL may be formed on the first interlayer insulating layer ILD1. For example, the lower semiconductor layer LSL may be formed of or include a semiconductor material (e.g., polysilicon). A lower insulating layer LIL may be formed on the lower semiconductor layer LSL. The formation of the lower insulating layer LIL may include sequentially forming a third insulating layer IL3, a lower sacrificial layer LHL, and a fourth insulating layer IL4 on the lower semiconductor layer LSL. The third and fourth insulating layers IL3 and IL4 may be formed of or include silicon oxide, and the lower sacrificial layer LHL may be formed of or include silicon nitride or silicon oxynitride. An upper semiconductor layer USL may be conformally formed on the lower sacrificial layer LHL. For example, the upper semiconductor layer USL may be formed of or include a semiconductor material (e.g., polysilicon).

Figure 34:
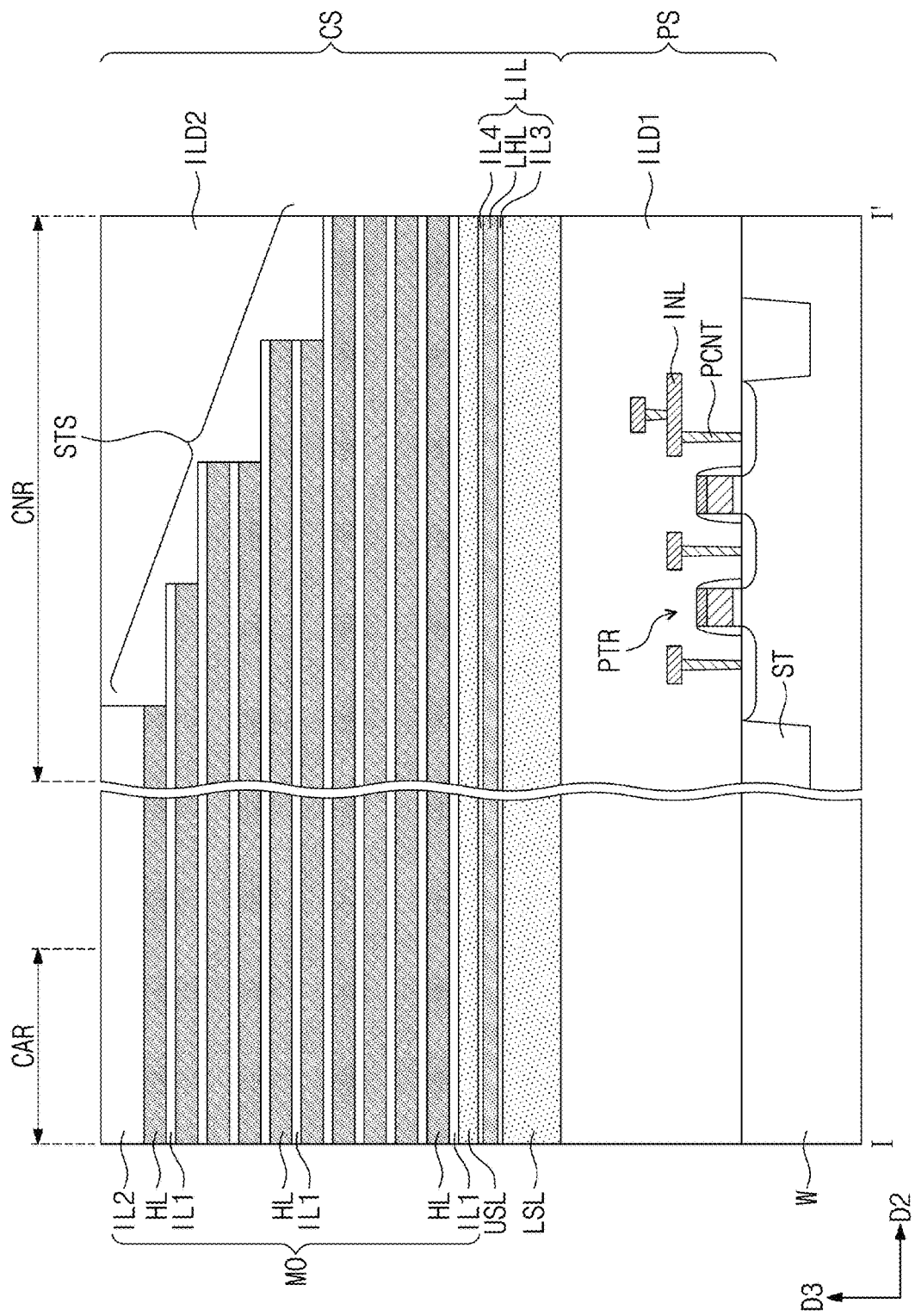

Referring to FIGS. 32 and 34, a stack MO may be formed on the upper semiconductor layer USL. In detail, the stack MO may be formed by alternately stacking first insulating layers IL1 and sacrificial layers HL on the upper semiconductor layer USL. A second insulating layer IL2 may be formed at a topmost level of the stack MO.

The first insulating layers IL1 the sacrificial layers HL, and the second insulating layer IL2 may be deposited using at least one of thermal chemical vapor deposition, plasma-enhanced chemical vapor deposition, physical chemical vapor deposition, or atomic layer deposition processes. The first and second insulating layers IL1 and IL2 may be formed of or include silicon oxide, and the sacrificial layers HL may be formed of or include at least one of silicon nitride or silicon oxynitride.

A staircase structure STS may be formed in the stack MO on a connection region CNR. In detail, the staircase structure STS may be formed on the connection region CNR by performing a cycle process on the stack MO. The formation of the staircase structure STS may include forming a mask pattern on the stack MO and repeatedly performing a patterning process using the mask pattern. Each patterning process may include an operation of etching a portion of the stack MO using the mask pattern as an etch mask and a trimming operation of reducing a size (e.g., a width) of the mask pattern.

A second interlayer insulating layer ILD2 may be formed on the stack MO. The formation of the second interlayer insulating layer ILD2 may include forming an insulating layer to cover the stack MO and performing a planarization process on the insulating layer to expose the second insulating layer IL2.

Figure 35:
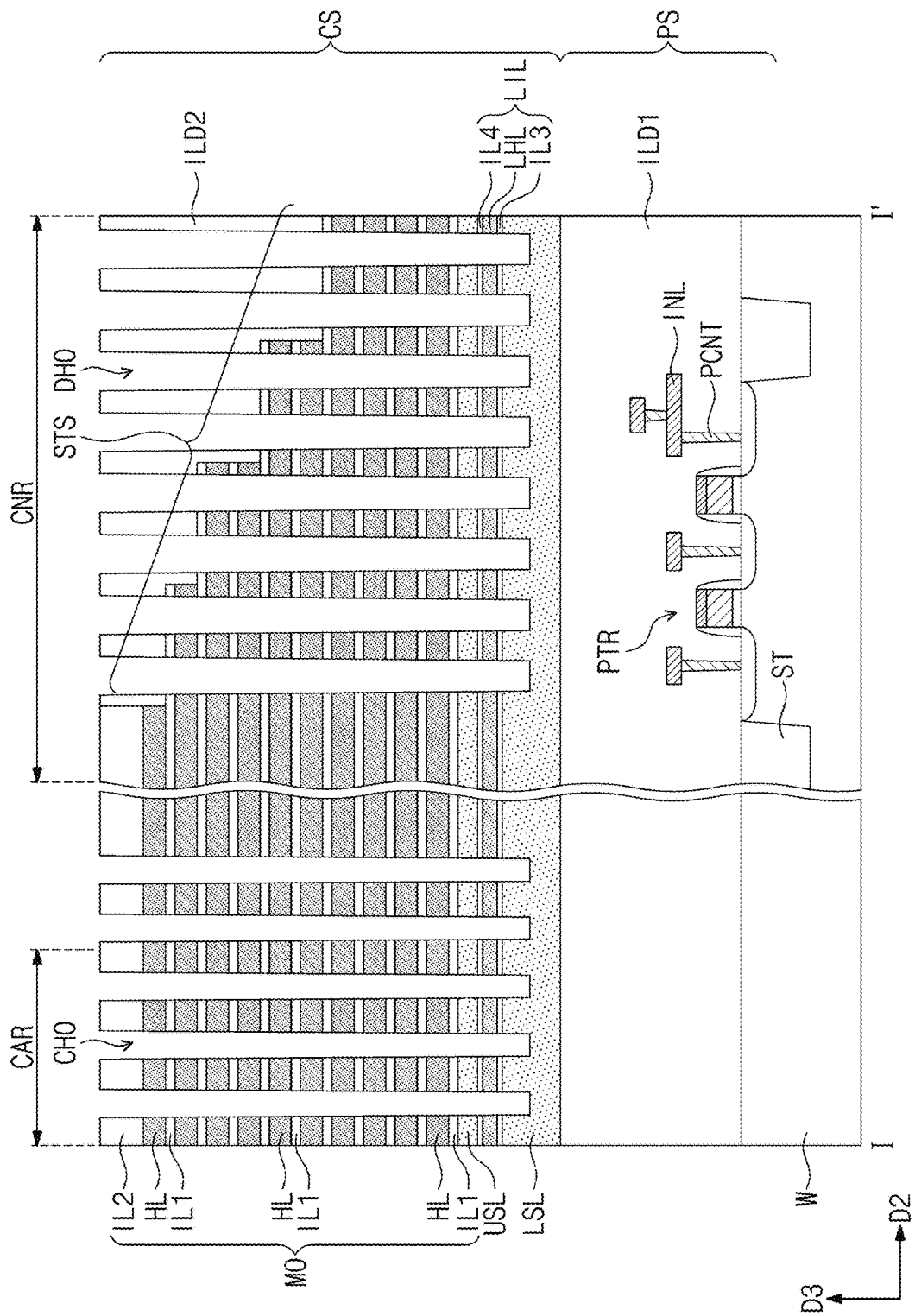

Referring to FIGS. 32 and 35, channel holes CHO may be formed on a cell array region CAR to penetrate the stack MO. Dummy holes DHO may be formed on the connection region CNR to penetrate the stack MO. The dummy holes DHO may be formed to penetrate the staircase structure STS of the stack MO. Each of the channel and dummy holes CHO and DHO may be formed to expose the lower semiconductor layer LSL.

When viewed in a plan view, the channel holes CHO may be arranged in a specific direction or in a zigzag shape. The largest diameter of each of the channel holes CHO may be smaller than the largest diameter of each of the dummy holes DHO. The defect inspection process according to an embodiment may be performed on the channel holes CHO. Accordingly, it may be possible to determine whether a degree of a defect in the channel holes CHO is within an allowable range. In the case where the degree of the defect is within the allowable range, a subsequent process may be performed.

Figure 36:
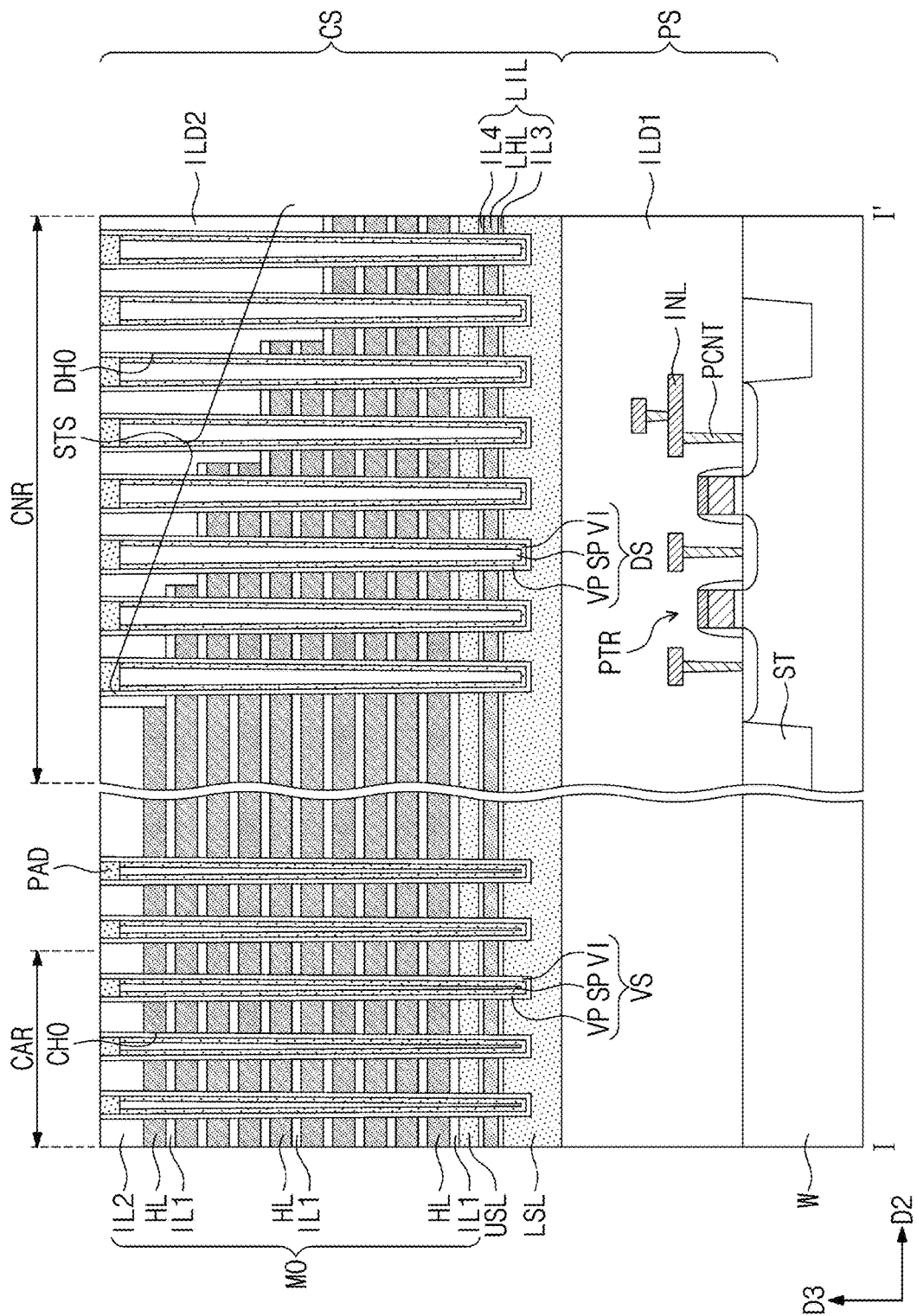

Referring to FIGS. 32 and 36, vertical channel structures VS may be formed in the channel holes CHO, respectively. Dummy structures DS may be formed in the dummy holes DHO, respectively. A conductive pad may be formed on each of the vertical channel structures VS and the dummy structures DS.

In detail, a vertical insulating pattern VP may be formed to conformally cover an inner surface of the channel hole CHO. The formation of the vertical insulating pattern VP may include sequentially forming a blocking insulating layer, a charge storing layer, and a tunnel insulating layer in the channel hole CHO. A vertical semiconductor pattern SP may be formed in the channel hole CHO to cover the vertical insulating pattern VP. The formation of the vertical semiconductor pattern SP may include forming a poly-silicon layer in the channel hole CHO. Thereafter, a gapfill insulating pattern VI may be formed in the channel hole CHO.

The dummy structure DS in the dummy hole DHO may be formed simultaneously with the vertical channel structure VS.

Figure 37:
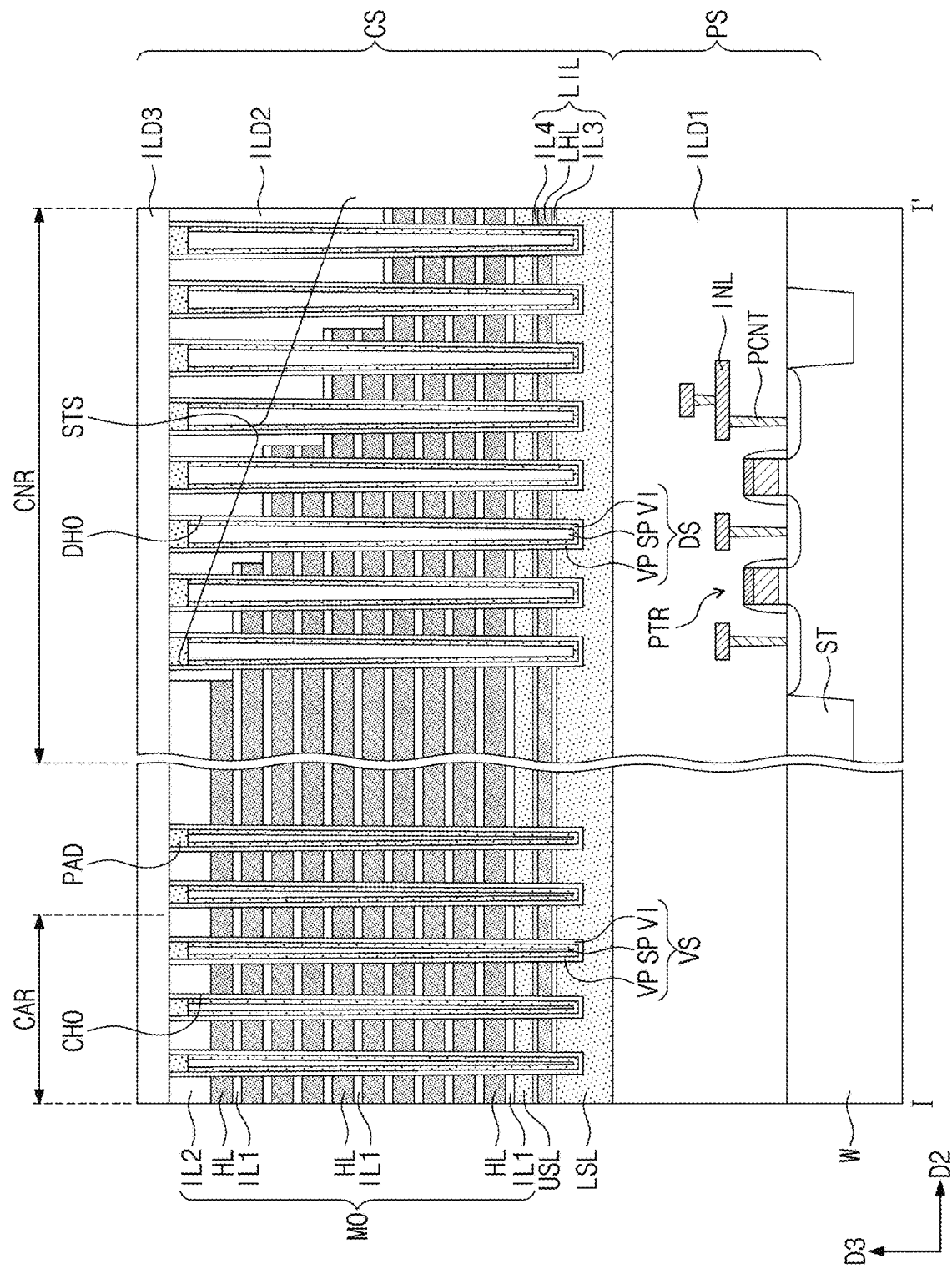

Referring to FIGS. 32 and 37, a third interlayer insulating layer ILD3 may be formed on the stack MO and the second interlayer insulating layer ILD2. The stack MO may be patterned to form cutting holes SPS penetrating the stack MO (e.g., see FIG. 32). The cutting hole SPS may be formed to expose the lower sacrificial layer LHL. The lower sacrificial layer LHL, which is exposed through the cutting hole SPS, may be replaced with a source semiconductor layer SSL. The source semiconductor layer SSL may be in direct contact with an exposed portion of the vertical semiconductor pattern SP. In an embodiment, the lower sacrificial layer LHL on the connection region CNR may not be removed. Thus, the source semiconductor layer SSL may not be formed on the connection region CNR.

Figure 38:
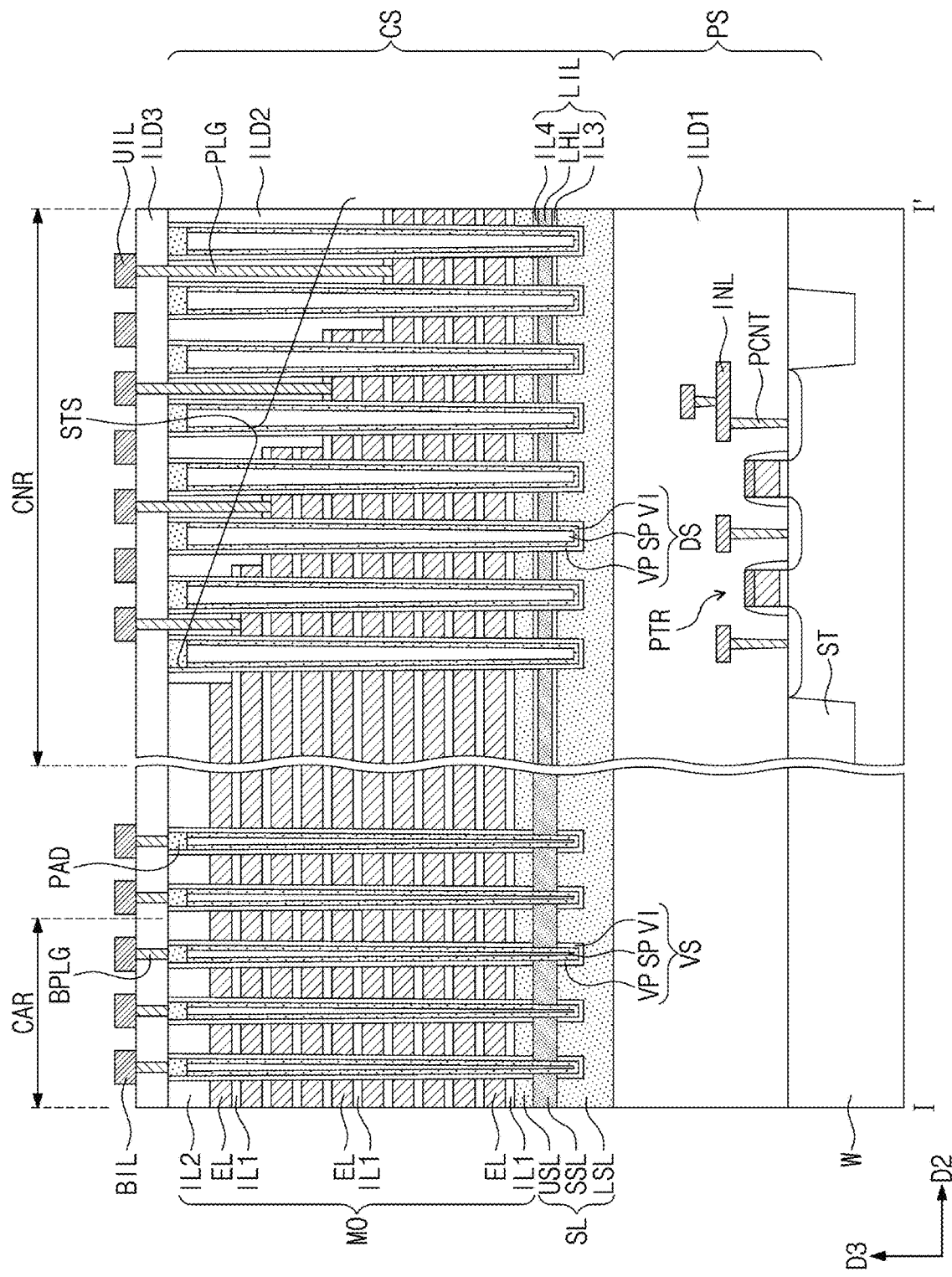

Referring to FIGS. 32 and 38, electrode structure EST may be formed by replacing the sacrificial layers HL, which are exposed through the cutting hole SPS, with electrodes EL. In detail, the sacrificial layers HL, which are exposed through the cutting hole SPS, may be selectively removed. The electrodes EL may be formed in spaces, which are formed by removing the sacrificial layers HL. Thereafter, the cutting hole SPS may be filled with an insulating material.

Bit line contact plugs BPLG may be formed on the cell array region CAR to penetrate the third interlayer insulating layer ILD3 and to be respectively coupled to the conductive pads PAD. Cell contact plugs PLG may be formed on the connection region CNR to penetrate the second and third interlayer insulating layers ILD2 and ILD3 and to be respectively coupled to the electrodes EL of the staircase structure STS. Bit lines BL and upper interconnection lines UIL may be formed on the third interlayer insulating layer ILD3, and here, the bit lines BL may be electrically connected to the bit line contact plugs BPLG and the upper interconnection lines UIL may be electrically connected to the cell contact plugs PLG. The defect inspection process according to an embodiment may be performed on at least one of the bit line contact plugs BPLG, the cell contact plugs PLG, and the upper interconnection lines UIL. In the case where the degree of the defect is within the allowable range, a subsequent process may be performed.

In a semiconductor wafer inspection method according to an embodiment, by using a super resolution imaging process, it may be possible to obtain a difference image with a minimized noise. Accordingly, it may be possible to perform a defect detection process, without strong dependence on a setting value of a threshold value, and to improve reliability of the inspection process.

In a semiconductor wafer inspection method according to an embodiment, a fast Fourier transform may be used to extract a spatial frequency component from a defect signal. By analyzing the spatial frequency component for the defect signal, it may be possible to determine the kind of the defect. Because the inspection process is performed in a highly reliable manner, it may be possible to improve reliability in a process of fabricating a semiconductor device.

While aspects of embodiments have been particularly shown and described, it will be understood by one of ordinary skill in the art that variations in form and detail may be made therein without departing from the spirit and scope of the attached claims.

What is claimed is:

1. A semiconductor wafer inspection method, comprising:
providing a wafer comprising a target die and a reference die;
obtaining a candidate image of a first region of the target die;
obtaining a reference image of a second region of the reference die, the second region corresponding to the first region;
performing an imaging process on the candidate image to obtain a high resolution candidate image comprising sub-pixels for each pixel of the candidate image;
performing the imaging process on the reference image to obtain a high resolution reference image comprising sub-pixels for each pixel of the reference image;
shifting the high resolution reference image in units of the sub-pixels;
obtaining a difference image based on a difference between the high resolution candidate image and the high resolution reference image;
transforming the difference image to a spatial frequency domain to obtain a first spatial frequency component;
generating a defect signal based on the first spatial frequency component; and
detecting whether the defect signal exceeds a threshold value.

2. The semiconductor wafer inspection method of claim 1, wherein the generating the defect signal is performed using a fast Fourier transform.

3. The semiconductor wafer inspection method of claim 1, wherein the obtaining of the difference image comprises:
producing a plurality of shifted reference images by changing a shifted displacement of the high resolution reference image;
comparing each of the plurality of shifted reference images with the high resolution candidate image; and
selecting a difference image which has a smallest difference with the high resolution candidate image as an optimized difference image.

4. The semiconductor wafer inspection method of claim 1, wherein the candidate image and the reference image are grayscale optical images.

5. The semiconductor wafer inspection method of claim 1, wherein the imaging process is performed to produce a plurality of sub-pixels which are arranged in an n×m shape, from a single pixel, and
wherein each of n and m is an integer between 2 and 20.

6. The semiconductor wafer inspection method of claim 1, wherein the high resolution candidate image comprises a first pattern image and a defect image,
wherein the high resolution reference image comprises a second pattern image,
wherein the difference image comprises the defect image, and
wherein the defect signal is produced from the defect image.

7. A semiconductor wafer inspection method, comprising:
providing a wafer including a target die and a reference die;
obtaining a candidate image of a first region of the target die;
obtaining a reference image of a second region of the reference die, the second region corresponding to the first region;
obtaining a difference image based on a difference between the candidate image and the reference image;
transforming the difference image to a spatial frequency domain using a fast Fourier transform to produce a first spatial frequency component;
transforming the reference image to the spatial frequency domain using the fast Fourier transform to produce a second spatial frequency component;
obtaining a third spatial frequency component based on a difference between the first spatial frequency component and the second spatial frequency component; and
identifying a defect type based on the third spatial frequency component.

8. The semiconductor wafer inspection method of claim 7, wherein the candidate image and the reference image are grayscale optical images.

9. The semiconductor wafer inspection method of claim 7, wherein the first spatial frequency component comprises a spatial frequency component indicating noise and a spatial frequency component indicating a defect, and
wherein the second spatial frequency component comprises a spatial frequency component indicating noise and does not include a spatial frequency component indicating a defect.

10. The semiconductor wafer inspection method of claim 7, wherein the candidate image is a high resolution candidate image and the reference image is a high resolution reference image, and
wherein the semiconductor wafer inspection method further comprises:
performing an imaging process on a first image to obtain the high resolution candidate image comprising sub-pixels for each pixel of the first image;
performing the imaging process on a second image to obtain the high resolution reference image comprising sub-pixels for each pixel of the second image; and
shifting the high resolution reference image in units of a sub-pixel.

11. A method of fabricating a semiconductor device, comprising:
providing a wafer comprising a target die and a reference die;
performing a semiconductor fabrication process on the target die and the reference die to form a first pattern on the target die and a second pattern on the reference die;
obtaining a candidate image of the first pattern;
obtaining a reference image of the second pattern;
performing an imaging process on the candidate image to obtain a high resolution candidate image comprising sub-pixels for each pixel of the candidate image;
performing the imaging process on the reference image to obtain a high resolution reference image comprising sub-pixels for each pixel of the reference image;
shifting the high resolution reference image in units of the sub-pixels;
obtaining a difference image based on a difference between the high resolution candidate image and the high resolution reference image;
transforming the difference image to a spatial frequency domain to obtain a first spatial frequency component;
generating a defect signal based on the first spatial frequency component; and
detecting whether the defect signal exceeds a threshold value.

12. The semiconductor wafer inspection method of claim 11, wherein the generating the defect signal is performed using a fast Fourier transform.

13. The semiconductor wafer inspection method of claim 11, wherein the obtaining of the difference image comprises:

producing a plurality of shifted reference images by changing a shifted displacement of the high resolution reference image;
comparing each of the plurality of shifted reference images with the high resolution candidate image; and
selecting a difference image which has a smallest difference with the high resolution candidate image as an optimized difference image.

14. The semiconductor wafer inspection method of claim 11, wherein the candidate image and the reference image are grayscale optical images.

15. The semiconductor wafer inspection method of claim 11, wherein the imaging process is performed to produce a plurality of sub-pixels, which are arranged inn a n×m shape, from a single pixel, and
wherein each of n and m is an integer between 2 and 20.

16. The semiconductor wafer inspection method of claim 11, wherein the high resolution candidate image comprises a first pattern image and a defect image,
wherein the high resolution reference image comprises a second pattern image,
wherein the difference image comprises the defect image, and
wherein the defect signal is generated based on the defect image.

17. The semiconductor wafer inspection method of claim 11, further comprising:
transforming the difference image to a spatial frequency domain to produce the first spatial frequency component;
transforming the reference image to the spatial frequency domain to produce a second spatial frequency component;
obtaining a third spatial frequency component based on a difference between the first spatial frequency component and the second spatial frequency component; and
identifying a defect type based on the third spatial frequency component.

18. The semiconductor wafer inspection method of claim 11, wherein the performing the semiconductor fabrication process comprises patterning an upper portion of the wafer using a photolithography process to form a first active pattern on the target die and a second active pattern on the reference die.

19. The semiconductor wafer inspection method of claim 11, wherein the performing the semiconductor fabrication process comprises:
forming a metal layer on contacts; and
patterning the metal layer using a photolithography process to form a first landing pad on the target die and a second landing pad on the reference die.

20. The semiconductor wafer inspection method of claim 11, wherein the performing the semiconductor fabrication process comprises:
alternately stacking insulating layers and sacrificial layers to form a stack; and
patterning the stack using a photolithography process to form a first channel hole on the target die and a second channel hole on the reference die.

* * * * *